(12) United States Patent
Nakatsuka et al.

(10) Patent No.: US 10,049,711 B2
(45) Date of Patent: Aug. 14, 2018

(54) MAGNETORESISTIVE MEMORY DEVICE

(71) Applicant: TOSHIBA MEMORY CORPORATION, Minato-ku, Tokyo (JP)

(72) Inventors: Keisuke Nakatsuka, Seoul (KR); Tadashi Miyakawa, Yokohama Kanagawa (JP); Katsuhiko Hoya, Yokohama Kanagawa (JP); Takeshi Hamamoto, Yokkaichi Mie (JP); Hiroyuki Takenaka, Kamakura Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/257,085

(22) Filed: Sep. 6, 2016

(65) Prior Publication Data

US 2016/0379701 A1 Dec. 29, 2016

Related U.S. Application Data

(63) Continuation of application No. PCT/JP2014/077026, filed on Oct. 2, 2014.

(60) Provisional application No. 61/949,054, filed on Mar. 6, 2014.

(51) Int. Cl.
*G11C 5/02* (2006.01)
*G11C 11/16* (2006.01)
*H01L 43/08* (2006.01)
*H01L 27/22* (2006.01)

(Continued)

(52) U.S. Cl.
CPC .......... *G11C 11/1695* (2013.01); *G11C 5/025* (2013.01); *G11C 11/161* (2013.01); *G11C 11/1653* (2013.01); *G11C 11/1659* (2013.01); *G11C 11/1673* (2013.01); *G11C 11/1675* (2013.01); *H01L 27/228* (2013.01); *H01L 43/02* (2013.01); *H01L 43/08* (2013.01); *G11C 5/04* (2013.01); *G11C 2213/79* (2013.01); *G11C 2213/82* (2013.01)

(58) Field of Classification Search
None
See application file for complete search history.

(56) References Cited

U.S. PATENT DOCUMENTS

| 2005/0237791 A1 | 10/2005 | Motoyoshi | |
| 2009/0168480 A1 * | 7/2009 | Scheuerlein | B82Y 10/00 365/51 |

(Continued)

OTHER PUBLICATIONS

International Search Report (ISR) and Written Opinion dated Dec. 16, 2014 issued in International Application No. PCT/JP2014/077026.

(Continued)

*Primary Examiner* — Uyen B Tran
(74) *Attorney, Agent, or Firm* — Holtz, Holtz & Volek PC

(57) ABSTRACT

According to one embodiment, a magnetoresistive memory device includes a substrate having a first surface which includes a first direction; and memory elements each having a switchable resistance. A first column of memory elements lined up along the first direction is different from an adjacent second column of memory elements lined up along the first direction at positions of memory elements in the first direction.

28 Claims, 67 Drawing Sheets

(51) Int. Cl.
*H01L 43/02* (2006.01)
*G11C 5/04* (2006.01)

(56) References Cited

U.S. PATENT DOCUMENTS

2009/0321789 A1   12/2009  Wang et al.
2013/0210211 A1*  8/2013  Vereen .................. H01L 45/08
                                                           438/382

OTHER PUBLICATIONS

Taiwanese Office Action dated May 20, 2016 issued in counterpart Taiwanese Application No. 104101835.
International Preliminary Report on Patentability (IPRP) including Written Opinion (in English) dated Sep. 15, 2016, issued in counterpart International Application No. PCT/JP2014/077026.

* cited by examiner

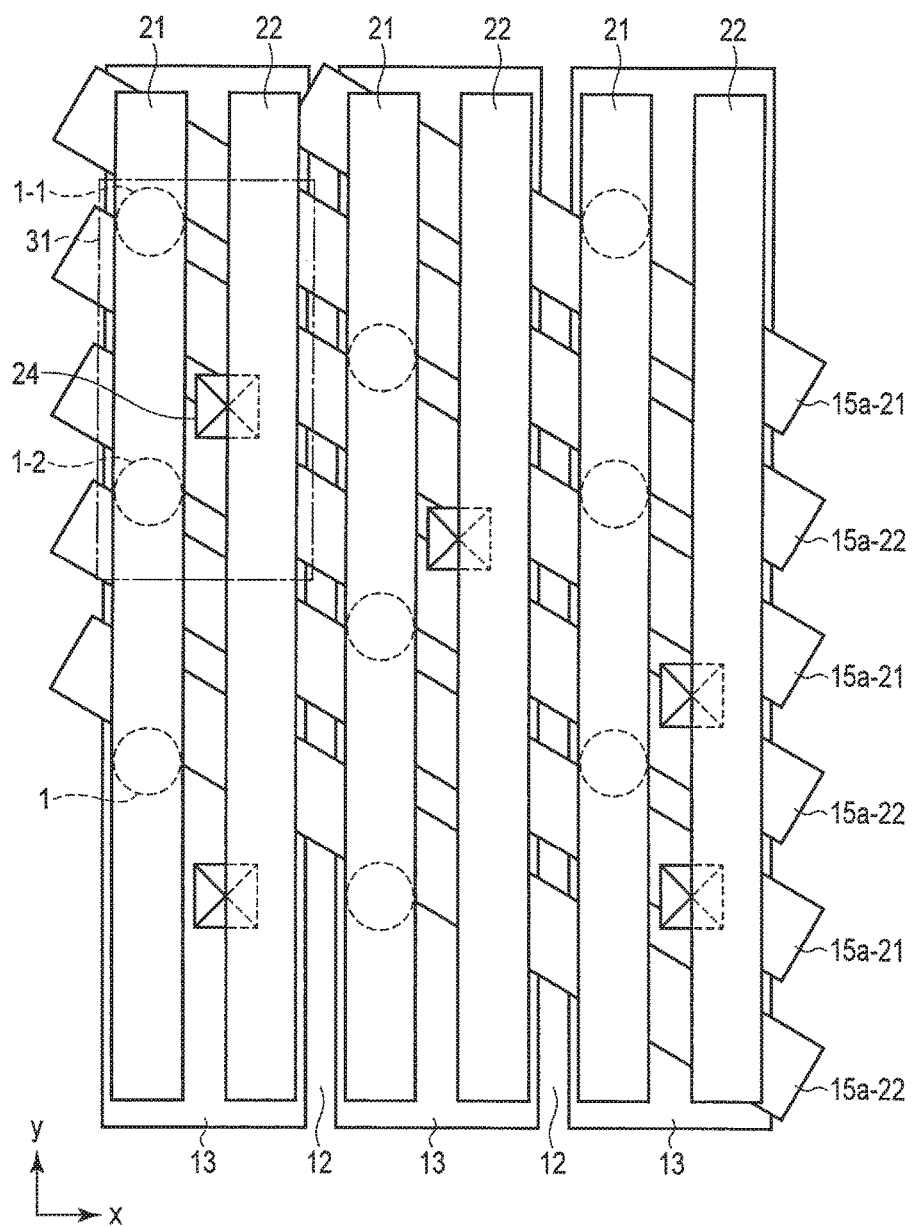
F I G. 11

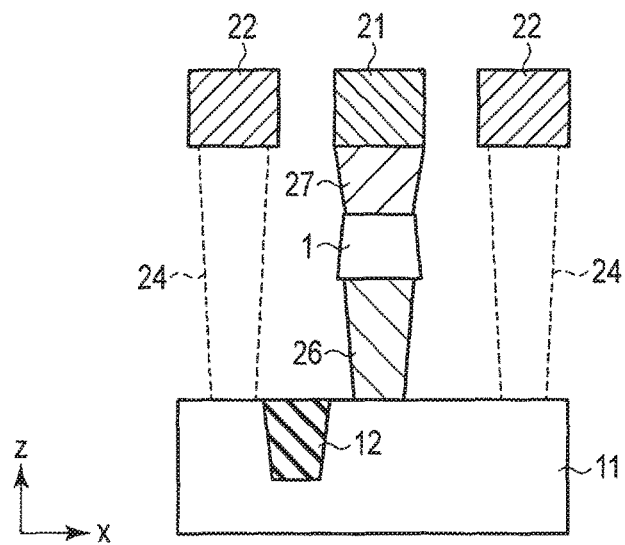
F I G. 13
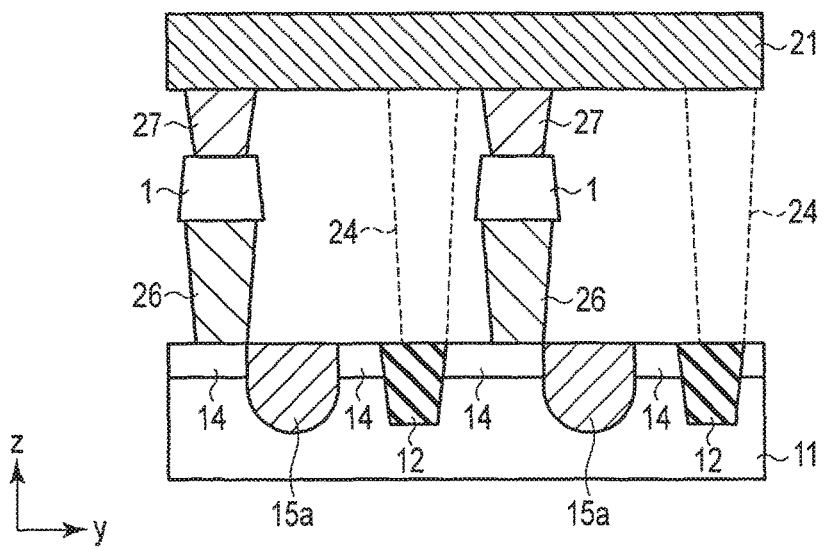
F I G. 14

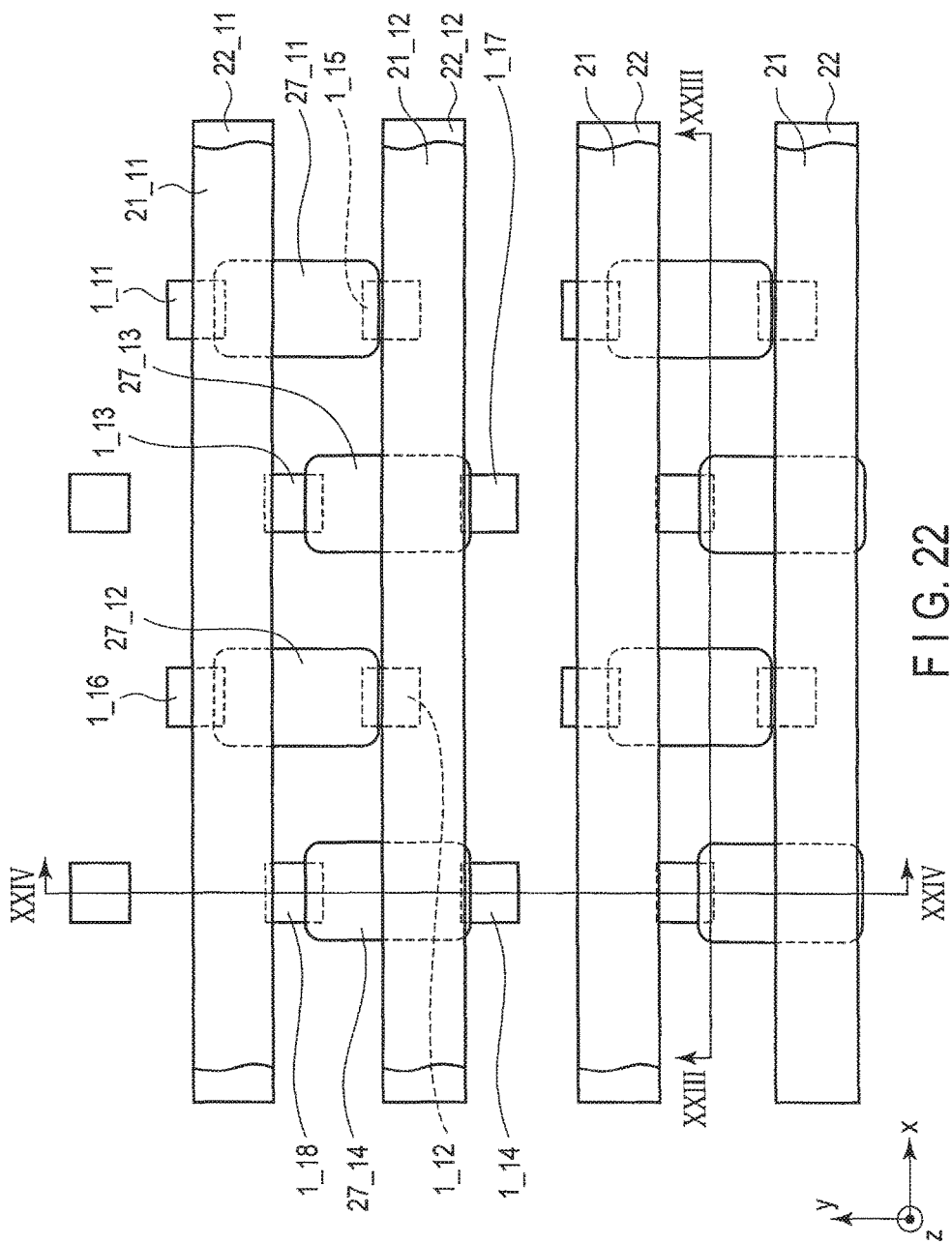
F I G. 22

F.I.G. 24

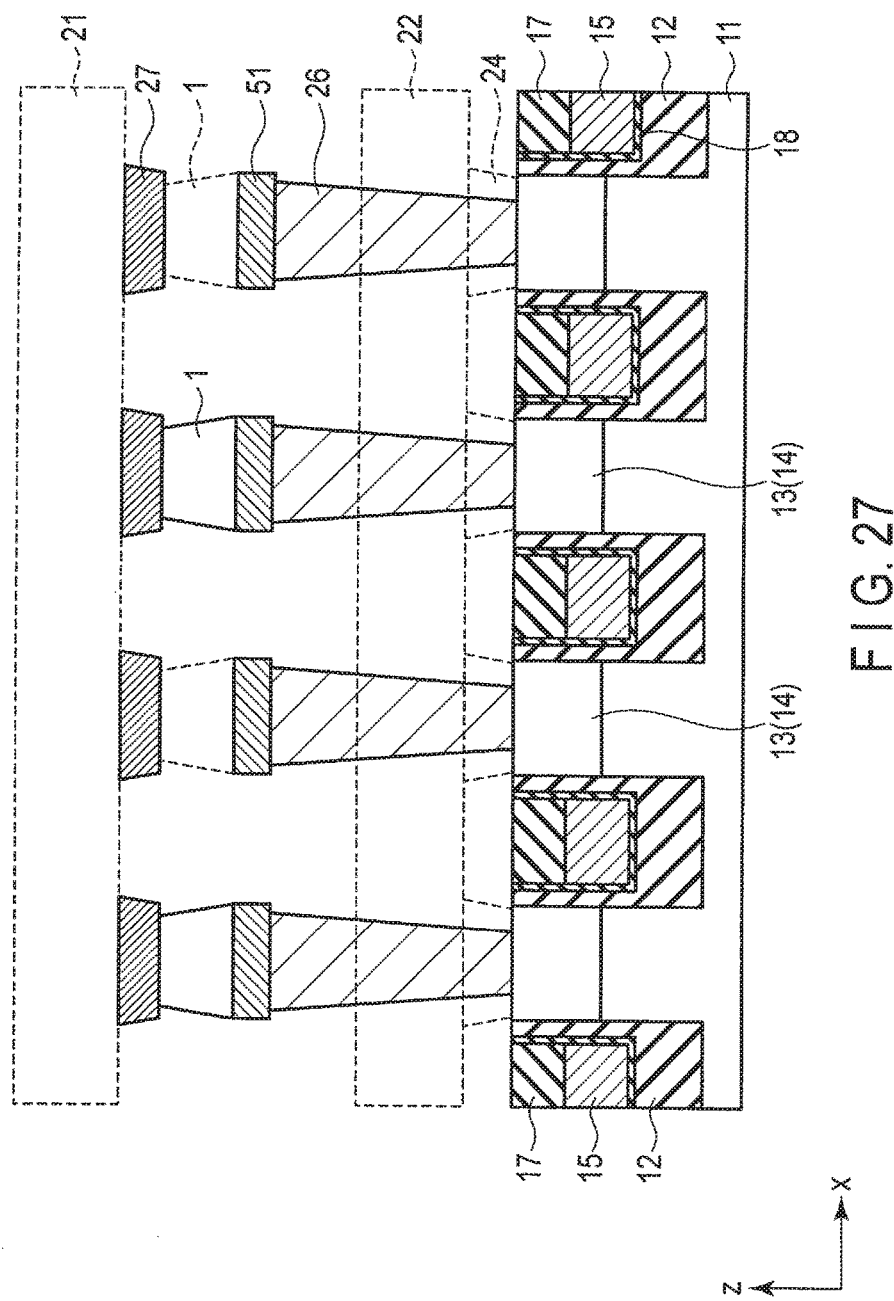
F I G. 27

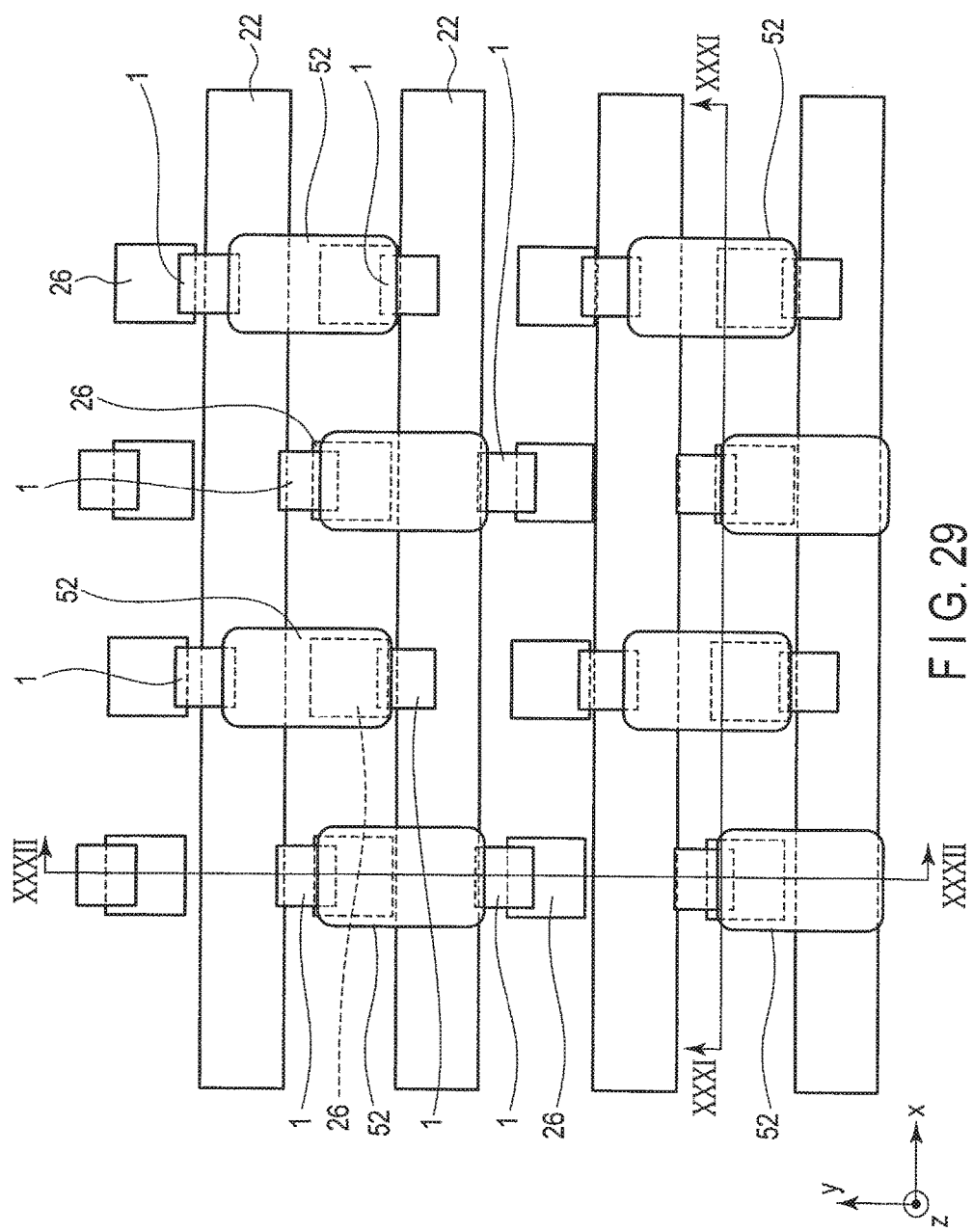
F I G. 29

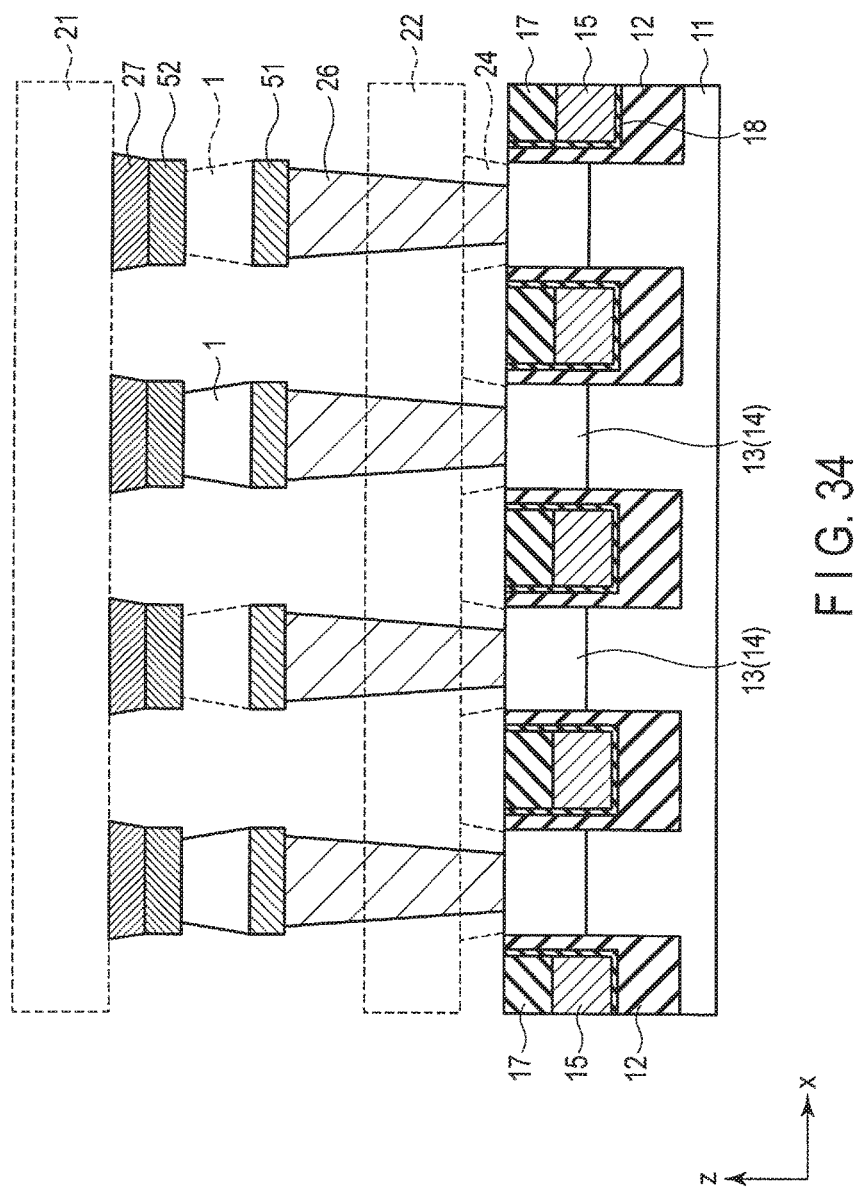
F I G. 34

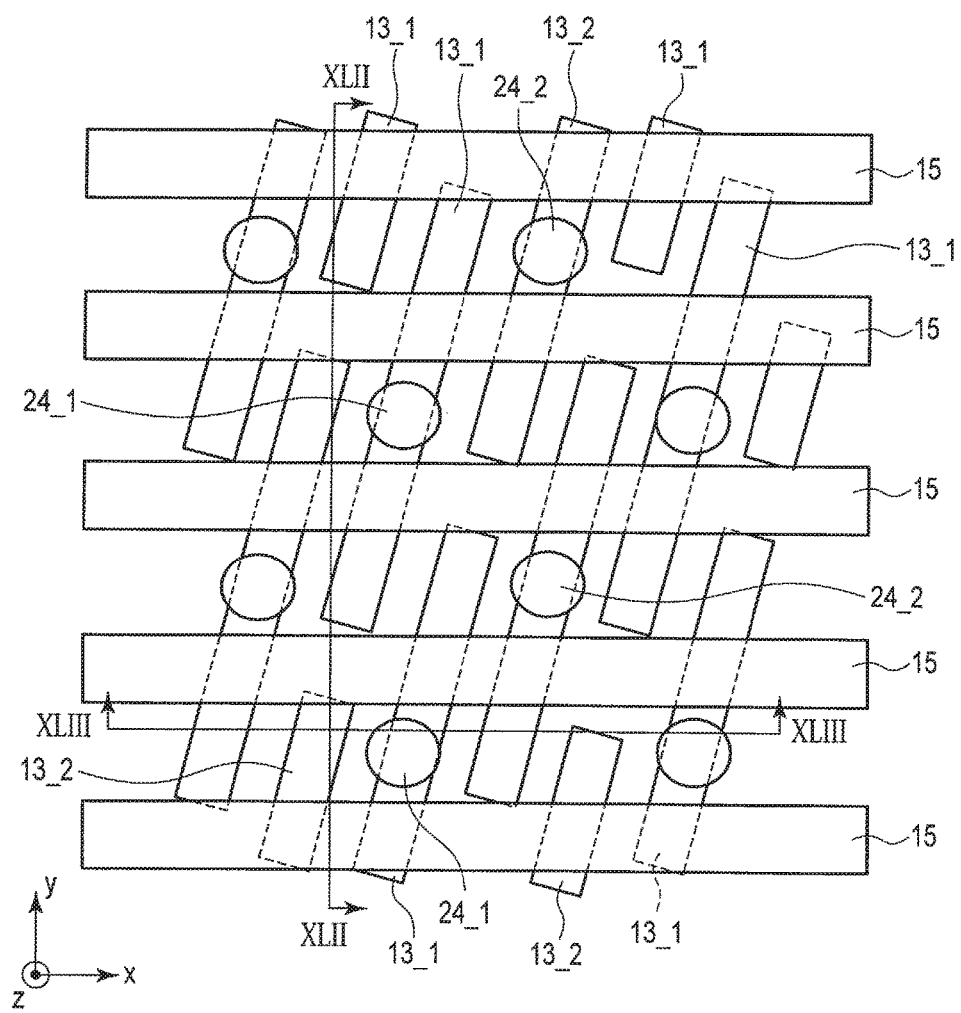
F I G. 39

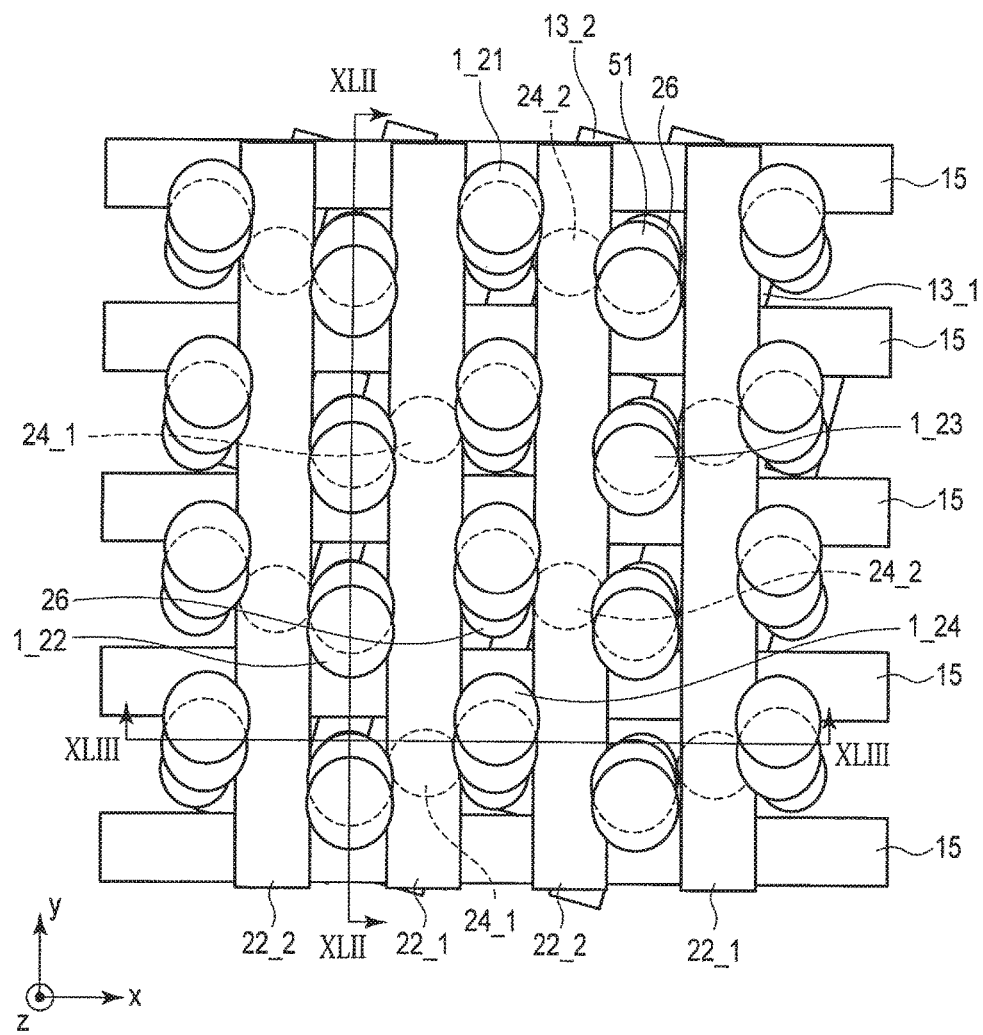
F I G. 40

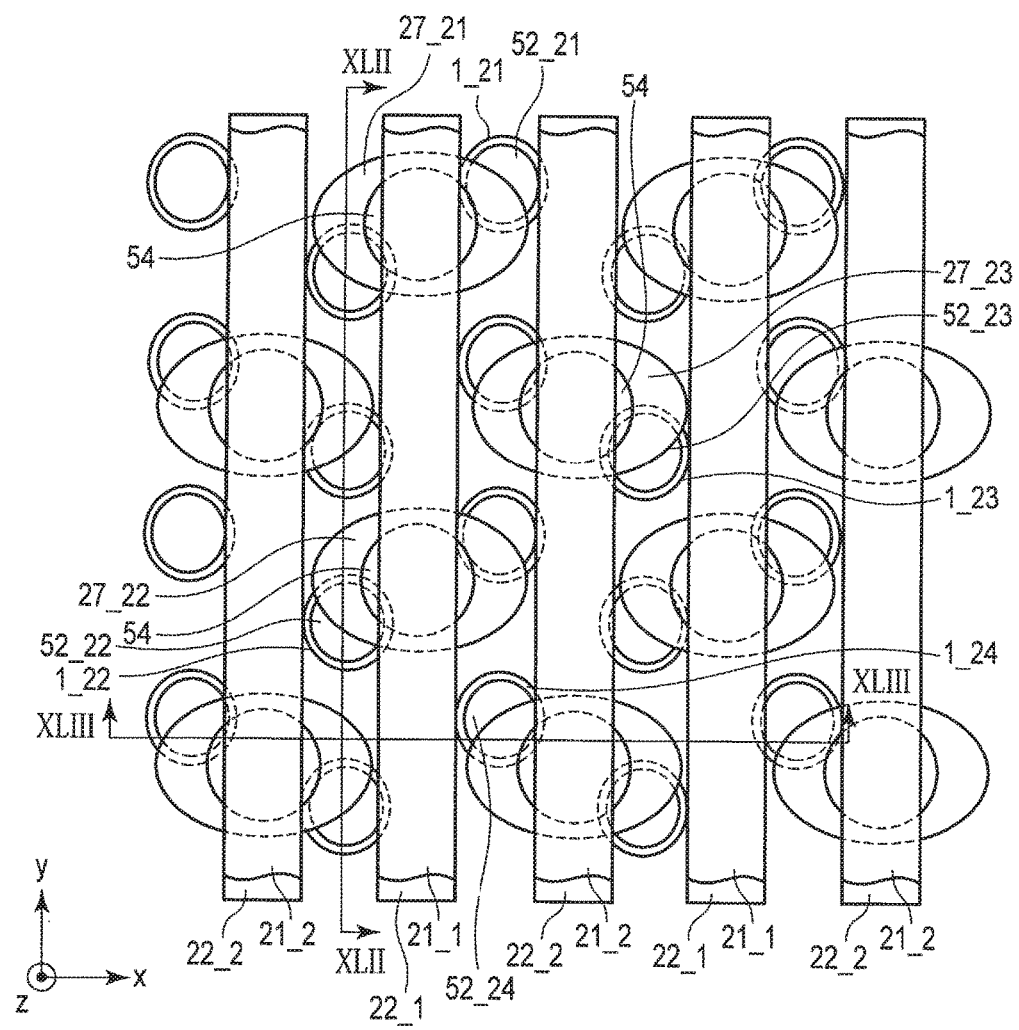
F I G. 41

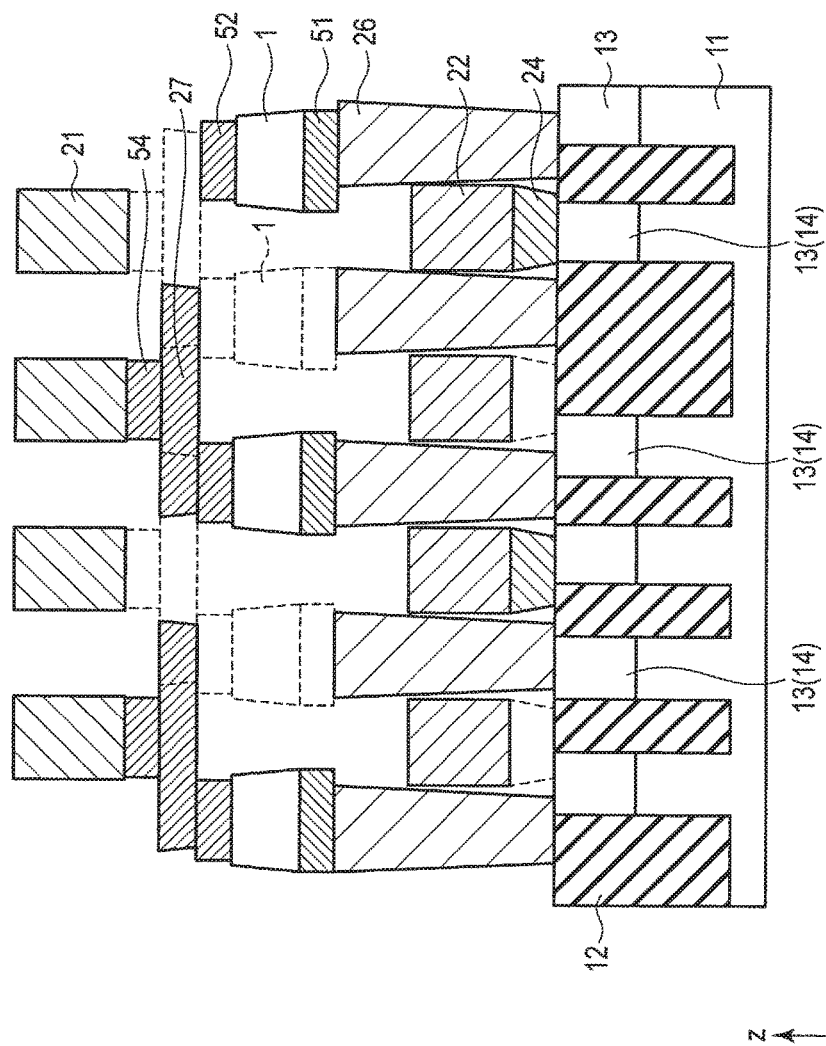
F I G. 43

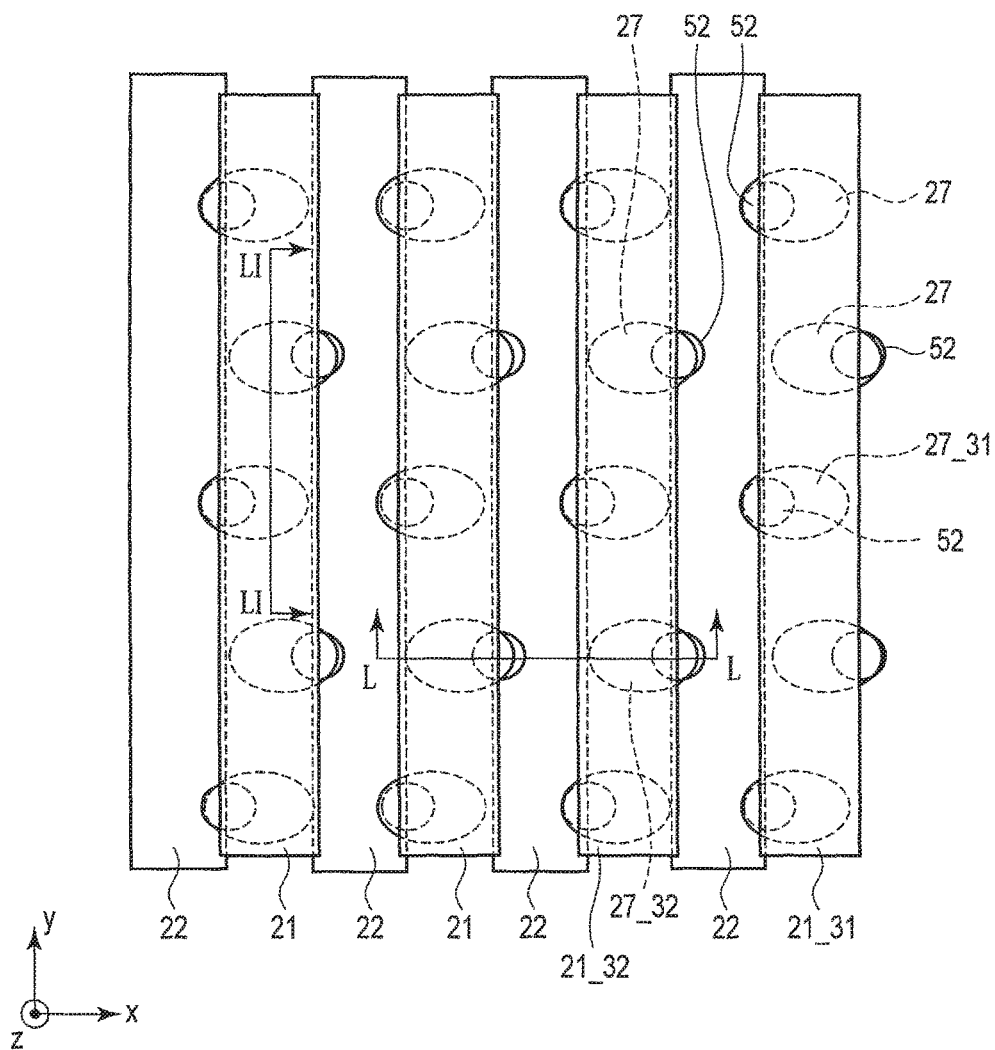
F I G. 49

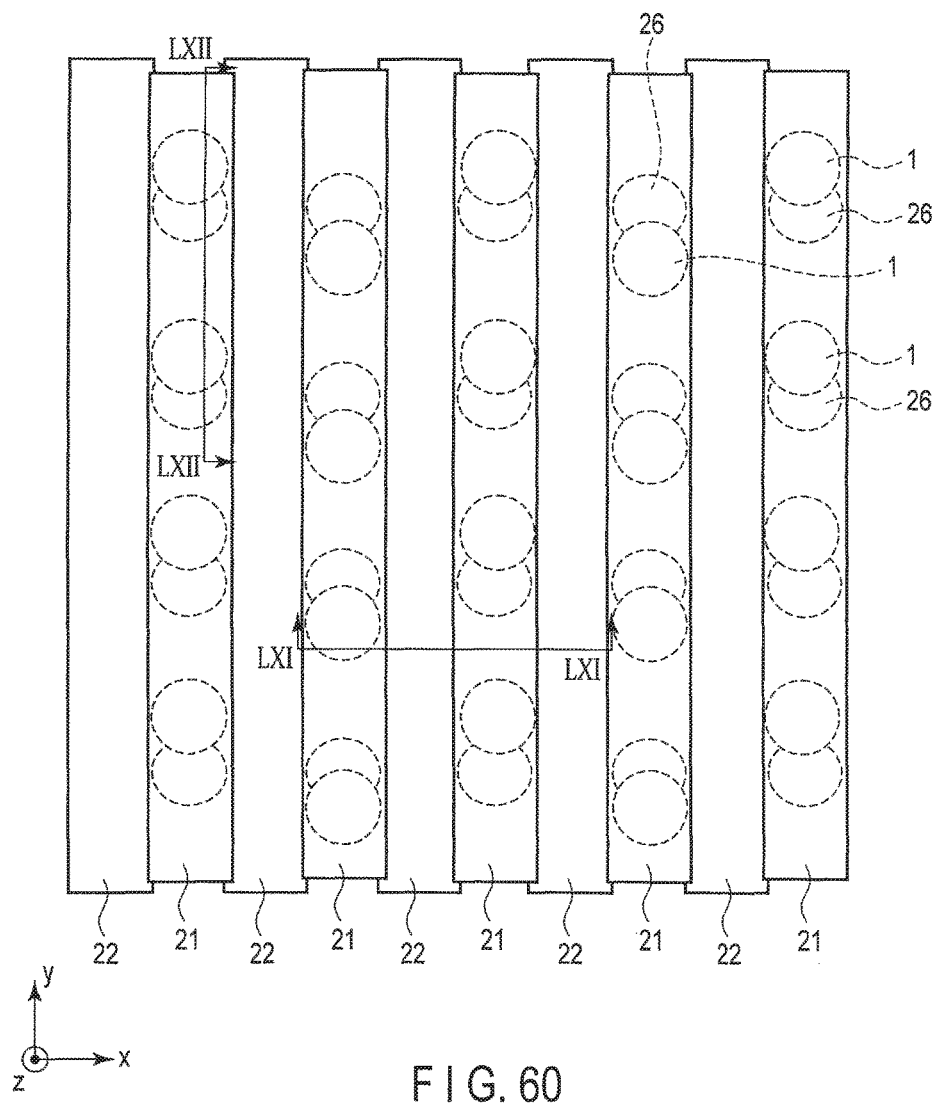
F I G. 60

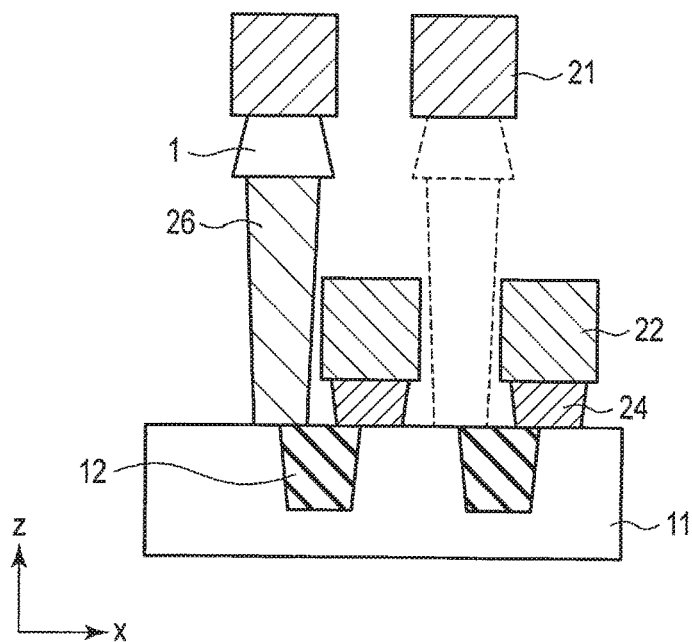
F I G. 61
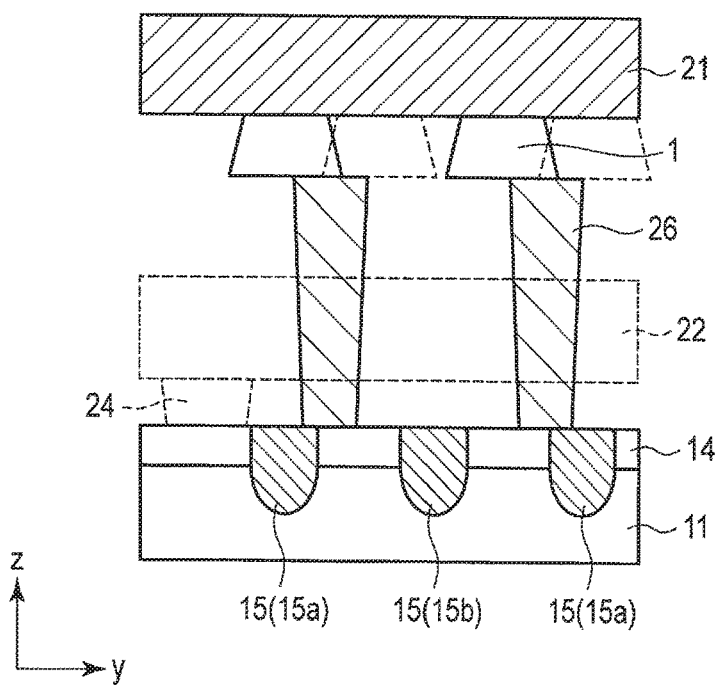
F I G. 62

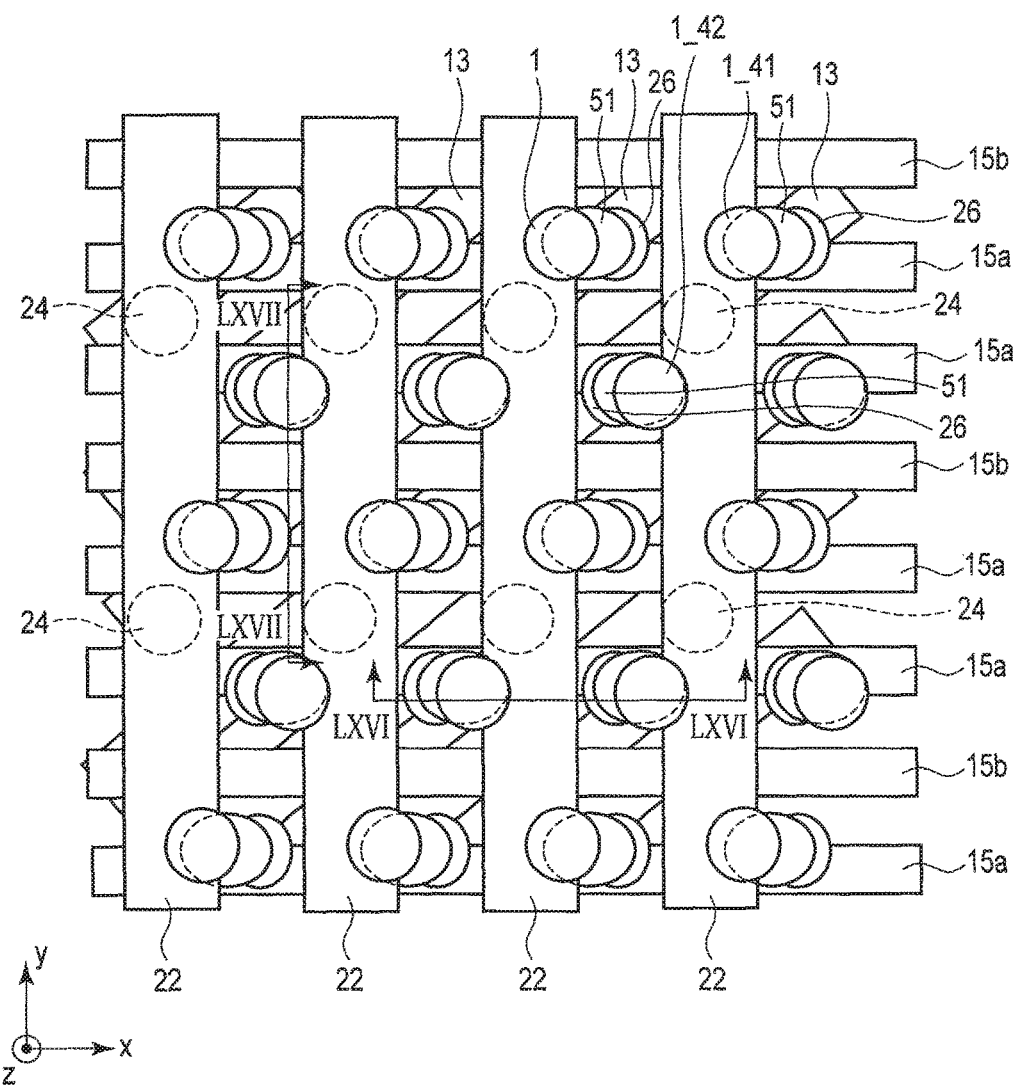
F I G. 64

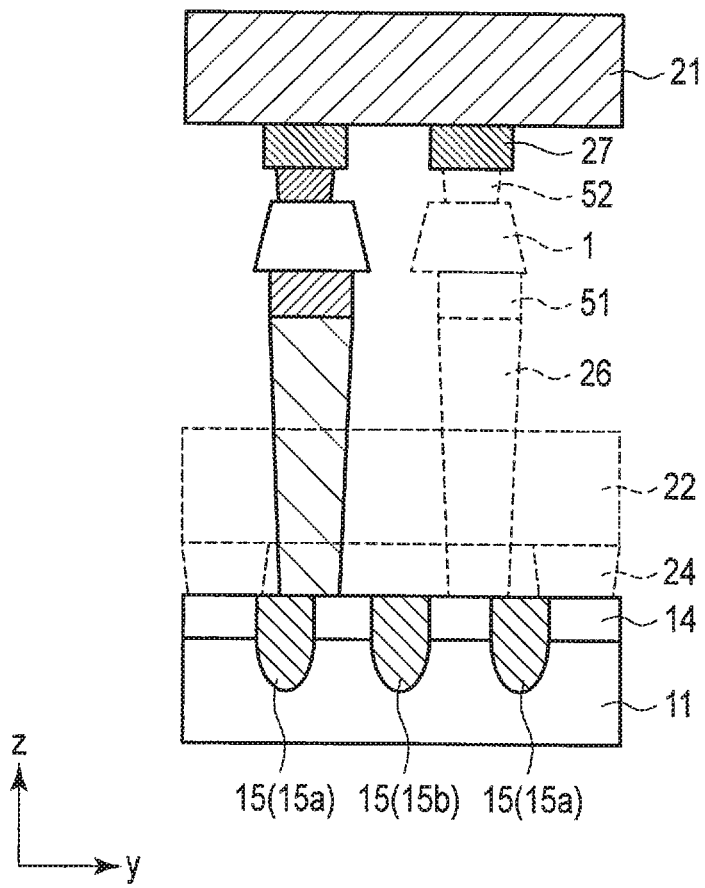
F I G. 67

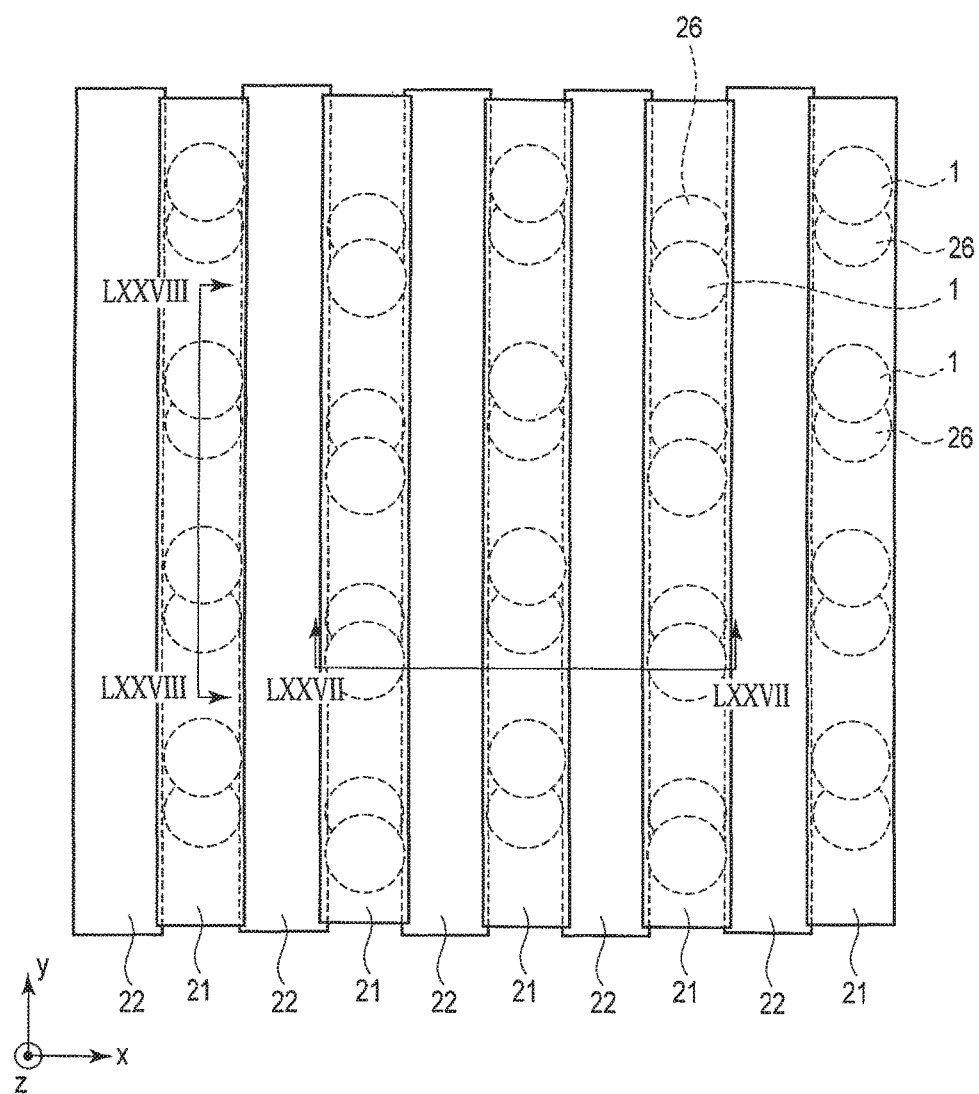
F I G. 76

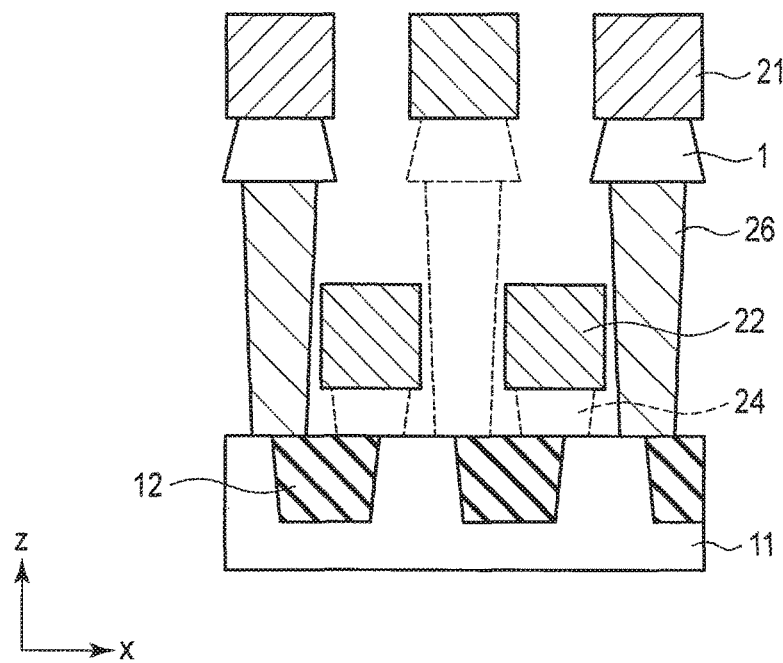
F I G. 77
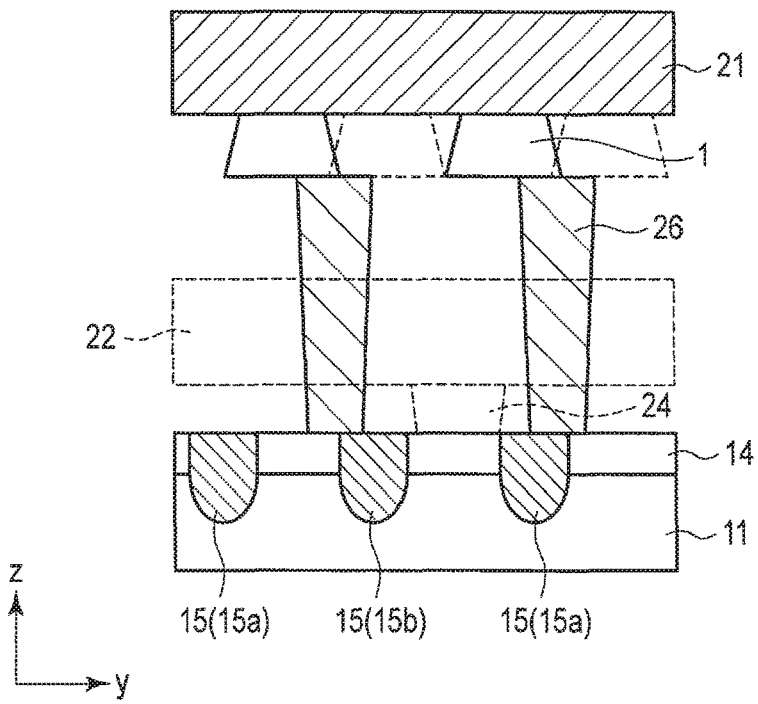
F I G. 78

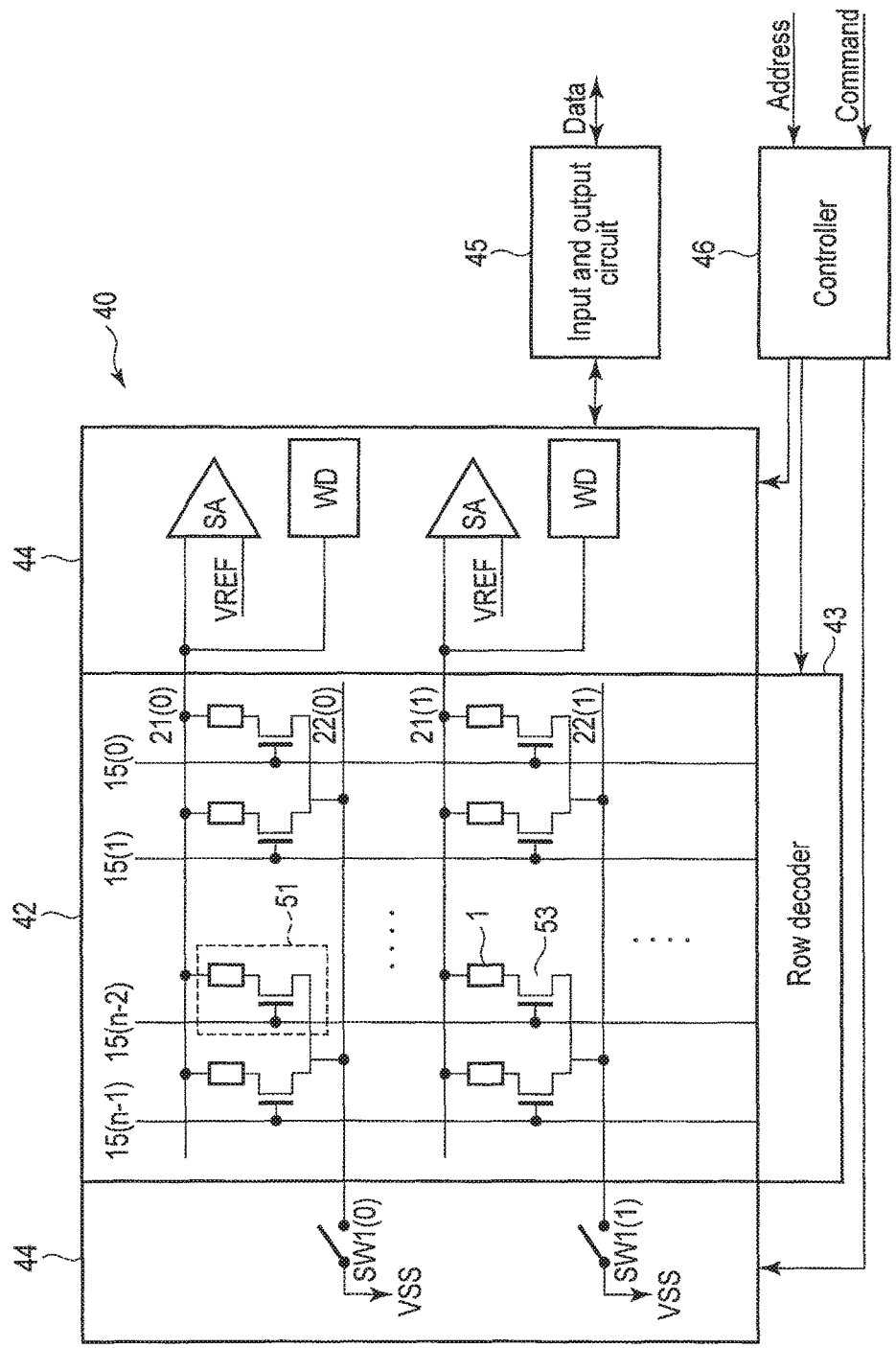
F I G. 79

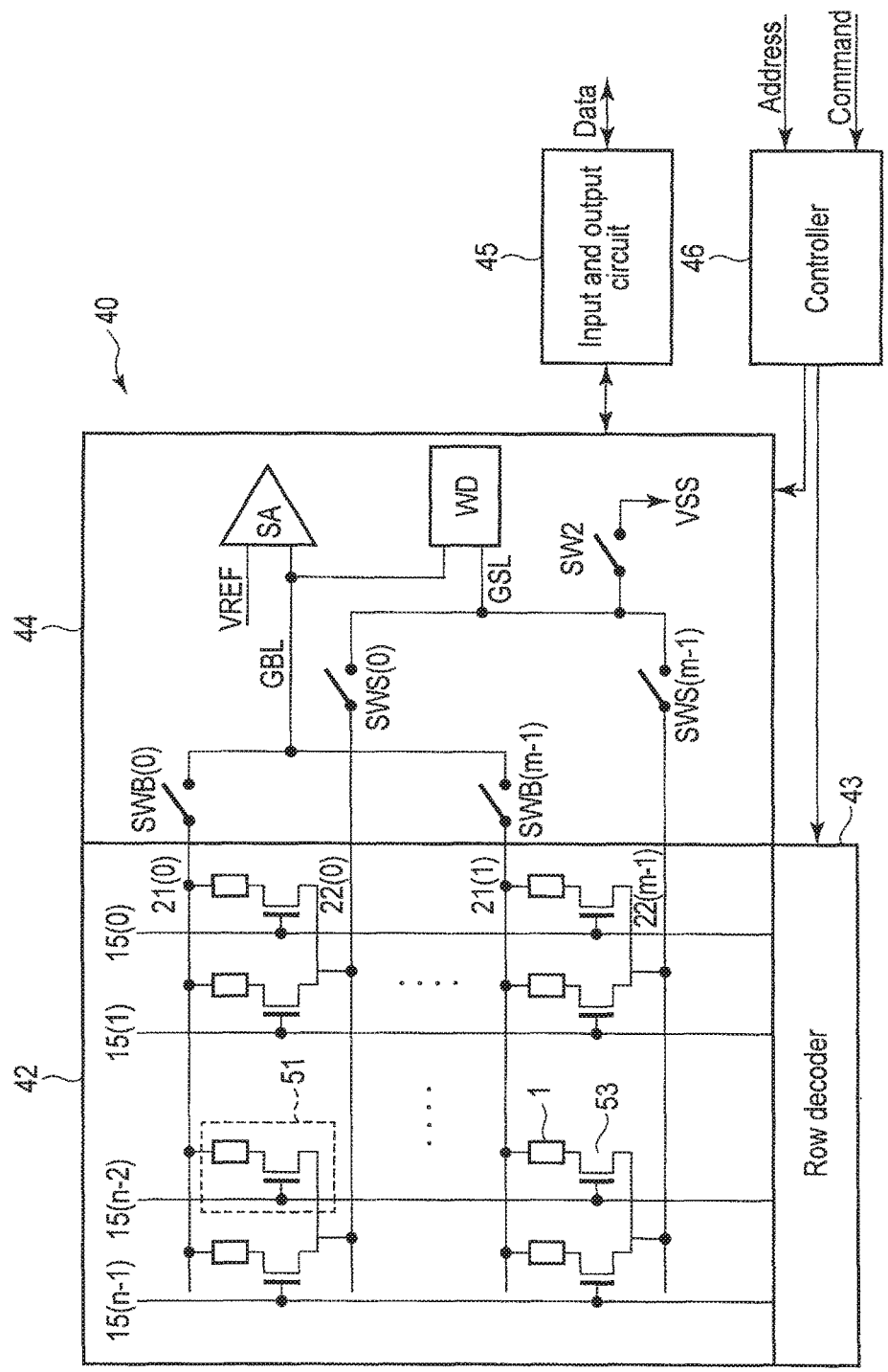
F I G. 80

MAGNETORESISTIVE MEMORY DEVICE

CROSS-REFERENCE TO RELATED APPLICATIONS

This application is a Continuation Application of PCT Application No. PCT/JP2014/077026, filed Oct. 2, 2014 and based upon and claiming the benefit of U.S. Provisional Application No. 61/949,054, filed Mar. 6, 2014, the entire contents of which are incorporated herein by reference.

FIELD

Embodiments described herein relate generally to a magnetoresistive memory device.

BACKGROUND

In recent years, various new memories have been proposed as alternative memories for a flash memory or a dynamic random access memory (DRAM). Such memories include a magnetoresistive RAM (MRAM). The MRAM, among new memories, can operate at high speed and can be shrunk relatively easily.

BRIEF DESCRIPTION OF THE DRAWINGS

FIG. 11 illustrates a view of a memory device of a fourth example of the first embodiment seen from above;

FIG. 13 illustrates the view along the XIII-XIII line of FIG. 12;

FIG. 14 illustrates the view along the XIV-XIV line of FIG. 12;

FIGS. 20 to 22 illustrate views of part of a memory device of a first example of a third embodiment seen from above;

FIGS. 27 and 28 illustrate the views along the XXVII-XXVII line and the XXVIII-XXVIII line of FIG. 25, respectively;

FIGS. 29 and 30 illustrate views of part of a memory device of a third example of the third embodiment seen from above;

FIGS. 34 and 35 illustrate the views along the XXXIV-XXXIV line and the XXXV-XXXV line of FIG. 33;

FIGS. 39 to 41 illustrate views of part of a memory device of a first example of a fourth embodiment seen from above;

FIGS. 42 and 43 illustrate the views along the XLII-XLII line and the XLIII-XLIII line of FIGS. 39 to 41, respectively;

FIGS. 47 to 49 illustrate views of part of a memory device of a first example of a fifth embodiment seen from above;

FIG. 60 illustrates a view of part of a memory device of a fourth example of the fifth embodiment seen from above;

FIGS. 61 and 62 illustrate the views along the LXI-LXI line and the LXII-LXII line of FIG. 60, respectively;

FIGS. 63 to 65 illustrate views of part of a memory device of a first example of a sixth embodiment seen from above;

FIGS. 66 and 67 illustrate the views along the LXVI-LXVI line and the LXVII-LXVII line of FIGS. 63 to 65, respectively;

FIG. 76 illustrates a view of part of a memory device of a fourth example of the sixth embodiment seen from above;

FIGS. 77 and 78 illustrate the views along the LXXVII-LXXVII line and the LXXVIII-LXXVIII line of FIG. 76;

FIG. 79 is a circuit diagram of a part of a memory device of the seventh embodiment; and FIG. 80 is a circuit diagram of a part of a second example of a memory device of the second example of the seventh embodiment.

DETAILED DESCRIPTION

According to one embodiment, a magnetoresistive memory device includes a substrate having a first surface which includes a first direction; and memory elements each having a switchable resistance. A first column of memory elements lined up along the first direction is different from an adjacent second column of memory elements lined up along the first direction at positions of memory elements in the first direction.

A memory element of a memory cell of the MRAM includes two terminals and a magnetic material therebetween. A data write to the memory cell is executed by passing a current between the two terminals of a write-target memory element. One consideration in developing and designing the MRAM is prevention of erroneous writes to memory elements other than the write-target memory element. In other words, a current flowing through memory elements causes a magnetic field, which may cause erroneous writes to non-write-target memory elements with a particular probability. The probability of erroneous writes depends on the coercivity (tolerance against an external magnetic field) of the memory elements and magnitude of the magnetic field. The magnitude of the magnetic field is proportional to the reciprocal of the distance between the write-target memory element and an influenced non-write-target memory element.

On the other hand, for high integration of the MRAM, the memory elements need to be densely arranged. One simple method for this is to reduce distances between the memory elements. However, the shorter the distances between the memory elements, the easier the erroneous writes occur, as described above. On the other hand, in order to form a high capacity MRAM, the memory elements need to be densely arranged. Thus, it is necessary to densely arrange the memory elements while securing the distances between adjacent memory elements as large as possible.

Embodiments will now be described with reference to figures. Components with substantially the same functionalities and configurations will be referred to with the same reference number and duplicate descriptions will be made only when required. The figures are schematic. Each embodiment illustrates the device and method for materializing the technical idea of this embodiment, and the technical idea of an embodiment does not specify the quality of the material, form, structure, arrangement of components, etc. to the following.

First Embodiment

Figure 1:
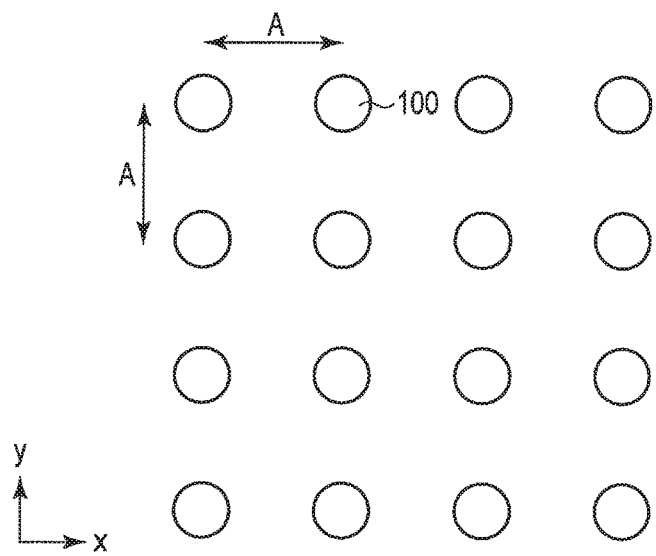
FIG. 1 illustrates an example of an arrangement of memory elements of memory cells of a memory device.

FIG. 1 illustrates an example of an arrangement of memory elements 100, and illustrates a view of the memory elements seen from above. The memory elements 100 are arranged on the plane from the x-axis and y-axis which intersect perpendicularly, and line up along the x-axis and y-axis at a regular interval A. In other words, the shortest interval of the memory elements is A. One of the reasons for such an arrangement of the memory elements 100 in a matrix form is easiness of processing of associated interconnects. Such an arrangement of the memory elements 100 results in an area of the minimum pattern which is arranged repeatedly of $A^2$.

Figure 2:
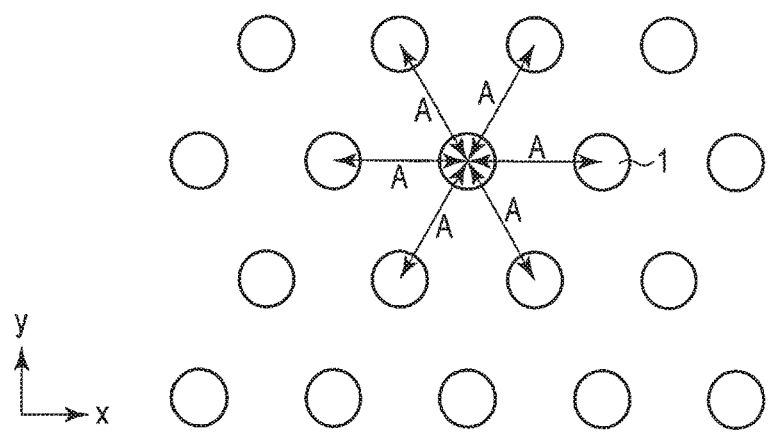
FIG. 2 illustrates a first example of an arrangement of memory elements of memory cells of a memory device of the first embodiment.

FIG. 2 illustrates a first example of an arrangement of memory elements of memory cells of a memory device according to the first embodiment, and illustrates a view of the memory elements 1 seen from above. A memory element 1 is an element which includes a magnetic tunnel junction as will be described. The arrangement of the memory elements 1 includes multiple columns (i.e., sets of memory elements along the y-axis on the same x-axis coordinate) as illustrated in FIG. 2. In each column of memory elements (memory element column), memory elements 1 are lined up at a regular interval A. In contrast, memory elements 1 from adjacent memory-element columns are not lined up along the x-axis. Instead, the memory elements 1 are located at the vertexes and the center of a right hexagon over three columns. Then, such right hexagons are filled in the plane made of the x-axis and y-axis. In other words, the memory elements 1 are located at the vertexes and the centers of a honeycomb structure which extends along the plane made of the x-axis and y-axis.

The memory elements 1 are located at the vertexes and center of a hexagon, and therefore all the memory elements 1 adjacent in the hexagon have an equal interval. Similarly, such hexagons are filled along the plane made of the x-axis and y-axis, and therefore each memory element 1 has an equal interval with all the adjacent memory elements 1. However, when components are formed with a semiconductor manufacturing process, i.e., when formation of a mask with openings therein on a film and etching with the openings to process the film is repeated, unintentional mask misalignment may occur, as known to those skilled in the art. This may result in components shifted from the intended positions. Therefore, a position of a particular component specified in this specification and claims also includes positions shifted from the intended position due to variation in the manufacturing process. For example, the description of the memory elements 1 "are located at the vertexes and center of a right hexagon" is not a strict requirement, and also includes memory elements 1 shifted unavoidably.

Memory elements 1 in the even-numbered columns are arranged in a matrix form along the x-axis and y-axis, and memory elements 1 in the odd-numbered columns are arranged in a matrix form different from the matrix of the memory elements 1 of the even-numbered columns and spread along the x-axis and y-axis. Each memory element 1 of each memory-element-column is not on a line connecting memory elements of the same row (i.e., lined up the x-axis) in the both adjacent memory-element-columns. Instead, the memory elements 1 are arranged so that each memory element 1 in a particular memory-element-column is located on an extension along the x-axis from a position between two adjacent memory elements 1 in an adjacent memory-element-column. In addition, each memory element 1 is a distance A away from the nearest four memory elements in both adjacent memory-element-columns. Therefore, each memory element 1 and two nearest memory elements 1 in both adjacent memory-element-columns form an equilateral triangle, and hence different memory elements 1 from different memory-element-columns are lined up along a straight line inclined from the x-axis by 60 degrees.

Because of the above-described arrangement of the memory elements 1, the x-axis is parallel to a straight line connecting a pair of memory elements at the right hexagon vertexes opposed via the center (i.e., which are on a diagonal). Moreover, the y-axis is parallel to a straight line connecting two memory elements which are neither located at right hexagon vertexes opposed via the center (i.e., which are on a diagonal) nor adjoin along an edge of the right hexagon.

Figure 3:
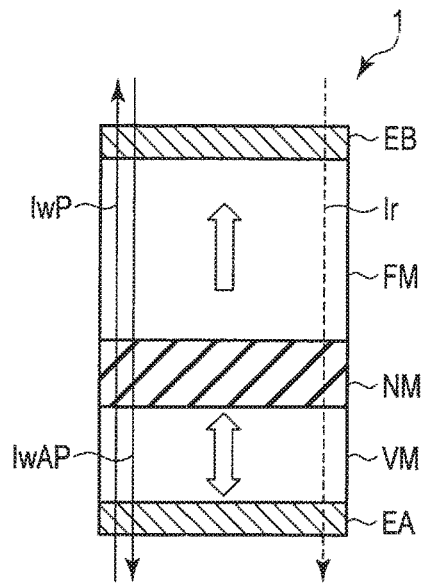
FIG. 3 illustrates a structure of an MTJ element of the first embodiment.

The memory elements 1 store data in a non-volatile manner according to the state of magnetization, and have a structure as illustrated in FIG. 3, for example. A memory element 1 includes the two magnetic layers FM and VM and nonmagnetic layers NM therebetween. The magnetic layer FM has a fixed magnetization orientation, and the magnetic layer VM has a variable magnetization orientation. The magnetic layers FM and VM have the magnetization easy axis (illustrated by the arrows) along the direction which intersects the interfaces of the layers FM, NM and VM. The magnetic layers FM and VM may have the magnetization easy axis along the interfaces of the layers FM, NM and VM. The layers FM, NM and VM are provided between electrodes EA and EB. The element MTJ exhibits the minimum and maximum resistances when orientations of magnetization of the magnetic layers FM and VM are parallel and anti-parallel, respectively. The states which exhibit two different resistances are assigned to data of two values, respectively. For example, the parallel and anti-parallel of magnetization orientations of the magnetic layers FM and VM are associated with the state where "0" and "1" bits are stored, respectively. When a current IwP flows from the magnetic layer VM toward the magnetic layer FM, the magnetization orientations of the magnetic layers FM and VM become parallel. In contrast, when a current IwAP flows from the magnetic layer FM toward the magnetic layer VM, the magnetization orientations of the magnetic layers FM and VM become anti-parallel. For a data read, the current Ir is passed, for example, from the electrode EB toward the electrode EA, and the state of the resistance of the memory element 1 is determined.

Figure 4:
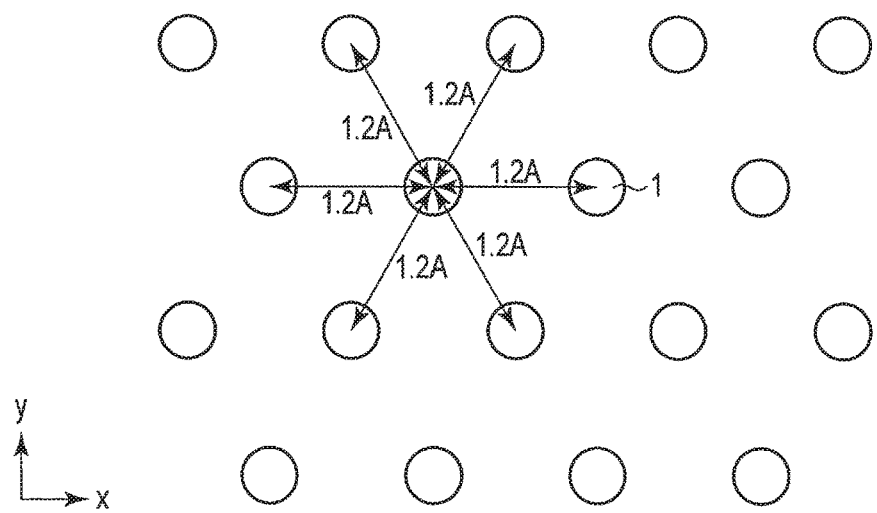
FIG. 4 illustrates a second example of an arrangement of memory elements of the memory cells of the memory device of the first embodiment.

FIG. 2 relates to an example where adjacent memory elements 1 have the same distance A as distance A between the grids of FIG. 1. According to this example, an area for arranging a particular number of memory elements 1 is decreased to 0.87 times the area for arranging the same number of memory elements 1 in the FIG. 1 example. Therefore, with the FIG. 2 arrangement used, in the same area as the area for arrangement of FIG. 1, the same number of memory elements 1 can be arranged at a larger interval. FIG. 4 illustrates such an example, illustrates a second example of an arrangement of the memory elements of the memory cells of the memory device according to the first embodiment, and illustrates a view of the memory elements 1 seen from above. In the FIG. 4 example, the interval of the memory elements 1 is 1.2 A. According to the FIG. 4 example, the influence of the magnetic field among the memory elements 1 is smaller than that in the FIG. 2 example.

Examples of a structure with the memory cell arrangement of FIGS. 2 and 4 will now be described with reference to FIGS. 5 to 16. FIGS. 5 to 16 illustrate part of the cell array of the memory device of the first embodiment.

Figure 5:
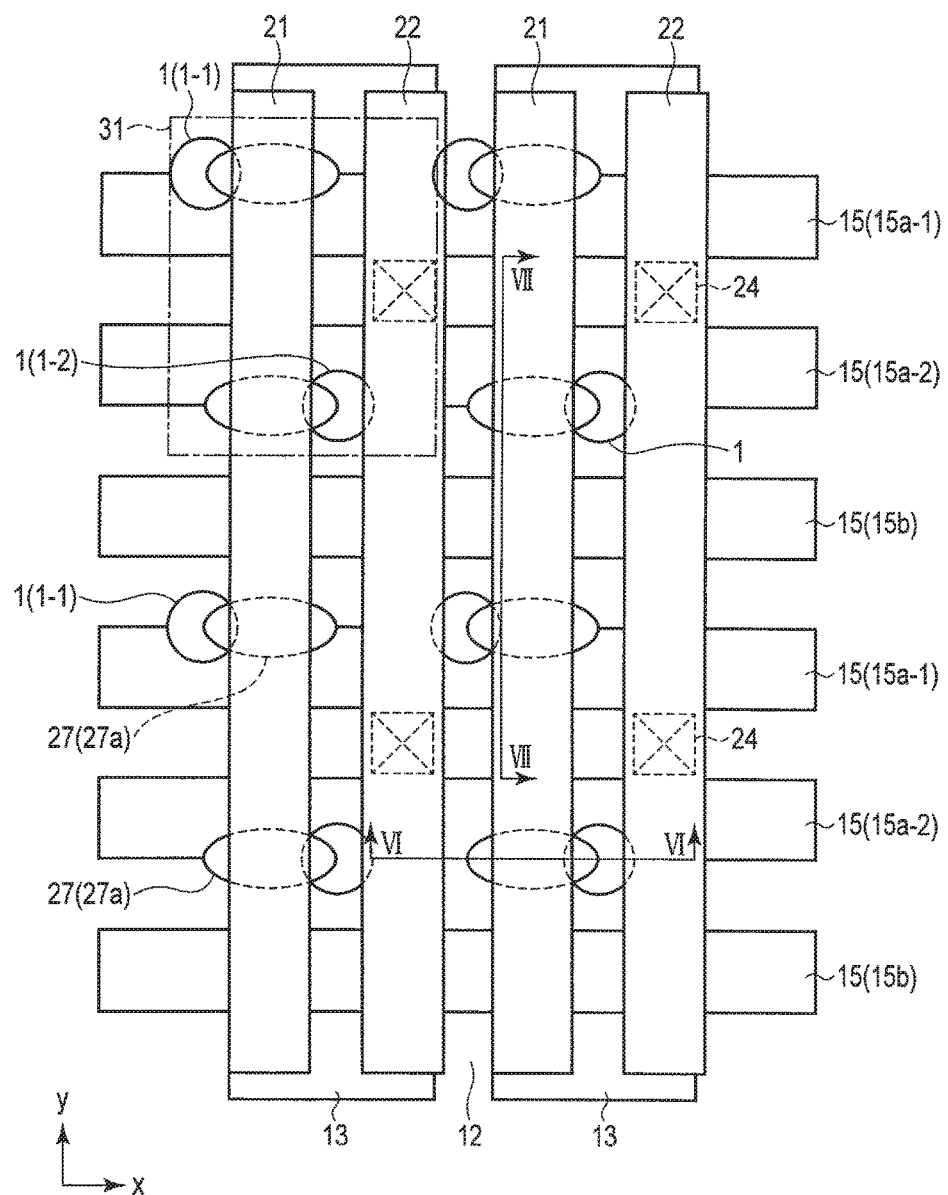
FIG. 5 illustrates a view of a memory device of the first example of the first embodiment seen from above.
Figure 6:
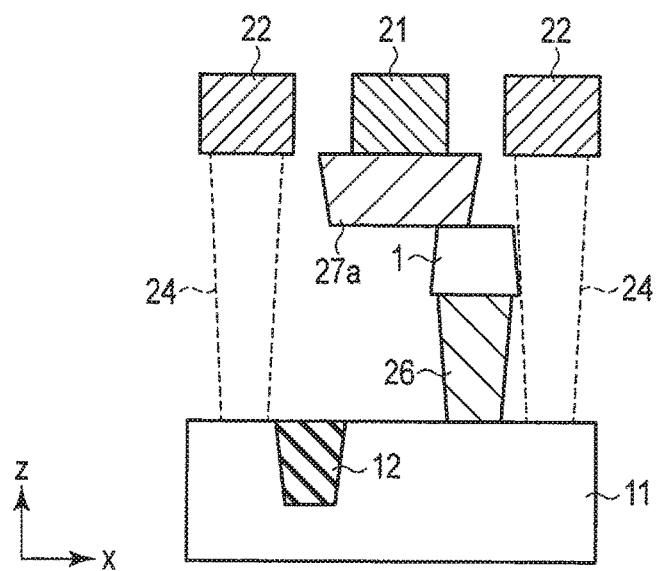
FIG. 6 illustrates the view along the VI-VI line of FIG. 5.
Figure 7:
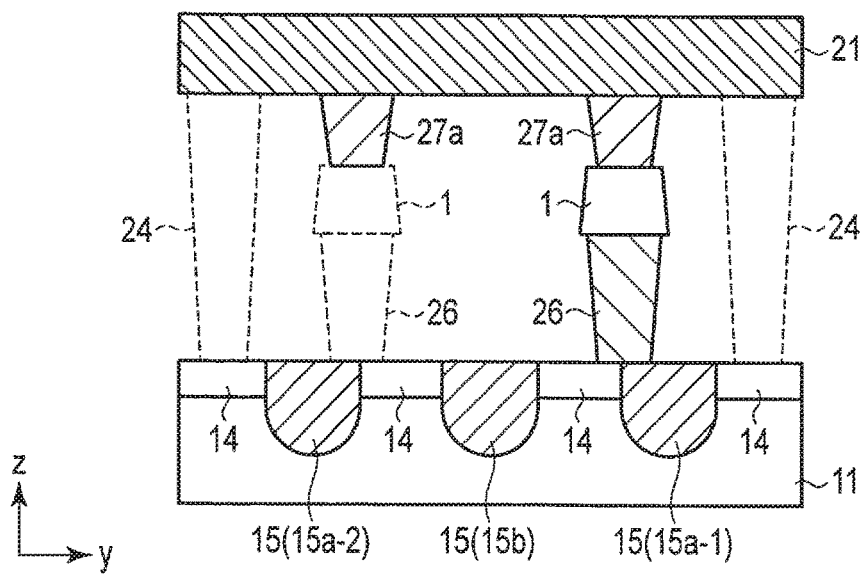
FIG. 7 illustrates the view along the VII-VII line of FIG. 5.

FIG. 5 illustrates a view of a memory device of a first example of the first embodiment seen from above. FIGS. 6 and 7 illustrate the sections along the VI-VI line and VII-VII lines of FIG. 5, respectively. As illustrated in FIGS. 5 to 7, the element isolation insulator 12 of shallow trench isolation (STI) is formed in the surface of a semiconductor substrate 11, for example. The element isolation insulator surrounds active areas 13 to divide active areas 13. The active areas 13 have a rectangular shape along the y-axis. The active areas 13 include separate source/drain areas 14 in the surface.

The substrate 11 also has gate electrodes 15 in the surface. The gate electrodes 15 are so-called buried gate electrodes, and, specifically, are buried in trenches at the surface of the substrate 11 with interposed gate insulators (not shown) on the trench surface. When a particular area (for example, trench) is described as "buried" in this specification, it does not necessarily mean that the area is completely buried. Instead, as understood by persons skilled in the art, "to be buried" includes an area being intended to be buried but partly unburied or with other material interposed therebetween.

The gate electrodes 15 extend along the x-axis at an equal interval along the y-axis. The gate electrodes 15 are also referred to as word lines. Each gate electrode 15, in the section between a pair of source/drain areas 14 at both sides, makes a metal oxide semiconductor field effect transistor (MOSFET) with these source/drain areas 14. Two adjacent gate electrodes 15 make a pair, and a gate electrode 15b between two adjacent gate-electrode-pairs is fixed to a particular potential, electrically isolates the gate electrodes 15 at both sides, and does not make a cell transistor. The gate electrodes other than the gate electrodes 15b are hereinafter referred to as gate electrodes 15a when distinguished from the gate electrodes 15b.

In this specification, when the first element of a reference numeral is a number or letter and the second element thereof is a letter or number with or without a hyphen or underscore, the second element distinguishes first elements of the same kind from each other. When multiple first elements do not need to be distinguished from each other, the description without a second element is used and refers to all the reference numerals having the first element.

The memory elements 1 are formed in the arrangement illustrated in FIGS. 2 and 4 above the substrate 11 along the z-axis. Each memory element 1 is coupled to the top of a contact plug 26 at the bottom. Each contact plug 26 is in contact with a source/drain area 14 at the bottom. A cell transistor including a pair of the source/drain areas at both sides of a particular gate electrode 15 and a memory element electrically coupled to one of this pair of the source/drain areas make a memory cell. The potential of the gate electrode 15, which is part of a cell transistor in a memory cell, is made high to turn on this cell transistor to select the memory cell including this cell transistor.

Above the memory element 1, bit lines 21 and source lines 22 of conductive materials extend. Adjacent bit line 21 and source line 22 make a pair. A set of such pair of bit line 21 and source line 22 extends along the y-axis above an active area 13 along the −z axis, is lined up along the x-axis at an interval, and is located at the same level (interconnect layer). The bit lines 21 and source lines 22 electric paths between memory cells and a read circuit and a write circuit. During a write, one of a selected pair of bit line 21 and source line 22 is electrically coupled to a current source and the other a bit line 22 is electrically coupled to a current sink. Current flowing from the current source to the current sink flows through a memory element 1, and the memory element 1 takes the resistance state in accordance with the direction of the current. During a read, a selected bit line 21 is coupled to the read circuit including a sense amplifier.

For the source lines 22, contact plugs 24 of a conductive material are provided. Multiple contact plugs 24 are provided for a single source line 22, and are lined up along the corresponding source line 22 along the y-axis. Each contact plug 24 is in contact with the bottom of the corresponding source line 22 at the top, and with a source/drain area 14 at the bottom. Each contact plug 24 is located between a pair of gate electrodes 15a between two gate electrodes 15b. Each contact plug 24 couples the cell transistor including the coupled source/drain area 14 to the corresponding source line 22. When a cell transistor is turned on, the memory cell including this cell transistor is electrically coupled to the source line 22.

In order for the memory elements 1 to be provided in the arrangement of FIGS. 2 and 4, the memory elements 1 are shifted from the intersections of the bit lines 21 and gate electrodes 15a, specifically as follows. A bit line 21 is located between two adjacent memory-element-columns, each of which is a set of memory elements 1 which are on the same x-axis coordinates and lined up along the y-axis. In other words, one of the two adjacent memory-element-columns extends along a bit line 21 at a first side, and the other extends along the bit line 21a at a second side opposite the first side.

Moreover, along gate electrodes 15a-1 and 15a-2 between the two gate electrodes 15b, two adjacent sets of memory elements lined up along the x-axis, which are referred to as memory-element-rows, are located. In other words, one of the two adjacent memory-element-rows extends along the gate electrode 15a-1 at a first side, and the other extends along the x-axis along the gate electrode 15a-2 at a second side opposite the first side. Moreover, when seen from above (i.e., in FIG. 5), each memory element 1 partially overlaps a single gate electrode 15a and a single bit line 21.

With such an arrangement of the memory elements 1, bit lines 21, and gate electrodes 1, mutual relationships of the memory elements 1, bit lines 21, and gate electrodes 15 can be described as follows. That is, when FIG. 5 is referred to, each of the memory elements 1-1 which overlap the gate electrodes 15a-1 is in the vicinity of the intersection of the corresponding bit line 21 and gate electrode 15a-1 and is shifted from the intersection toward the upper left. Each of the memory elements 1-2 which overlap the gate electrodes 15a-2 is in the vicinity of the intersection of the corresponding bit line 21 and gate electrode 15a-2 and is shifted from the intersection toward the lower right. The memory elements 1-1 and 1-2 may be shifted from respective intersections toward the upper right and the lower left, respectively. Moreover, a bit line 21 is located between two memory elements 1-1 which are neither located at a pair of vertices opposing via the right hexagon center nor adjoin along an edge of the right hexagon, and the memory element 1-2 at the center of the right hexagon center.

Each memory element 1 is also coupled to the bottom of a via plug 27 at the top. Each via plug 27 is coupled to the bottom of a single bit line 21 at the top. As described above, the memory elements 1 are greatly shifted from the center of the bit lines 21, and overlap the bit lines 21 with only a small area. Therefore, each via plug 27 has a plane shape extending along the width (i.e., length along the x-axis) of the bit lines 21 in order to couple the corresponding memory element 1 to the bit lines 21. Specifically, a via plug 27 has an elliptical shape which has a length in an x-axis direction length longer than the width of a bit line 21.

With such an arrangement, a single unit area 31 can be defined as follows. The unit area 31 is a component which is repeated to form a memory cell array. The unit area 31 includes gate electrodes 15a-1 and 15a-2, a bit line 21, a source line 22, two memory elements 1-1 and 1-2, contact plugs 26 and 24, and via plugs 27.

Figure 8:
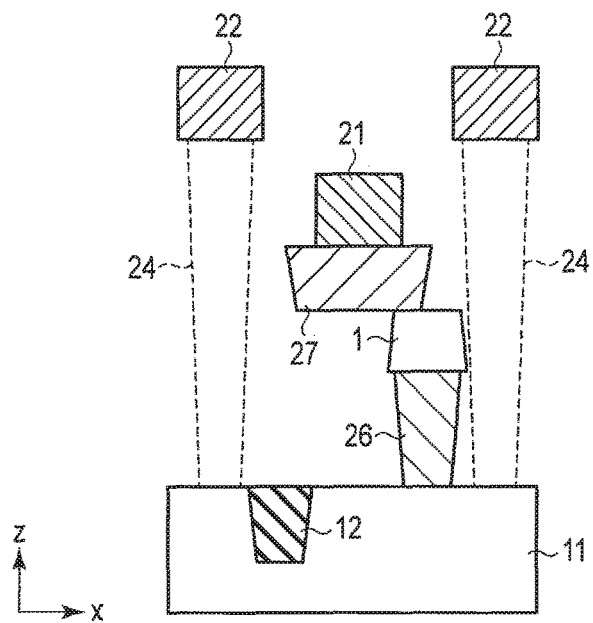
FIG. 8 illustrates the view along the VI-VI line of FIG. 5.
Figure 9:
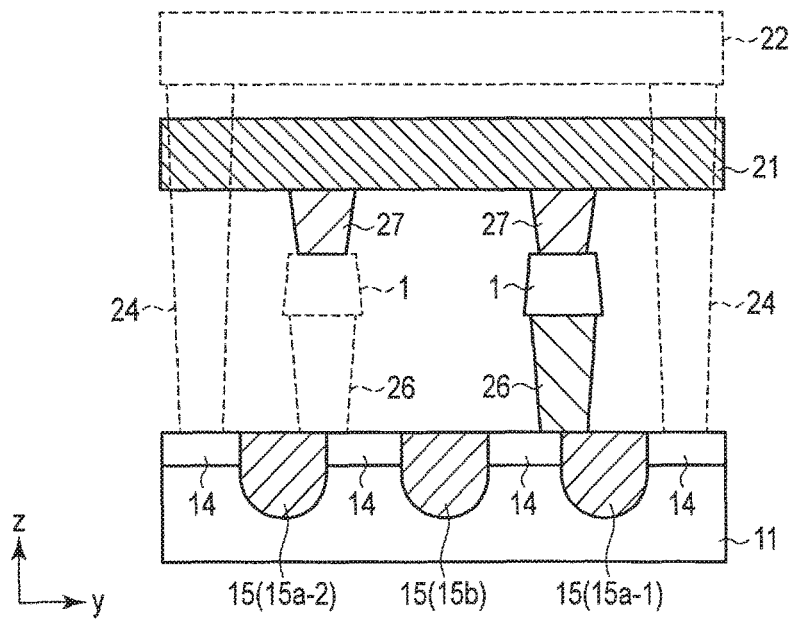
FIG. 9 illustrates the view along the VII-VII line of FIG. 5.

FIGS. 8 and 9 illustrate a memory device of a second example of the first embodiment, and illustrate the sections along the VI-VI and VII-VII lines of FIG. 5, respectively. In the second example, the bit lines 21 and source lines 22 are located at different levels (interconnect layers) compared with the first example, i.e., the source lines 22 are at a level above the bit lines 21.

Figure 10:
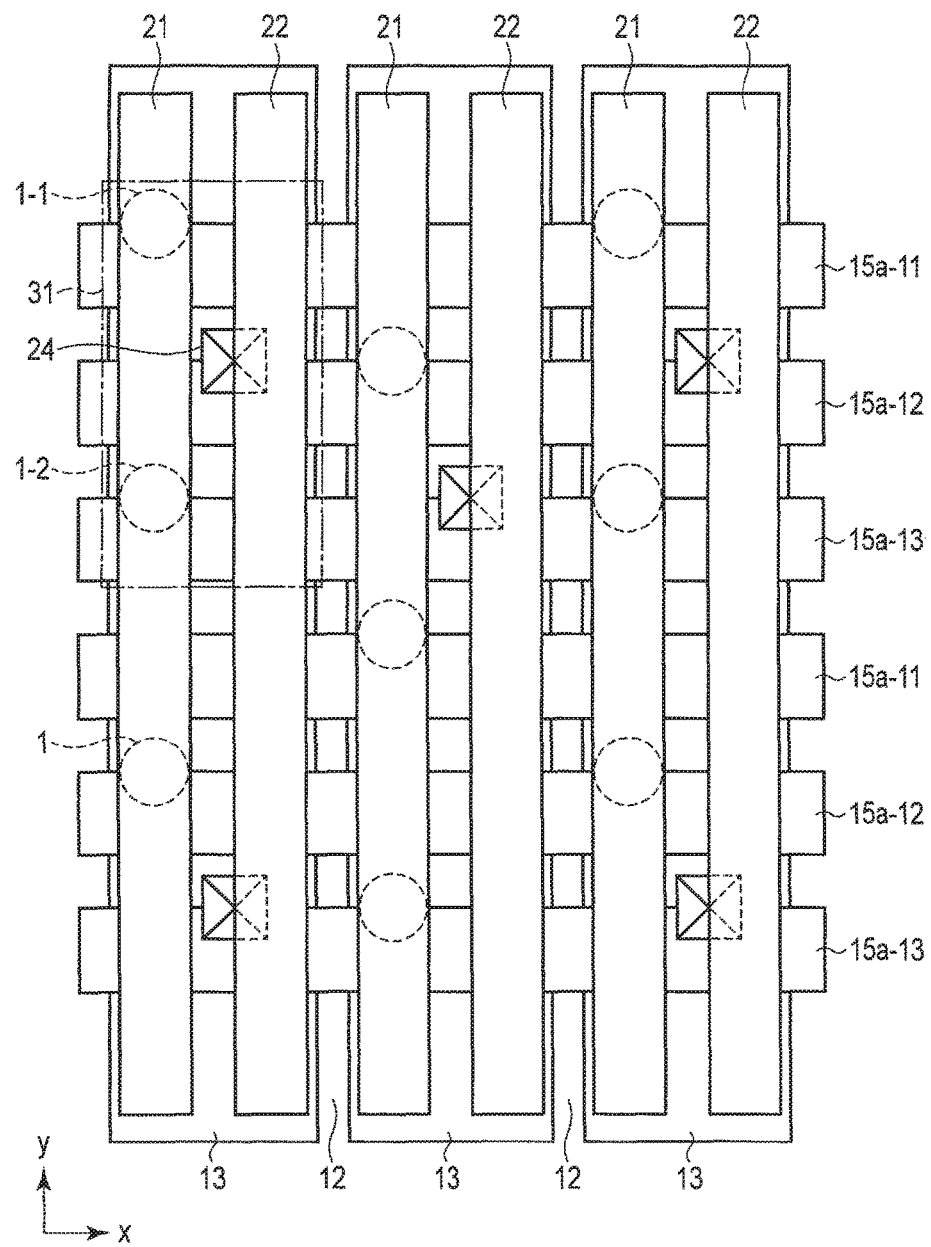
FIG. 10 illustrates a view of a memory device of a third example of the first embodiment seen from above.

FIG. 10 illustrates a view of a memory device of a third example of the first embodiment seen from above. The arrangement of the memory elements 1 of FIG. 10 is rotated from that of FIGS. 2 and 5 by 90 degrees. In the FIG. 10 example, each bit line 21 overlaps a single memory-element-column. This contrasts with the first example of the FIG. 5, where a single bit line 21 overlaps two memory-element-columns. In the FIG. 10 example, the unit area 31 includes a bit line 21, a source line 22, three gate electrodes 15a-11, 15a-12 and 15a-13, two memory elements 1-11 and 1-12, and associated plugs. Each memory element 1 is in the vicinity of the intersection of a bit line 21 and a gate electrode 15a, and shifted from the intersection upwards along the y-axis to partially overlap the bit line 21 and gate electrode 15a. Two adjacent memory elements 1-1 and 1-2 in the same memory-element-column overlap respectively with two gate electrodes 15a-11 and 15a-13 which are lined up with a single gate electrode 15a-11 therebetween. A contact plug 24 is in the vicinity of the intersection of a gate electrode 15a-12 and a source line 22, and shifted from the intersection toward the upper left to partially overlap the gate electrode 15a-12 and source line 22. The memory elements 1 overlap the bit lines 21, and therefore via plugs 27 between the memory elements 1 and bit lines 21 do not need to be elliptical shapes unlike the via plugs 27a.

The memory elements 1 are lined up on the straight line inclined from the x-axis by 60 degrees as described above. Therefore, it is conceivable to incline the gate electrodes 15a by 60 degrees to align the sets of memory elements 1 (memory element sets) lined up along the straight line which inclines from the x-axis by 60 degrees. FIG. 11 illustrates such an example and illustrates a view of a memory device of a fourth example of the first embodiment seen from above. Also in the FIG. 11 example, the arrangement of the memory elements 1 is rotated from that of FIGS. 2 and 5 by 90 degrees as in the FIG. 10 example. Therefore, the gate electrodes 15a are inclined from the x-axis by 30 degrees. Two adjacent gate electrodes 15a-21 and 15a-22 make a pair. A memory-element-set extends along a gate electrode 15a-21 at a first side, and another memory-element-set extends along a gate electrode 15a-22 at a second side opposite the first side. The memory-element-sets partially overlap the corresponding gate electrodes 15a.

The bit lines 21 and source lines 22 may be at the same level or different levels.

Figure 12:
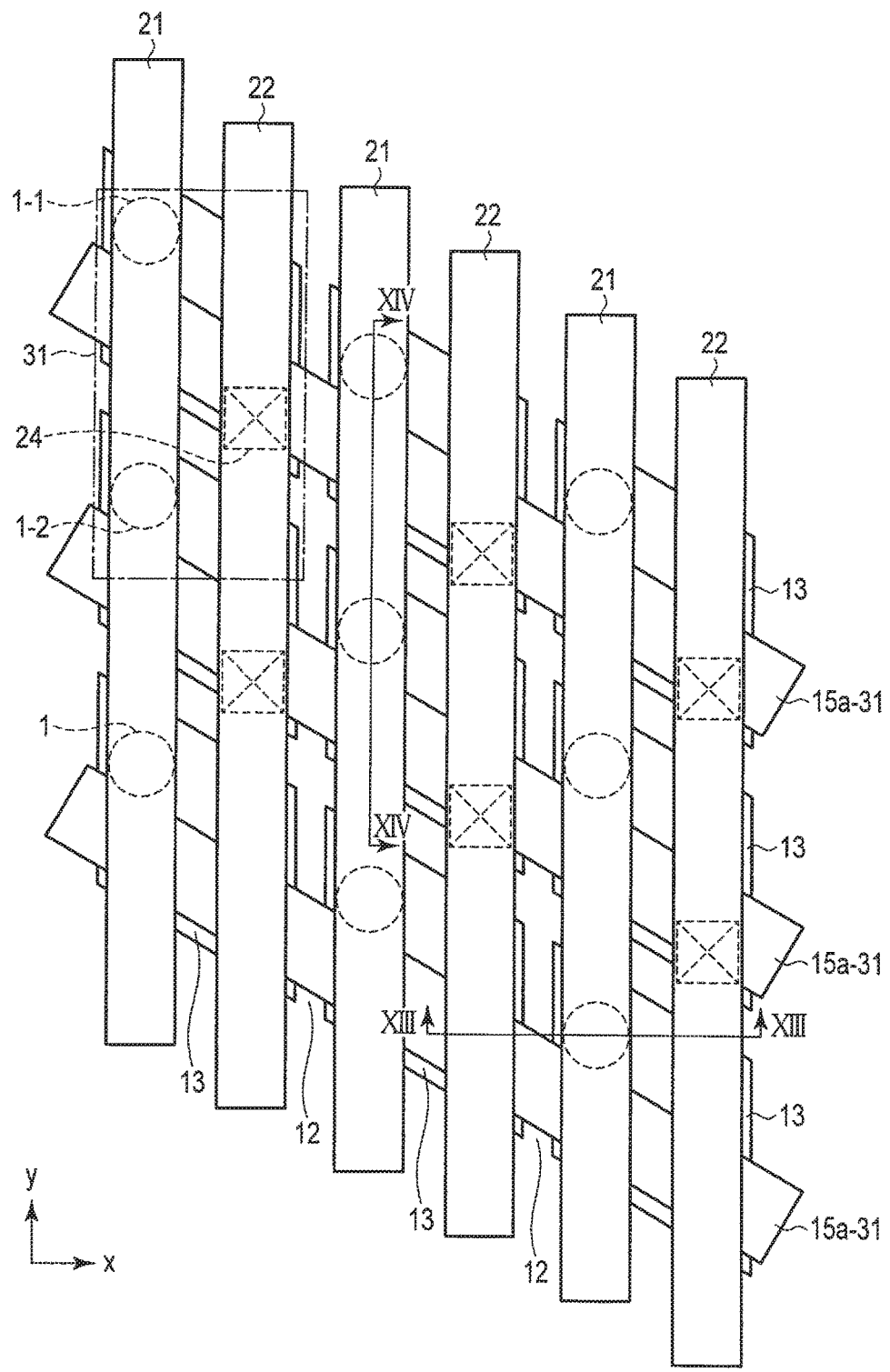
FIG. 12 illustrates a view of a memory device of a fifth example of the first embodiment seen from above.

FIG. 12 illustrates a view of a memory device of a fifth example of the first embodiment seen from above. FIGS. 13 and 14 illustrate the sections along the XIII-XIII and XIV-XIV lines of FIG. 12, respectively. The fifth example is similar to the fourth example, and in the fifth example the active areas 13, such as those of FIG. 12, are divided along the y-axis to result in provision of multiple active areas 13 lined up along the gate electrodes 15a-31. Unlike the fourth example, a set of source line contact plugs 24 (plug set) lined up along the straight line inclined from the x-axis by 60 degrees is provided in every inter-memory-element-sets area (sets of the memory elements 1 lined up along the straight line inclined from the x-axis 60 degrees). Each active area 13 has the shape of a parallelogram. One pair of the parallel edges of a parallelogram extends along the y-axis, and the other pair of edges extends along the gate electrodes 15a-31. Each gate electrode 15a-31 passes near the centers of active areas 13 lined up along this electrode 15a-31. Each gate electrode 15a-31 is located between a plug set and a memory-element-set, partially overlaps the memory elements 1 at a first side of this gate electrode 15a-31, and partially overlaps the contact plugs 24 at a second side.

Figure 15:
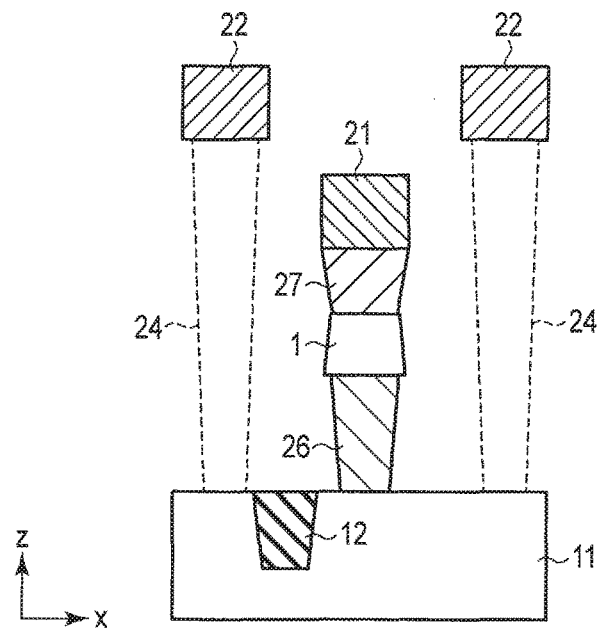
FIG. 15 illustrates the view along the XIII-XIII line of FIG. 12.
Figure 16:
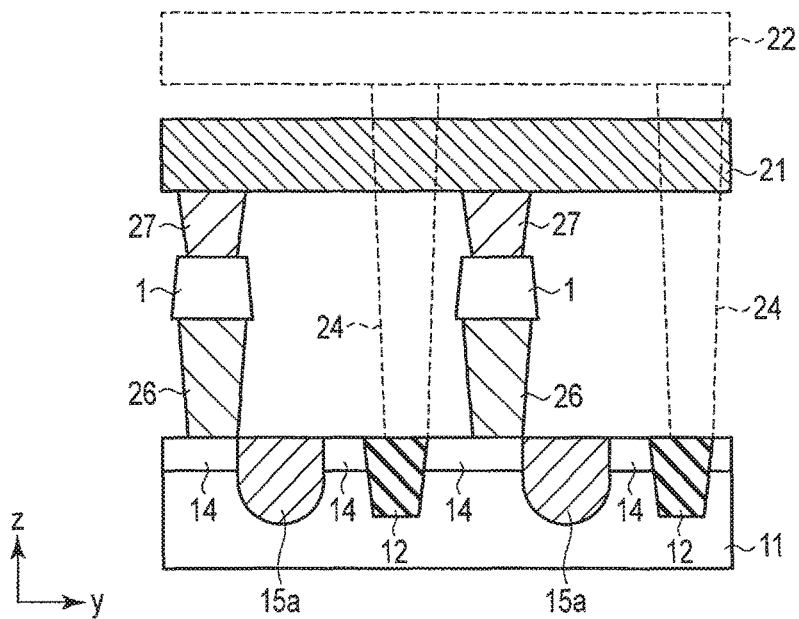
FIG. 16 illustrates the view along the XIV-XIV line of FIG. 12.

FIGS. 15 and 16 illustrate a memory device of a sixth example of the first embodiment, and illustrate the sections along the XIII-XIII and XIV-XIV lines of FIG. 12, respectively. In a sixth example, the bit lines 21 and source lines 22 are located at different levels (interconnect layers) compared with the fifth example, i.e., the source lines 22 are at a level above the bit lines 21.

As described above, according to the first embodiment, the memory elements 1 are arranged to be located at the vertexes and centers of the right hexagons, and as a result all adjacent memory elements 1 have equal intervals. With such an arrangement, an area for arranging a particular number of memory elements 1 is decreased to be 0.87 times the area for arranging the same number of memory elements 1 in the FIG. 1 example. This allows for implementation of a smaller memory cell array. Moreover, the arrangement of the memory elements 1 of the first embodiment can place, in the same area for the FIG. 1 arrangement, the same number of memory elements 1 with a larger interval. In other words, as many memory elements as those in FIG. 1 can be placed in the same area with decreased influence among the memory elements.

Second Embodiment

The second embodiment is based on the first embodiment, and especially on the fourth, fifth, or sixth example of the first embodiment.

According to the fourth to sixth examples of the first embodiment, gate electrodes 15 are inclined from the x-axis by 30 degrees. Therefore, the shape of the cell array, i.e., a line which connects the boundary of the cell array, is a parallelogram. This can be understood by extending FIGS. 11 and 12, which illustrate part of the cell array, to the whole cell array. The second embodiment is based on utilizing such a shape of the cell array.

As described above, the memory cells are selectively coupled to the read circuit and write circuit. To this end, a particular bit line 21 and source line 22 are electrically coupled to the read circuit or write circuit to form an electrical path between the selected memory cell and the read or write circuit. For such selective connection of bit lines 21 and source lines 22, a bit line and source line controller is provided in the memory device 1. The bit line and source line controller includes a switch circuit, and uses the switch circuit to couple a single bit line 21 and a single source line 22 which are specified by the address signal from outside to a global bit line and a global source line, respectively. The global bit line refers to part of a path between the bit lines 21 and read and write circuits, and the global source line refers to part of a path between the source lines 22 and the read circuit and write circuits.

Figure 17:
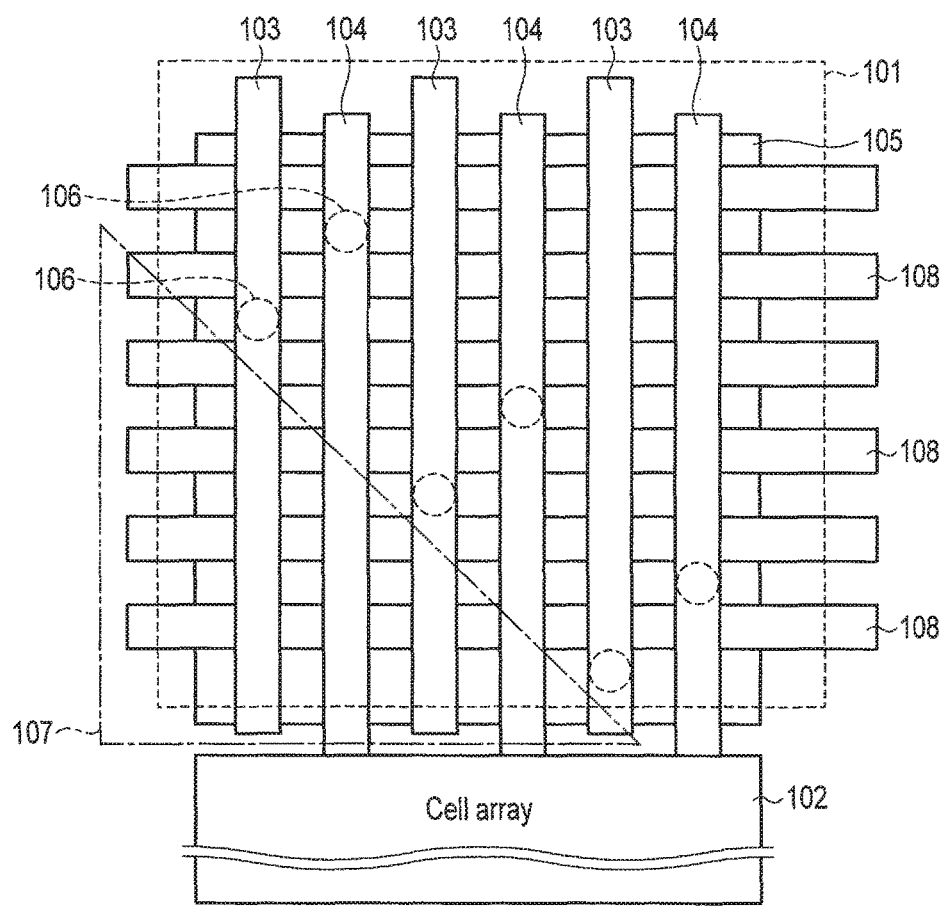
FIG. 17 illustrates a view of a vicinity of a boundary of a cell array for reference seen from above.

As illustrated in FIG. 17, the switch circuit (column switch circuit) 101 in a bit line and source line controller may be provided in the periphery of the cell array 102. Bit lines 103 and source lines 104 in the cell array 102 are taken out from the cell array 102 into the column switching circuit 101. The bit lines 103 and source lines 104 are coupled to active areas 105, especially source/drain areas, via contact plugs 106 in the area of the column switch circuit 101. No special requirements are placed on positions of the contact plugs 106 as long as the bit lines 103 and source lines 104 are coupled to the active areas 105 to secure the normal operation of the memory device. Therefore, an area 107 of the bit line 103 and the source lines 104 which includes sections from the boundary of the cell array 102 to the positions of the contact plugs 106 does not contribute in any regards other than for normal operation. Therefore, if this section can be removed, the area of the column switch circuit 101 can be reduced.

Based on this, in the second embodiment, an attempt is made to reduce the area of the column switch circuit made by using a particular arrangement of the contact plugs in the column switch circuit and combining the first embodiment.

Figure 18:
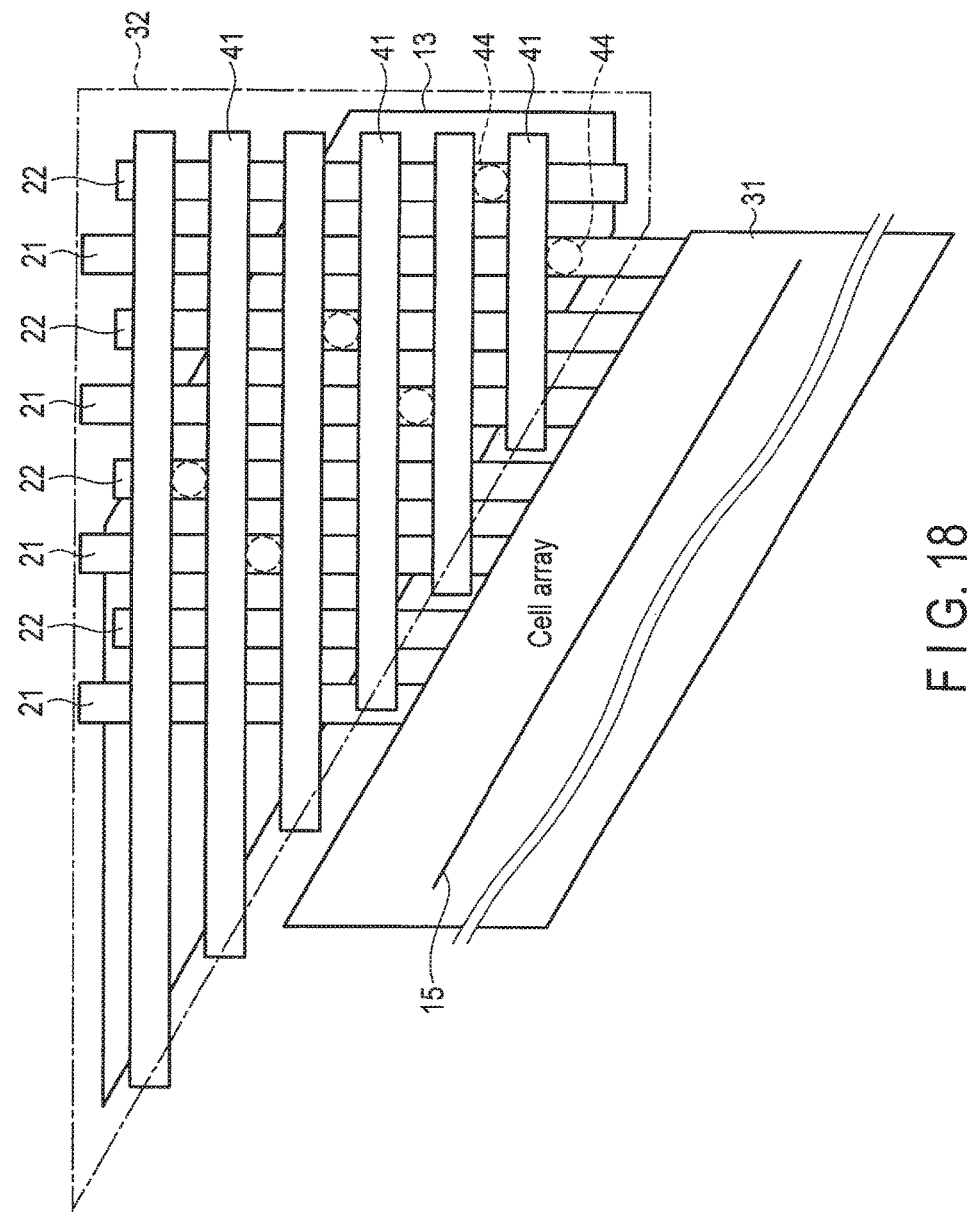
FIG. 18 illustrates a view of a vicinity of a boundary of a cell array of a second embodiment seen from above.

FIG. 18 illustrates a view of a memory device according to the second embodiment seen from above, and especially illustrates the vicinity of a boundary between a cell array 31 and a column switch circuit 32 of a bit line and source line controller. The cell array 31 has a parallelogram shape with a pair of opposing edges along the y-axis as described above. The cell array 31 of such a shape can be realized using the fourth, fifth, or sixth example of the first embodiment, for example. In this case, the remaining pair of oblique edges extends along the gate electrode 15, i.e., is inclined from the x-axis by 30 degrees, and is not parallel to the x-axis or y-axis.

The bit and source line controller controls the bit lines 21 and source lines 22, and includes a column switch circuit 32. The column switch circuit 32 includes switch circuits, and uses the switch circuits to couple a single bit line 21 and a single source line 22 which are specified by the address signal from outside to a global bit line and a global source, respectively. The global bit line and global source line are coupled to a read circuit and a write circuit. Each switch circuit of the column switch circuit 32 includes a MOSFET, for example. The column switch circuit 32 also includes gate electrodes 41 extending along the x-axis. The gate electrodes 41 are provided, for example, above the substrate 11. The gate electrodes 41 may be buried in the substrate 11.

The column switch circuit 32 further includes an active area 13. The active area 13 includes source/drain areas (not shown) in the surface. A single gate electrode 41 and a pair of source/drain areas at both sides thereof make a transistor as a switch circuit.

The bit lines 21 and source lines 22 come out from the cell array 31 along the y-axis to reach into the column switch circuit 32. The bit lines 21 and source lines 22 are coupled to the tops of contact plugs 46 at the bottoms. The bottoms of the contact plugs 44 are in contact with the active area 13, especially the source/drain areas in the active area 13.

As described above, the sections of the bit lines 21 and source lines 22 from the boundary of the cell array 31 to the positions of the contact plugs 44, which are referred to as tap sections, do not provide a large advantage other than electrical connections between the bit lines 21, source lines 22 and contact plugs 44. Therefore, an attempt to adjust these tap sections of bit lines 21 and source lines 22 is made. Specifically, the contact plugs 44 are arranged along the oblique edge of the cell array 31, more specifically on the straight line inclined from the x-axis by 30 degrees. As a result, a set of tap sections make a convenient shape along the oblique edge of the cell array 31. Utilizing this, each tap section is partly removed except for a portion just below a contact plug 44 along the y-axis. Specifically, as a result, the tap sections have necessary minimum lengths. Reduction of the tap sections reduces the resistances of the bit lines 21 and source lines 22.

In accordance with the reduction of the tap sections, the active area 13 is also partly removed in the lower left to have a shape with a cropped left-lower corner. Specifically, the active area 13 is partly removed in the lower left in accordance with the outline of the cell array 31 except for an area sufficient for connection with the contact plugs 44. This results in the active area 13 with an oblique edge inclined from the x-axis by 30 degrees. FIG. 18 illustrates that an edge connecting the upper and right edges of the active area 13 is also inclined by 30 degrees from the x-axis; however this is not necessary.

With such a shape of the tap sections and the active areas 13, the column switch circuit 32 has the shape with the cropped lower-left corner and has the same angle as the oblique edge of the cell array 31. Utilizing this, the cell array 31 is arranged along this oblique edge. This exactly corresponds to removal of the unnecessary area 107 of the FIG. 17 example.

With the above-described arrangement, all tap sections have the same length along the y-axis. Moreover, the cell array 31 is located on the extension of the gate electrodes 15. This contrasts to the FIG. 17 example. In the FIG. 17 example, the column switch circuit 101 is rectangular, and, based on this, the cell array is not located on the extension of the gate electrodes 108.

Figure 19:
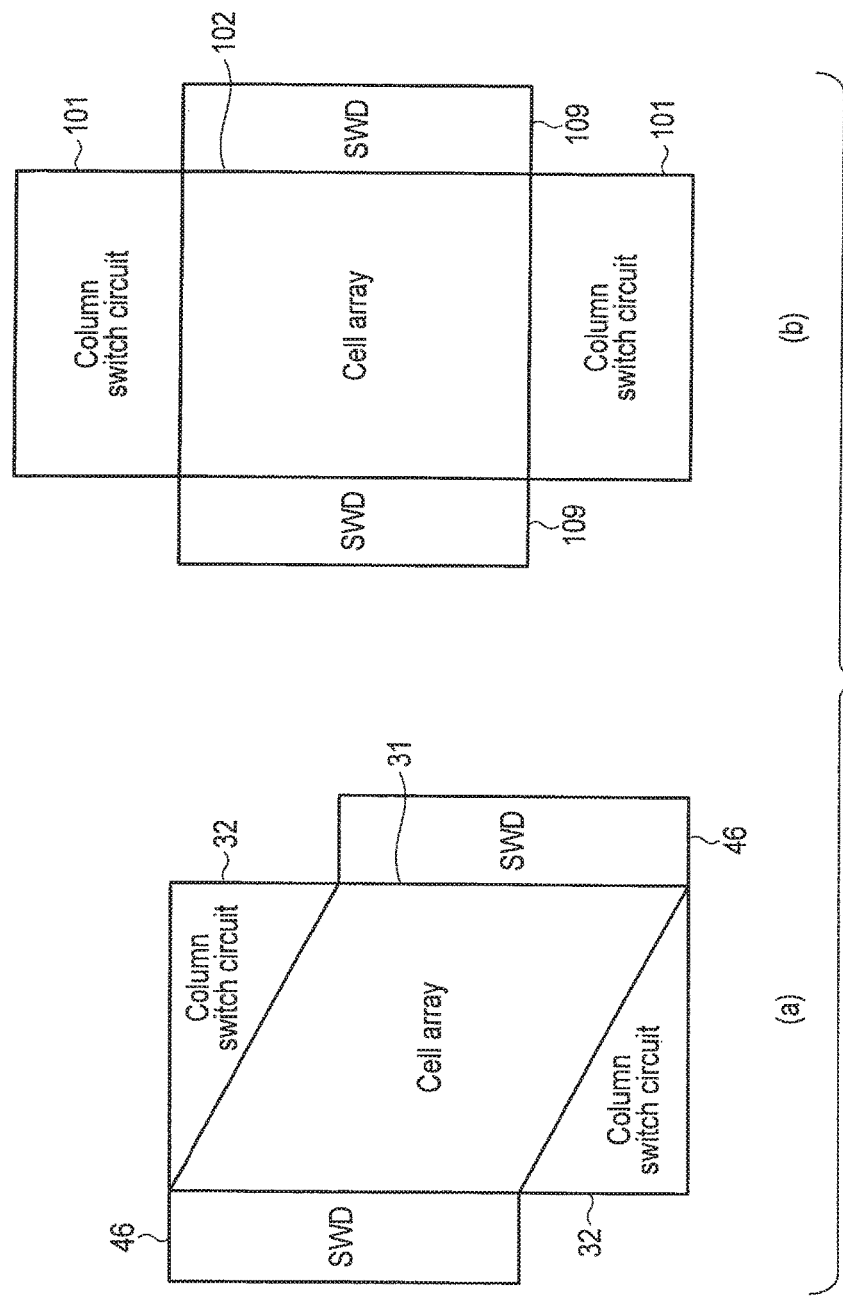
FIG. 19 illustrates layouts of part of memory devices of the second embodiment and for reference.

A column switch circuit 32 at the opposite side of the cell array 31 to that illustrated in the FIG. 18 can also have the same structure as FIG. 18. Specifically, the shape of the column switch circuit 32 below the cell array 31 is modified to align the lower edge of the cell array 31, and the column switch circuit 32 has the shape with the upper right corner cropped. This can be easily visually and intuitively understood from the view in FIG. 19. FIG. 19(a) illustrates the layout of part of the memory device of the second embodiment.

As illustrated in FIG. 19(a), the cell array 31 has a pair of edges along the y-axis and a pair of oblique edges. Moreover, the column switch circuit 32 above the cell array 31 has the shape with the lower left corner cropped to align the upper oblique edge of cell array 31. The column switch circuit 32 below the cell array 31 has the upper right corner cropped to align the lower oblique edge of the cell array 31. With such a layout, the whole area of the memory device of the second embodiment (i.e., the sum of areas of all components illustrated in FIG. 19 (a)) is much smaller than that of the FIG. 19(b) layout, which has rectangular column switch circuits 101 and cell array 102. It can be understood that the layout of FIG. 19 (a) corresponds to that of FIG. 19 (b) with cell array 31 entering into where the column switch circuit 101 used to be located. Note that components 46 and 109 of FIG. 19 are word line controllers which control the gate electrodes 15.

As described above, according to the second embodiment, the cell array 31 has an oblique edge which is not parallel to the x-axis or y-axis, and one or more column switch circuits 32 have the shape with a corner cropped to align the oblique edge. As a result, the sections of the column switch circuits 32 which do not contribute other than for normal operation can be removed to reduce the area of the column switch circuit 32 while maintaining the normal operation.

Third Embodiment

The third embodiment is based on the arrangement of the memory elements 1 located at the vertexes and centers of right hexagons as in the first embodiment.

Figure 20:
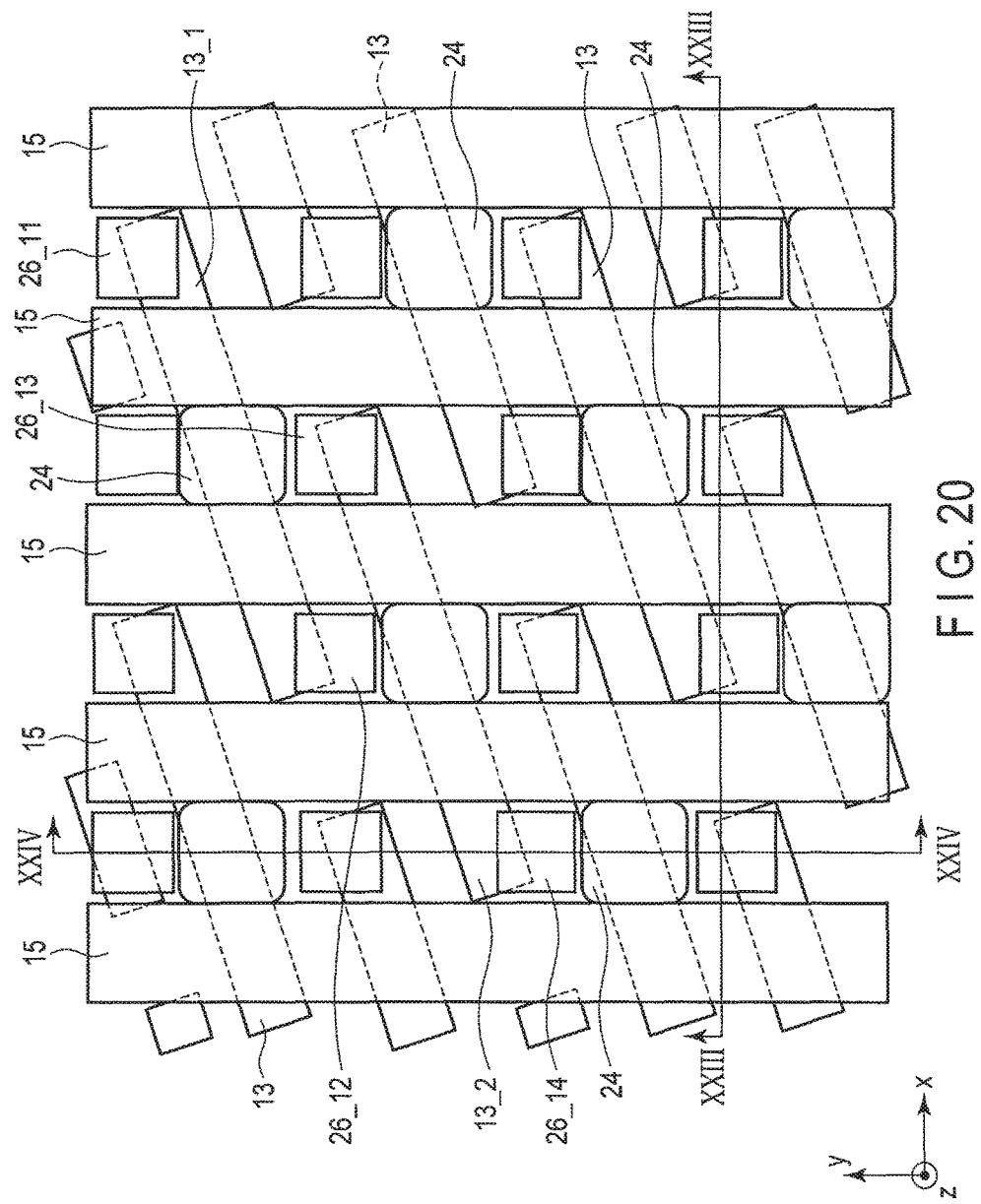
Figure 21:
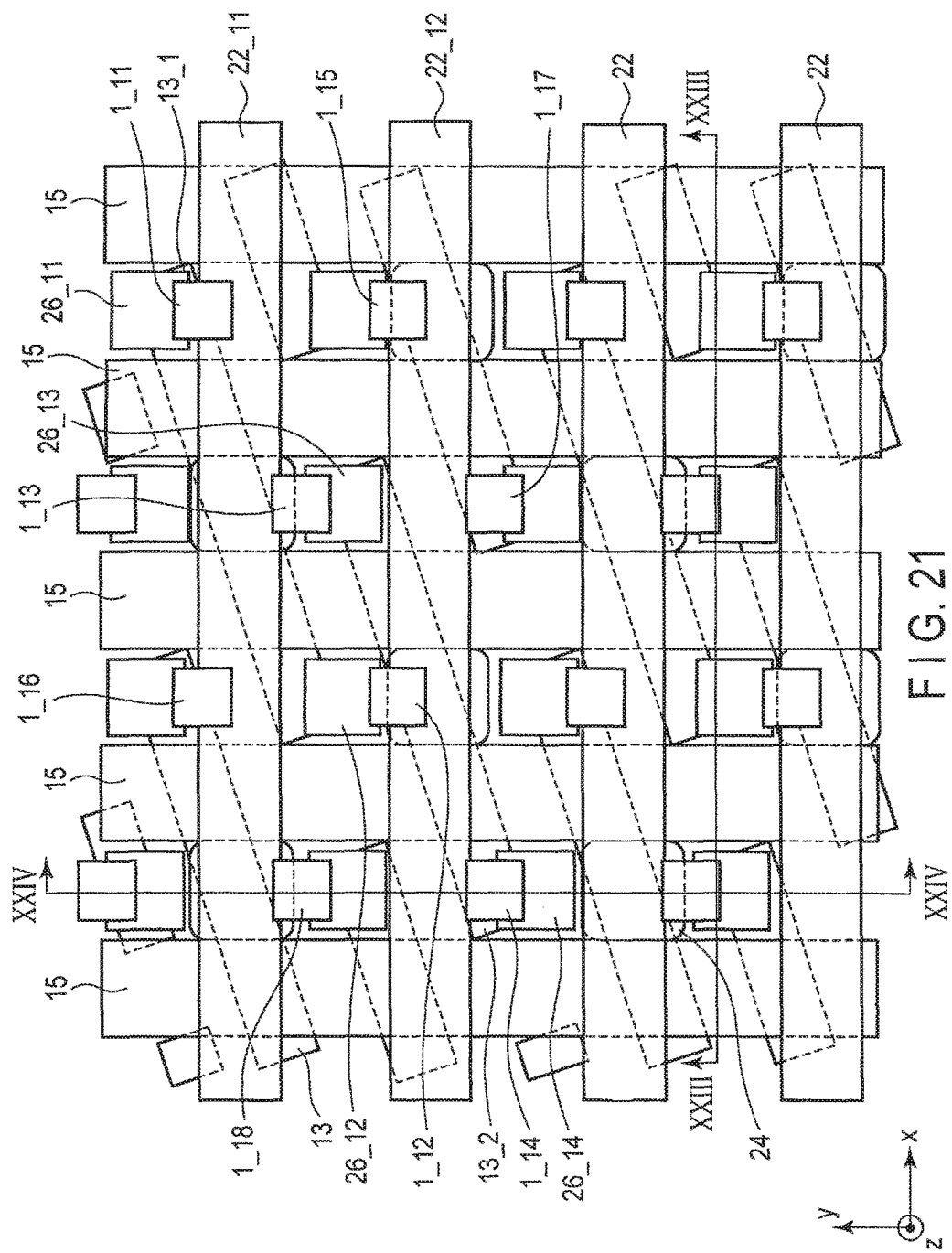
Figure 23:
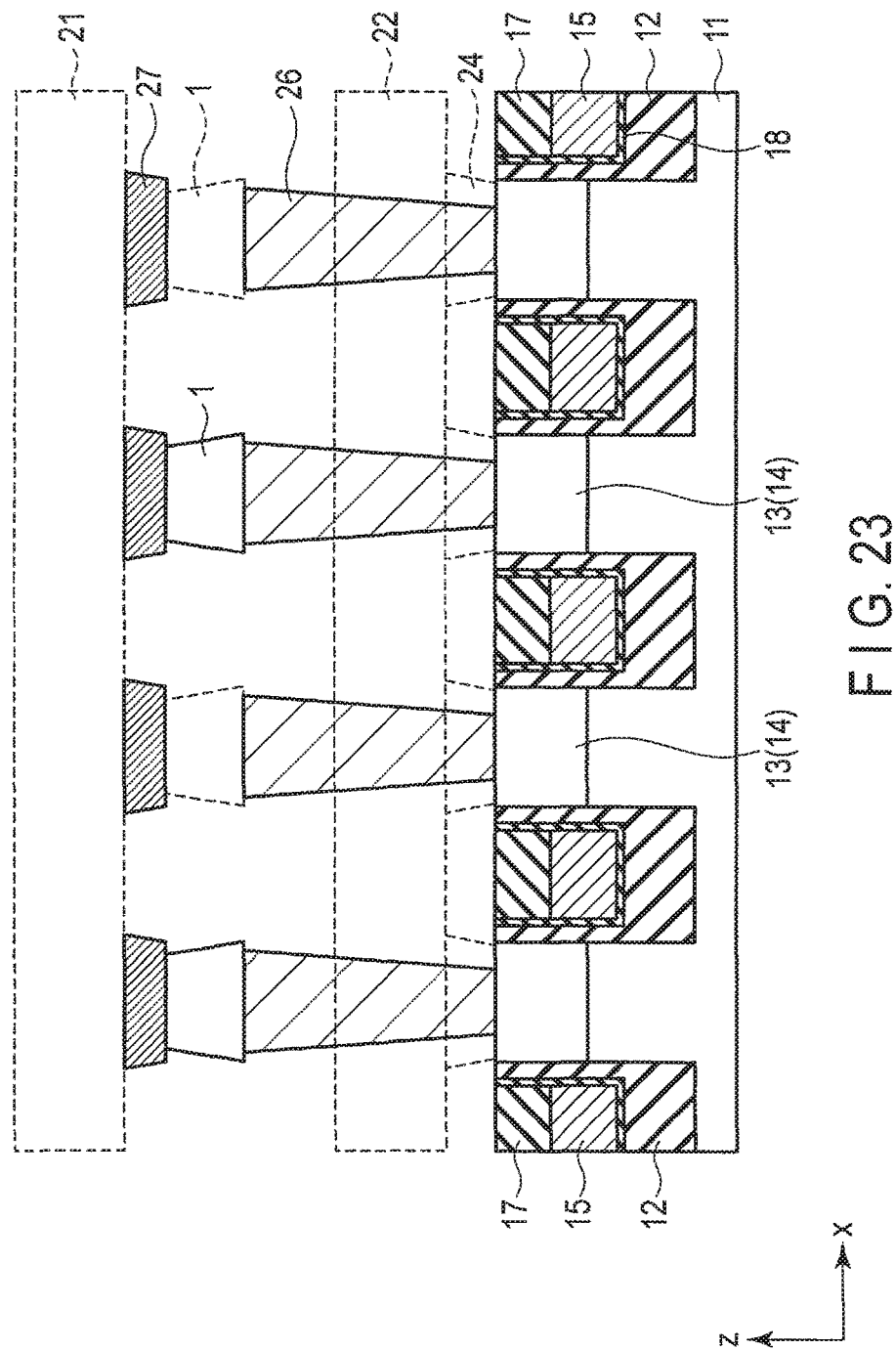
FIGS. 23 and 24 illustrate the views along the XXIII-XXIII line and the XXIV-XXIV line of FIG. 20, respectively.
Figure 24:
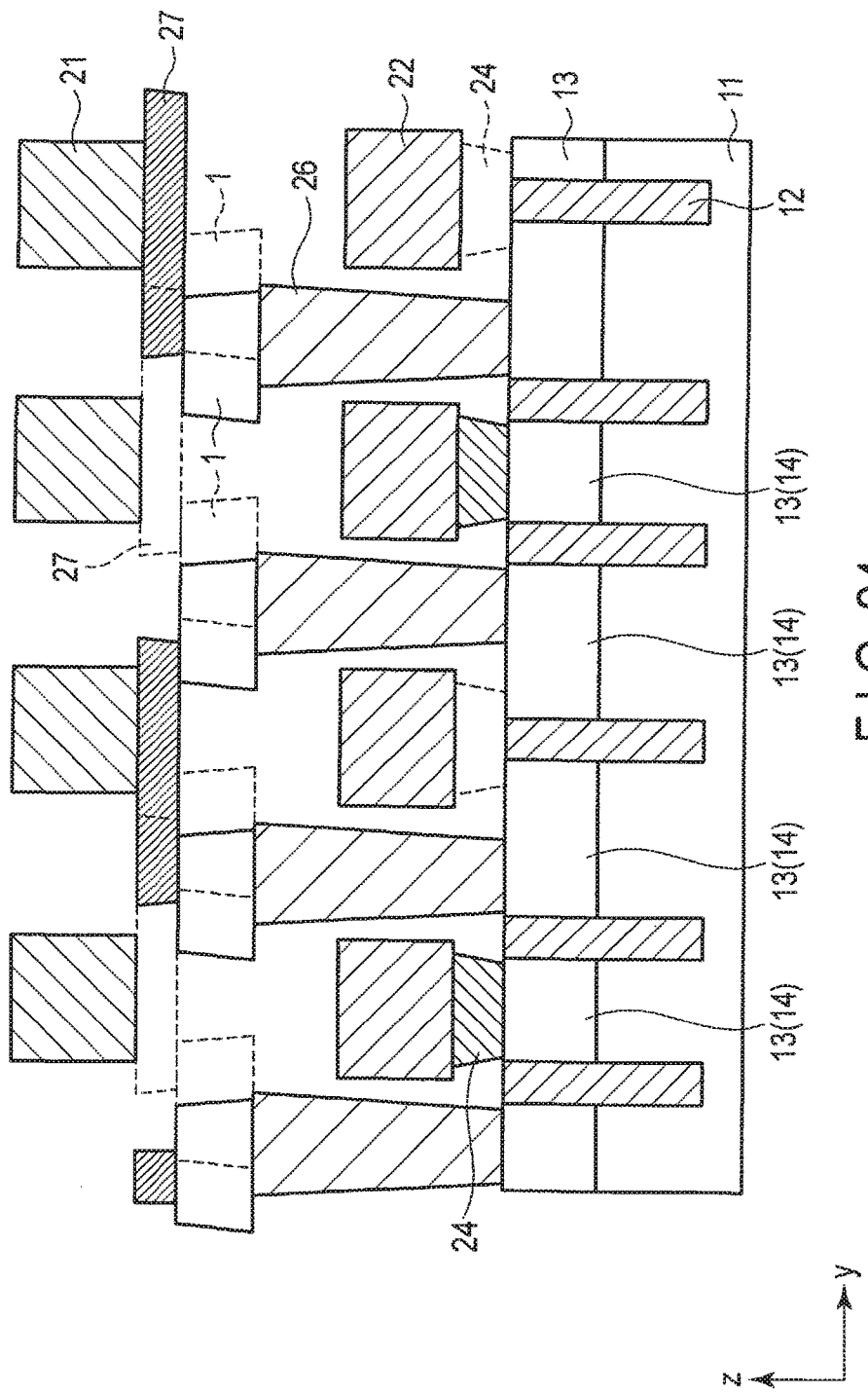

FIGS. 20 to 22 illustrate views of part of a memory device of a first example of the third embodiment seen from above. The arrangement of the memory elements 1 in FIGS. 20 to 22 is rotated from that of FIGS. 2 and 5 by 90 degrees as in FIG. 10 etc. FIG. 20 illustrates components in layers including the lowest layer (level) along the z-axis, and illustrates the surface of substrate 11, contact plugs 24 and components therebetween. FIG. 21 mainly illustrates components in layers higher than FIG. 20, and illustrates contact plugs 24, memory elements 1 and components therebetween. FIG. 22 mainly illustrates components in layers higher than FIG. 21, and illustrates memory elements 1, bit lines 21 and components therebetween. FIGS. 23 and 24 illustrate the views along the XXIII-XXIII line and XXIV-XXIV line of FIGS. 20 to 22, respectively.

The memory elements 1 are arranged in a direction rotated from the arrangement of the memory elements 1 of FIGS. 2 and 4 by 90 degrees above the substrate 11 along the z-axis. Therefore, the memory elements 1 line up along the y-axis, and are arranged in columns.

The gate electrodes 15 extend along the y-axis, line up along the x-axis with an interval, and extend between the memory element columns. The gate electrodes 15 are provided in the element isolation insulators 12 in the surface of the substrate 11, and are covered at the tops with the cap insulators 17. Specifically, the gate electrodes 15 and the cap insulators 17 are provided in the element isolation insulators 12 with the gate insulators 17 therebetween. The gate electrodes 15 are surrounded by respective gate insulators 18 and respective cap insulators 17. The cap insulators 17 are covered at the sides with respective gate insulators 18, and extend between the tops of the respective gate electrodes 15 and the surface of the substrate 11. FIGS. 20 to 23 do not illustrate the cap insulators 17 for the purpose of clarifying these figures.

The bits lines 21 and the source lines 22 extend along the x-axis. The bit lines 21 are located above the source lines 22 along the z-axis, the bit lines 21 and the source lines 22 overlap in the plane made of x-axis and y-axis, i.e., xy-plane, and the overlapping one bit line 21 and one source line 22 make a pair. In the xy-plane, bit and source lines pairs line up along the y-axis with an interval. Therefore, the bit and source lines pairs are arranged in rows. The bit lines 21 and the source lines 22 are, in the xy-plane, at the vicinity of or partly overlap with memory elements 1 lining up along the x-axis.

The active areas 13 (13_1 and 13_2) are independent from each other, are divided and surrounded by the element isolation insulators 12, and have rectangular shapes in the xy-plane. The active areas 13 extend, in the xy-plane, in a direction which connects areas near respective two particular memory elements 1. The details are as follows. Among the memory elements 1 at the vertexes of a right hexagon, two memory elements 1 on one of two diagonal lines which pass through the center of the hexagon and are not parallel with the y-axis (for example, memory elements 1_11 and 1_12) make a pair. So as to extend over areas beneath the proximity of this pair of memory elements 1, one active area 13 extends along the xy-plane. Therefore, the active areas 13 are not parallel with the x-axis or the y-axis. The active area 13 extending over a pair of memory elements 1 is, in the xy-plane, beneath the proximity of or partly overlaps with a memory element 1 between that pair of memory elements 1 (i.e., a memory element 1 at the center of the right hexagon which has the memory element pair at its vertexes).

More-than-one active areas 13 line up along the x-axis, forming rows. In each row of active areas (active area row), active areas 13 have a regular interval, and, for example, face each other at their ends in a direction along the y-axis. Specifically, the two active areas 13 are, in the xy-plane, beneath the proximity of or partly overlap with respective two memory elements 1 lining up along the y-axis. A set of active areas 13 along the x-axis is located below a source line 22 along the z-axis, has a correspondence with both that source line 22 and a bit line 21 thereabove along the z-axis, and is electrically coupled to that corresponding source and bit line pair.

Active areas 13 in a particular active area row differ from active areas 13 in an adjacent active area row in position or coordinate (of the centers thereof) on the x-axis. As a result, positions in the x-axis of respective active areas 13 in even-numbered rows and positions in the x-axis of respective active areas 13 in odd-numbered rows are different. For example, one of two active areas 13 which belong to two respective adjacent rows and face each other extends over, among first to fourth columns which line up, the first to third columns (or, sets of memory element 1 lining up along the y-axis), and the other one extends over the second to fourth columns.

Each active area 13 extends over at least two gate electrodes 15 which adjoin, and is penetrated through by those two gate electrodes to be divided into three sections. In the three sections of each active area 13 divided by two gate electrodes 15, source/drain areas 14 are formed. Each gate electrode 15, in the section between a pair of source/drain areas 14 at both sides, makes a cell transistor with these source/drain areas 14. The middle of the sections of each active area 13 is coupled to the bottom of a contact plug 24. The contact plugs 24 are coupled at the tops to the source lines 22. Each contact plug 24 is located between two adjacent gate electrodes 15 in the xy-plane.

Each active area 13 needs to be electrically coupled at one end (a source/drain area 14) to a corresponding bit line 21 via a memory element 1, and at the other end (a source/drain area 14) to that bit line 21 via another memory element 1. However, some active areas 13 do not overlap with both the corresponding bit line 21 and the corresponding memory element 1 at each of their ends in the xy-plane, as can be seen from the figures. To address this, the contact plugs 26 and the via plugs 27 have the shapes and arrangement which allow for electrical connections of the active areas 13, the bit lines 21, and the memory elements 1. The details are as follows.

In a set of every other rows, for example, in even-numbered rows, each active area 13_1 overlaps at one of two ends (for example, at the right-hand side) with a contact plug 26_11 in the xy-plane. For example, the contact plug 26_11 overlaps in the xy-plane with an upper part of the first end of the active area 13_1. The contact plug 26_11 further overlaps in the xy-plane with an upper part of the memory element 1_11. Between the memory element 1_11 and the corresponding bit line 21_11, a via plug 27_11 is provided. The via plug 27_11 is coupled to the memory element 1_11 and the bit line 21_11, overlaps in the xy-plane with the memory element 1_11 and the bit line 21_11, and is located between two gate electrodes 15. With such shapes and arrangement of the memory element 1_11, the contact plug 26_11 and the via plug 27_11, the first end of the active area 13_1 is electrically coupled to the bit line 21_11 via the memory element 1_11.

The second end (for example, at the left-hand side) of the active area 13_1 overlaps in the xy-plane with a contact plug 26_12. For example, the contact plug 26_12 overlaps in the xy-plane with a lower part of the second end of the active area 13_1. The contact plug 26_12 further overlaps in the xy-plane with an upper part of the memory element 1_12. The memory element 1_12 partly overlaps in the xy-plane with a non-corresponding bit line 21_12. Between the memory element 1_12 and the corresponding bit line 21_11, a via plug 27_12 is provided. The via plug 27_12 is coupled to the memory element 1_12 and the bit line 21_11, overlaps in the xy-plane with the memory element 1_12 and the bit line 21_11, and is located between two gate electrodes 15. With such shapes and arrangement of the memory element 1_12, the contact plug 26_12 and the via plug 27_12, the second end of the active area 13_1 is electrically coupled to the bit line 21_11 via the memory element 1_12.

Sets of such active area 13_1, the corresponding memory elements 1_11 and 1_12, and the contact plugs 24, 26_11, and 26_12, and the via plugs 27_11 and 27_12 are repeatedly provided along the bit line 21_11.

In a set of every other rows including a row different from the row to which the active area 13_1 belongs, for example, in odd-numbered rows, each active area 13_2 overlaps at one of two ends (for example, at the right-hand side) with a contact plug 26_13 in the xy-plane. For example, the contact plug 26_13 overlaps in the xy-plane with an upper part of the first end of the active area 13_2. The contact plug 26_13 further overlaps in the xy-plane with a memory element 1_13. Between the memory element 1_13 and the bit line 21_12, a via plug 27_13 is provided. The via plug 27_13 is coupled to the memory element 1_13 and the bit line 21_12, overlaps in the xy-plane with the memory element 1_13 and the bit line 21_12, and is located between two gate electrodes 15. With such shapes and arrangement of the memory element 1_13, the contact plug 26_13 and the via plug 27_13, the first end of the active area 13_2 is electrically coupled to the bit line 21_12 via the memory element 1_13.

The second end (for example, at the left-hand side) of the active area 13_2 overlaps in the xy-plane with a contact plug 26_14. For example, the contact plug 26_14 overlaps in the xy-plane with a lower part of the second end of the active area 13_2. The contact plug 26_14 further overlaps in the xy-plane with a lower part of the memory elements 1_14. Between the memory element 1_14 and the corresponding bit line 21_12, a via plug 27_14 is provided. The via plug 27_14 is coupled to the memory element 1_14 and the bit line 21_12, overlaps in the xy-plane with the memory element 1_14 and the bit line 21_12, and is located between two gate electrodes 15. With such shapes and arrangement of the memory element 1_14, the contact plug 26_14 and the via plug 27_14, the second end of the active area 13_2 is electrically coupled to the bit line 21_12 via the memory element 1_12.

Sets of such active areas 13_2, the corresponding memory elements 1_13 and 1_14, the contact plugs 24, 26_13, and 26_14, and the via plugs 27_13 and 27_14 are repeatedly provided along the bit line 21_12.

The via plugs 27 also contribute to connections between a memory element 1 different from the above-described one and the bit line 21. Specifically, the via plug 27_11 couples a memory element 1_15 adjacent the memory element 1_11 along the y-axis and the bit line 21_11, and overlaps in the xy-plane with the memory element 1_15 and the bit line 21_11. The memory element 1_15 corresponds to a memory element 1 on the left-hand side, i.e., the memory element 1_12, of another active area 13 of the same row as the active area 13_1 to which the memory element 1_11 is electrically coupled.

The via plug 27_12 couples a memory element 1_16 adjacent the memory element 1_12 along the y-axis and the bit line 21_11, and overlaps in the xy-plane with the memory element 1_16 and the bit line 21_11. The memory element 1_16 corresponds to a memory element 1 on the right-hand side, i.e., the memory element 1_11, of another active area 13 of the same row as the active area 13_1 to which the memory element 1_12 is electrically coupled.

The via plug 27_13 couples a memory element 1_17 adjacent the memory element 1_13 along the y-axis and the bit line 21_12, and overlaps in the xy-plane with the memory element 1_17 and the bit line 21_12. The memory element 1_17 corresponds to a memory element 1 on the left-hand side, i.e., the memory element 1_14, of another active area 13 of the same row as the active area 13_2 to which the memory element 1_13 is electrically coupled.

The via plug 27_14 couples a memory element 1_18 adjacent the memory element 1_14 along the y-axis and the bit line 21_12, and overlaps in the xy-plane with the memory element 1_18 and the bit line 21_12. The memory element 1_18 corresponds to a memory element 1 on the right-hand side, i.e., the memory element 1_13, of another active area 13 of the same row as the active area 13_2 to which the memory element 1_14 is electrically coupled.

The angle in the xy-plane of the active areas 13 only needs to have a value to allow both ends of active areas 13 to be electrically coupled to the memory elements 1 through the contact plugs 24 and 26, and the via plugs 27, and is not limited to the examples of FIGS. 20 to 24. The angle θ between the active areas 13 and the x-axis depends on the sizes and the pitches of the bit lines 21 and the gate electrodes 15.

According to the above-described layout, the size of a single cell is as follows, when compared to FIG. 1. In the FIG. 1 example, the ratio of the length along the y-axis to the length along the x-axis of the size of a single cell is 1:1. In contrast, in the third embodiment, the ratio of the length along the y-axis to the length along the x-axis of the size of a single cell is 1:0.866.

As described above, according to the third embodiment, the memory elements 1 are arranged to be located at the vertexes and centers of the right hexagons, and as a result all adjacent memory elements 1 have the same interval as in the first embodiment. For this reason, the same advantage as the first embodiment can be obtained. In addition, the active areas 13, the bit lines 21, the source lines 22, the contact plugs 24, 26 and the via plugs 27 of the third embodiment also allow for connections of the active areas 13, the memory elements 1, the bit lines 21, and the source lines 22.

Figure 25:
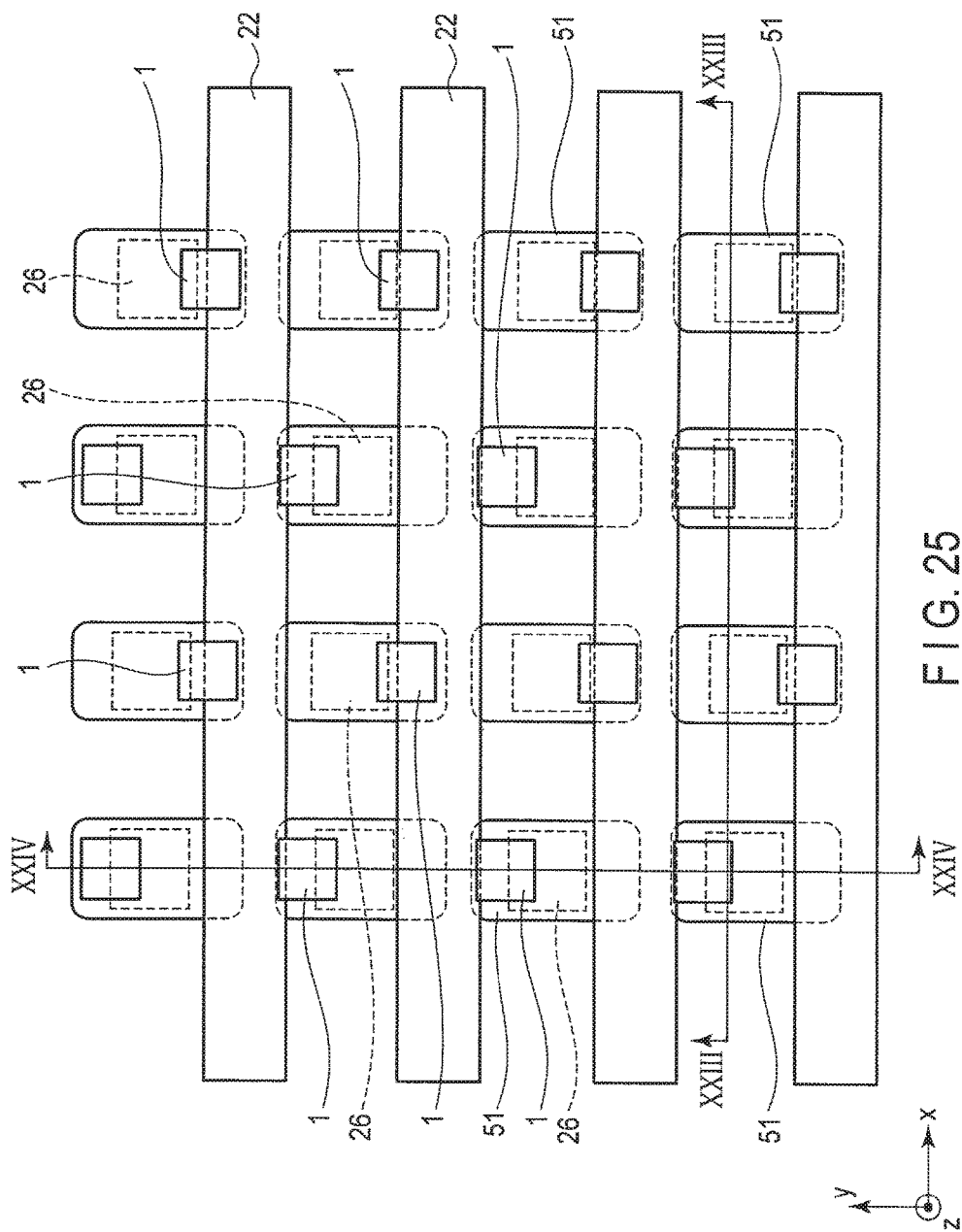
FIGS. 25 and 26 illustrate views of part of a memory device of a second example of the third embodiment seen from above.
Figure 26:
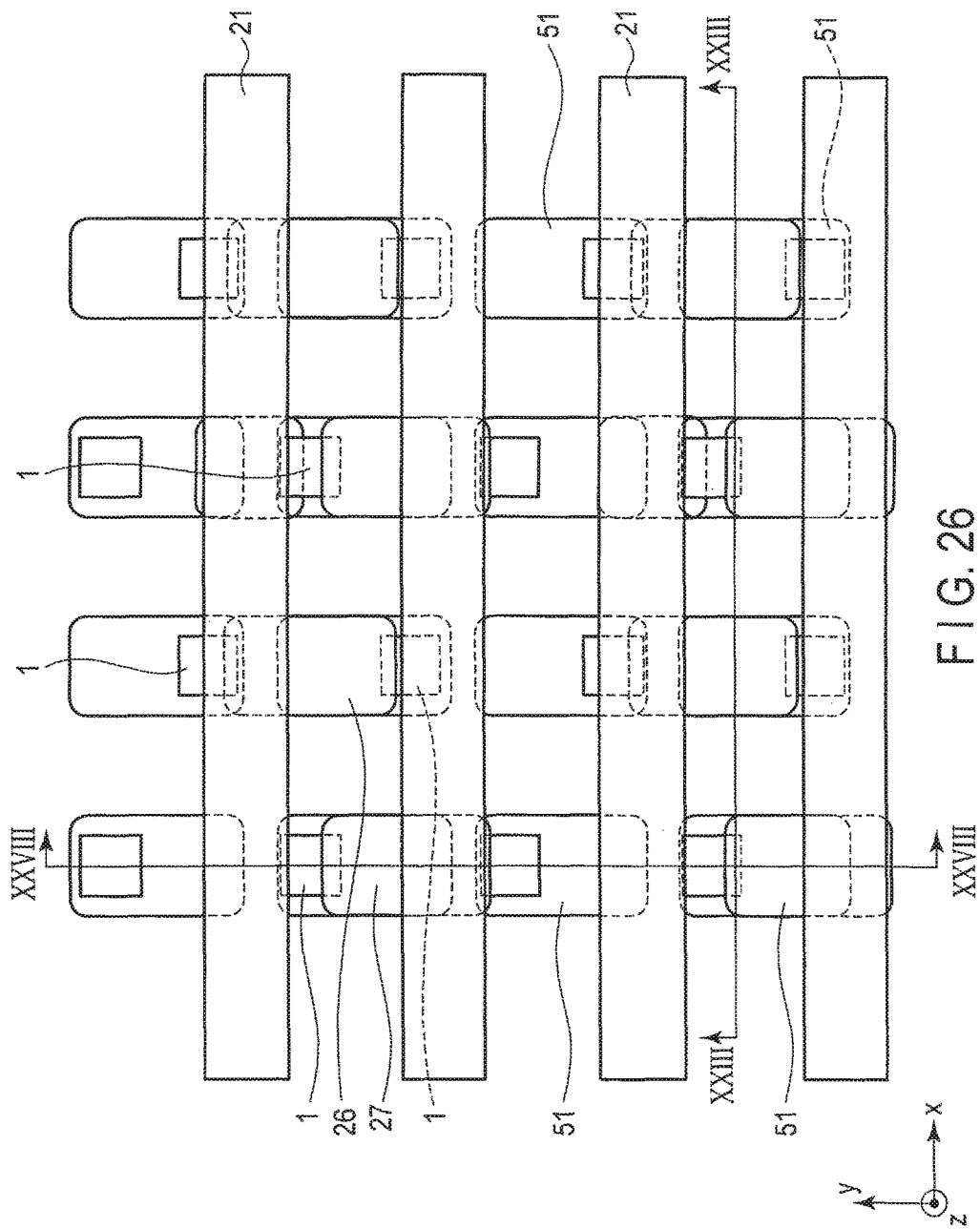
Figure 28:
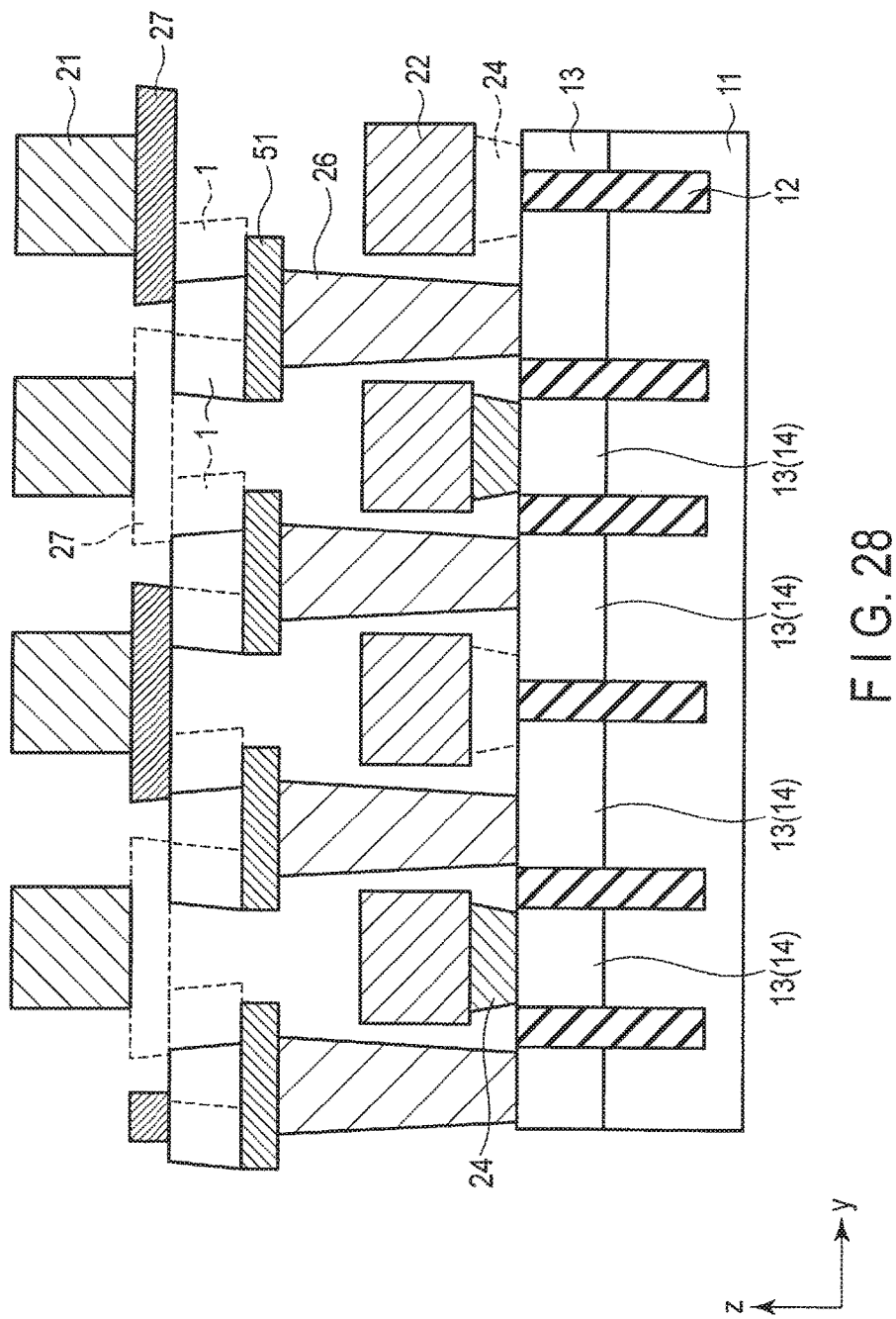

Additional layers may be included between the active areas 13 and the bit lines 21. Such examples will now be described. FIGS. 25 and 26 illustrate views of part of a memory device of a second example of the third embodiment seen from above. FIG. 25 illustrates contact plugs 26, source lines 22 and components therebetween. FIG. 26 illustrates components in layers higher than FIG. 25, and illustrates memory elements 1, bit lines 21 and components therebetween. FIGS. 27 and 28 illustrate the views along the XXVII-XXVII line and XXVIII-XXVIII line of FIGS. 25 and 26, respectively.

In the second example, conductive layers 51 are provided between the contact plugs 26 and the memory elements 1 in addition to the components, arrangement and connections in the first example. Each conductive layer 51 is in contact at both sides with a contact plug 26 and a memory element 1. Moreover, each conductive layer 51 is located in the xy-plane between two gate electrodes 15, and, for example, overlaps with the two gate electrodes 15. Furthermore, each conductive layer 51 extends along the y-axis over both ends of a set of two memory elements 1 in respective two columns which line up along the x-axis. For example, each conductive layer 51 has a size to encompass a single contact plug 26 and a single memory element 1 electrically coupled to that contact plug in the xy-plane. Such conductive layers 51 can electrically couple the contact plugs 26 and the memory elements 1 stably. Specifically, it can be avoided that positions of contact plugs 26 and memory elements 1 are shifted from intended positions to result in large variation in contact areas among pairs of a contact plug 26 and a memory element 1 which should be coupled to each other. Such property variation due to contact area variation or defects due to no contact can be suppressed by the conductive layers 51.

Figure 30:
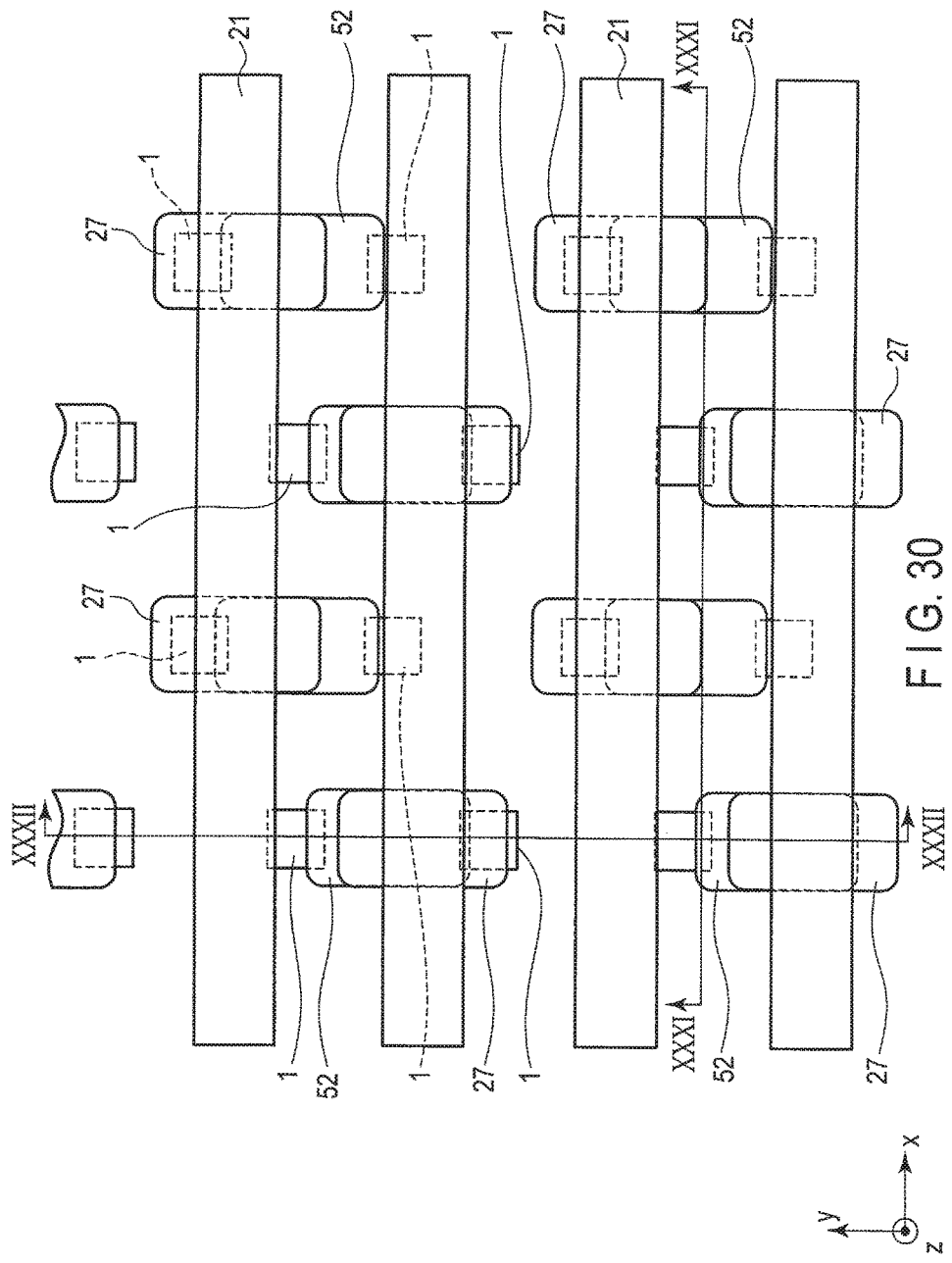
Figure 31:
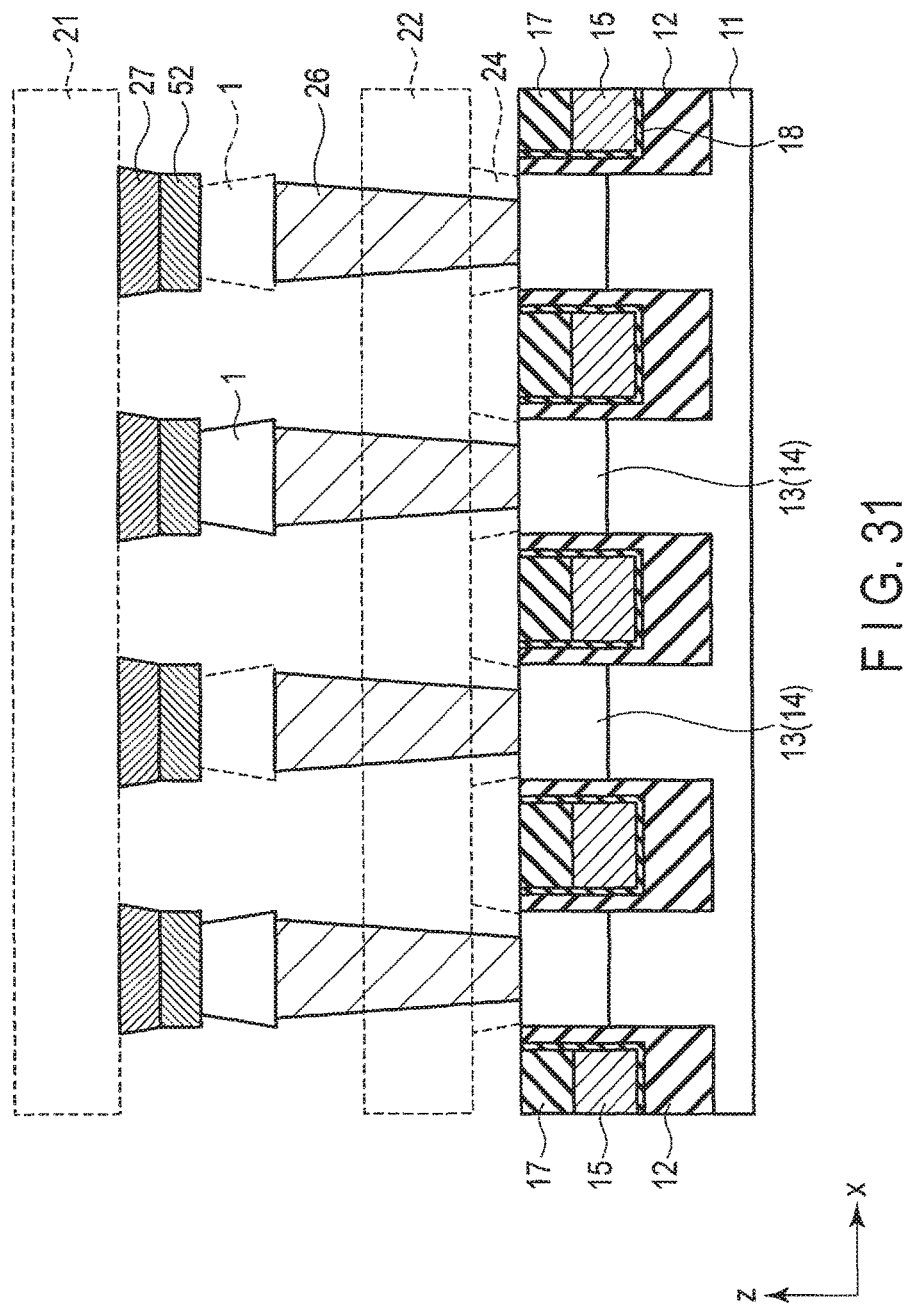
FIGS. 31 and 32 illustrate the views along the XXXI-XXXI line and the XXXII-XXXII line of FIG. 29, respectively.
Figure 32:
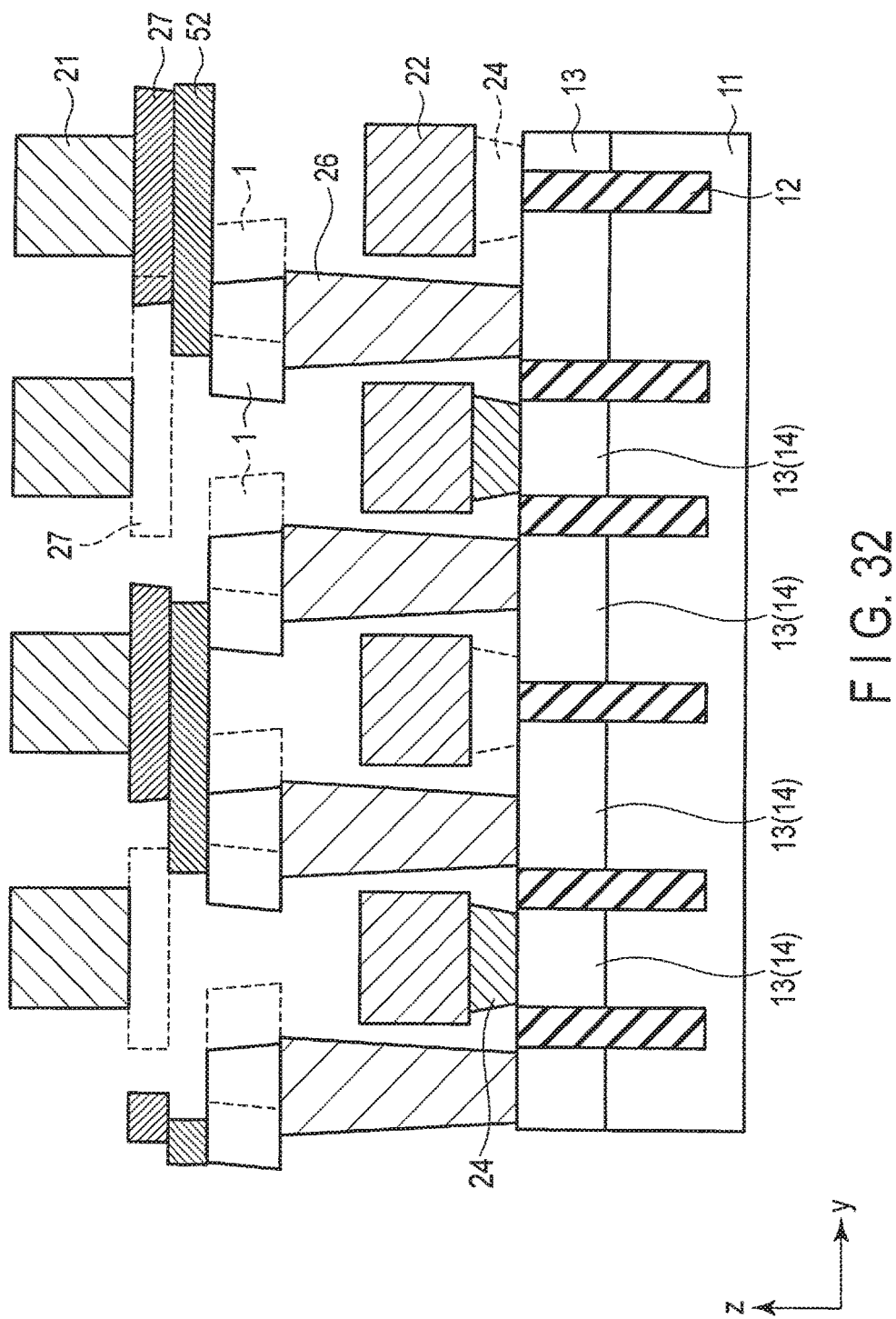

FIGS. 29 and 30 illustrate views of part of a memory device of a third example of the third embodiment seen from above. FIG. 29 illustrates contact plugs 26, conductive layers 52 and components therebetween. FIG. 30 mainly illustrates components in layers higher than FIG. 29, and illustrates memory elements 1, bit lines 21 and components therebetween. FIGS. 31 and 32 illustrate the views along the XXXI-XXXI line and XXXII-XXXII line of FIGS. 29 and 30, respectively.

In the third example, conductive layers 52 are provided between the memory elements 1 and the via plugs 27 in addition to the components, arrangement and connections in the second example. Each conductive layer 52 is in contact at both sides with a memory element 1 and a via plug 27. Each conductive layer 52 is located in the xy-plane between two gate electrodes 15, and, for example, overlaps with the two gate electrodes 15. Moreover, each conductive layer 52 extends along the y-axis over both two memory elements 1 which line up along the y-axis and are coupled to the same bit line 21. For example, each conductive layer 52 partly overlaps with one of the corresponding two memory elements 1 and partly overlaps with the other. Providing the conductive layers 52 eliminates the necessity of the via plugs 27 to extend in the xy-plane over corresponding pairs of memory elements 1 lining up along the y-axis. For example, each via plug 27 extends from the center along the y-axis of the corresponding bit line 21 to both sides along the y-axis by substantially the same distance, and has the y-axis length shorter than the y-axis length of a via plug 27 in the example of FIGS. 20 to 24. Providing the conductive layers 52 can reduce the y-axis length of the via plugs 27, which in turn can decrease a possibility that a via plug 27 unintentionally comes into contact with a bit line 21 which should not be coupled with that via plug 27.

Figure 33:
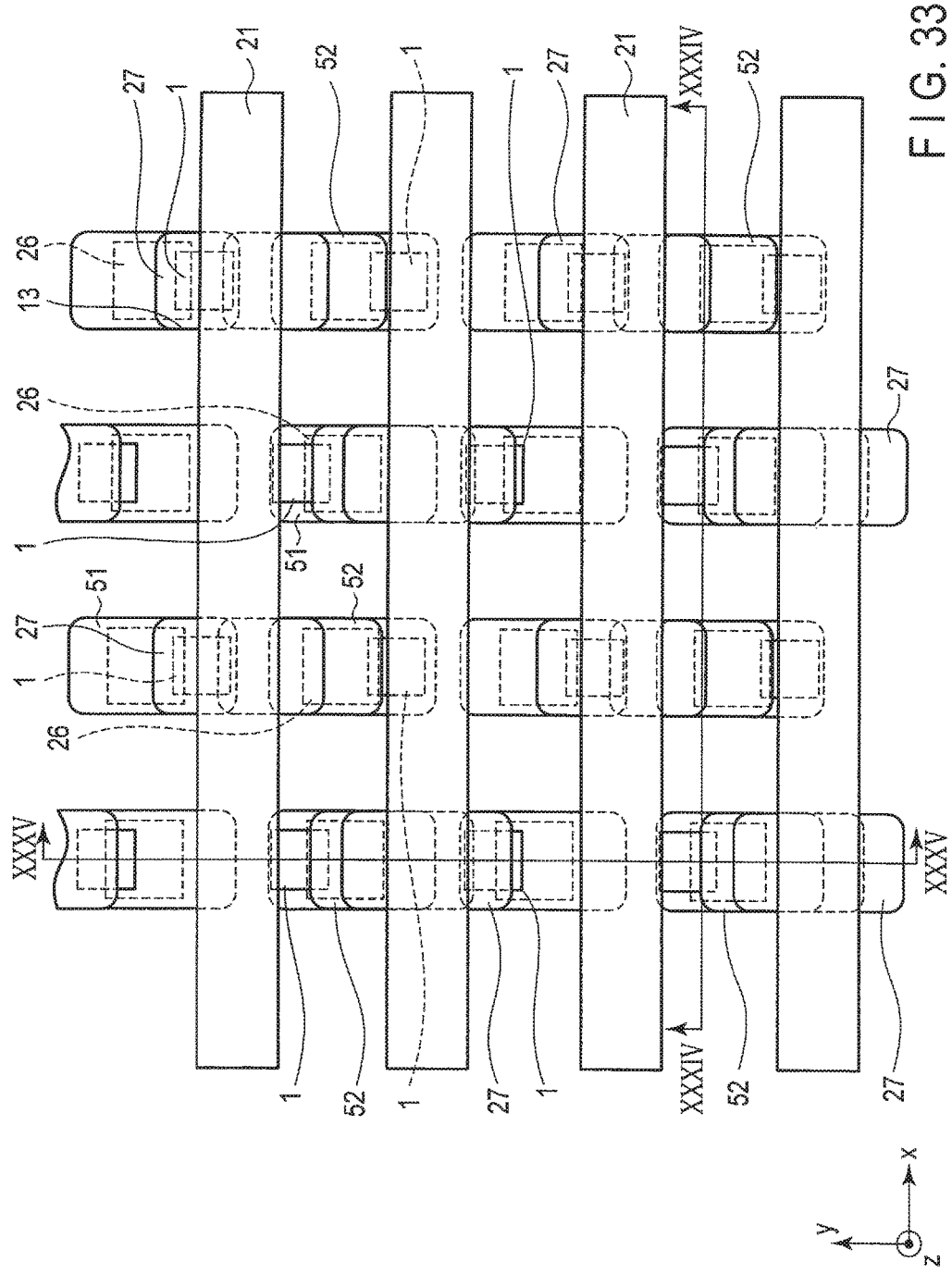
FIG. 33 illustrates a view of part of a memory device of a fourth example of the third embodiment seen from above.
Figure 35:
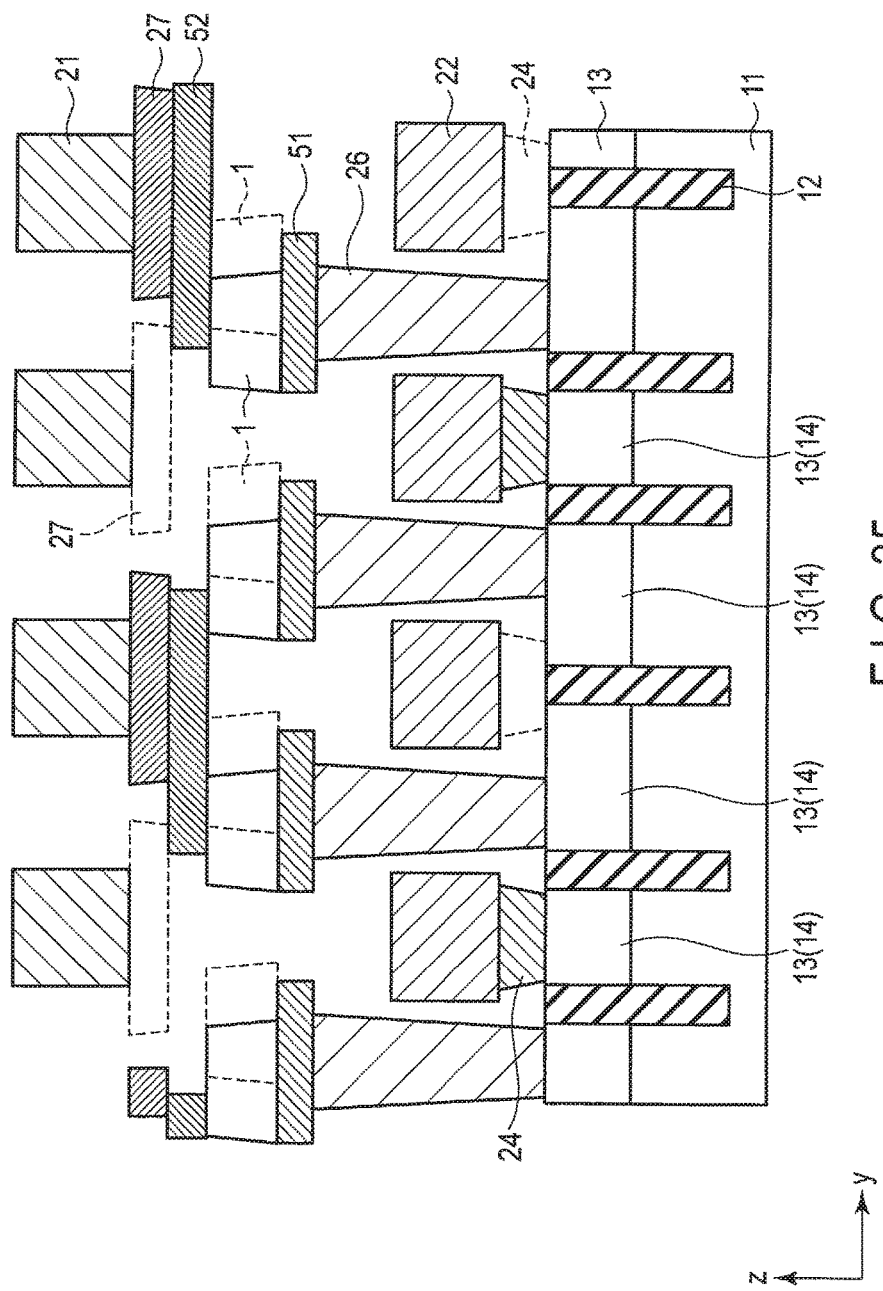

FIG. 33 illustrates a view of part of a memory device of a fourth example of the third embodiment seen from above, and illustrates contact plugs 26, bit lines 21 and components therebetween. FIGS. 34 and 35 illustrate the views along the XXXIV-XXXIV line and XXXV-XXXV line of FIG. 33, respectively. The memory device of the fourth example corresponds to the combination of the second and third examples, and specifically includes both conductive layers 51 and 52. According to the fourth example, the advantages of both second and third examples can be obtained.

Figure 36:
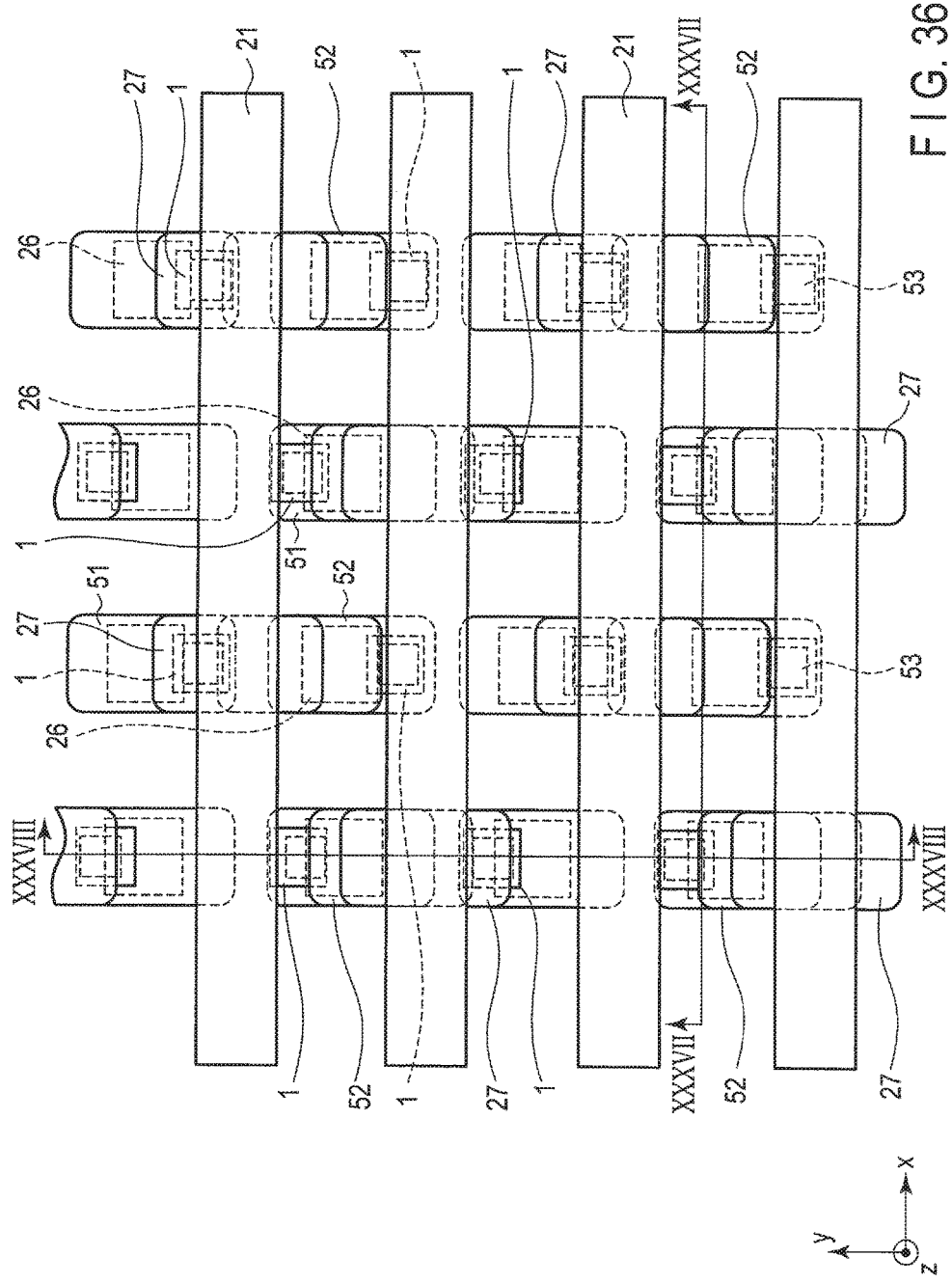
FIG. 36 illustrates a view of part of a memory device of a fifth example of the third embodiment seen from above.
Figure 37:
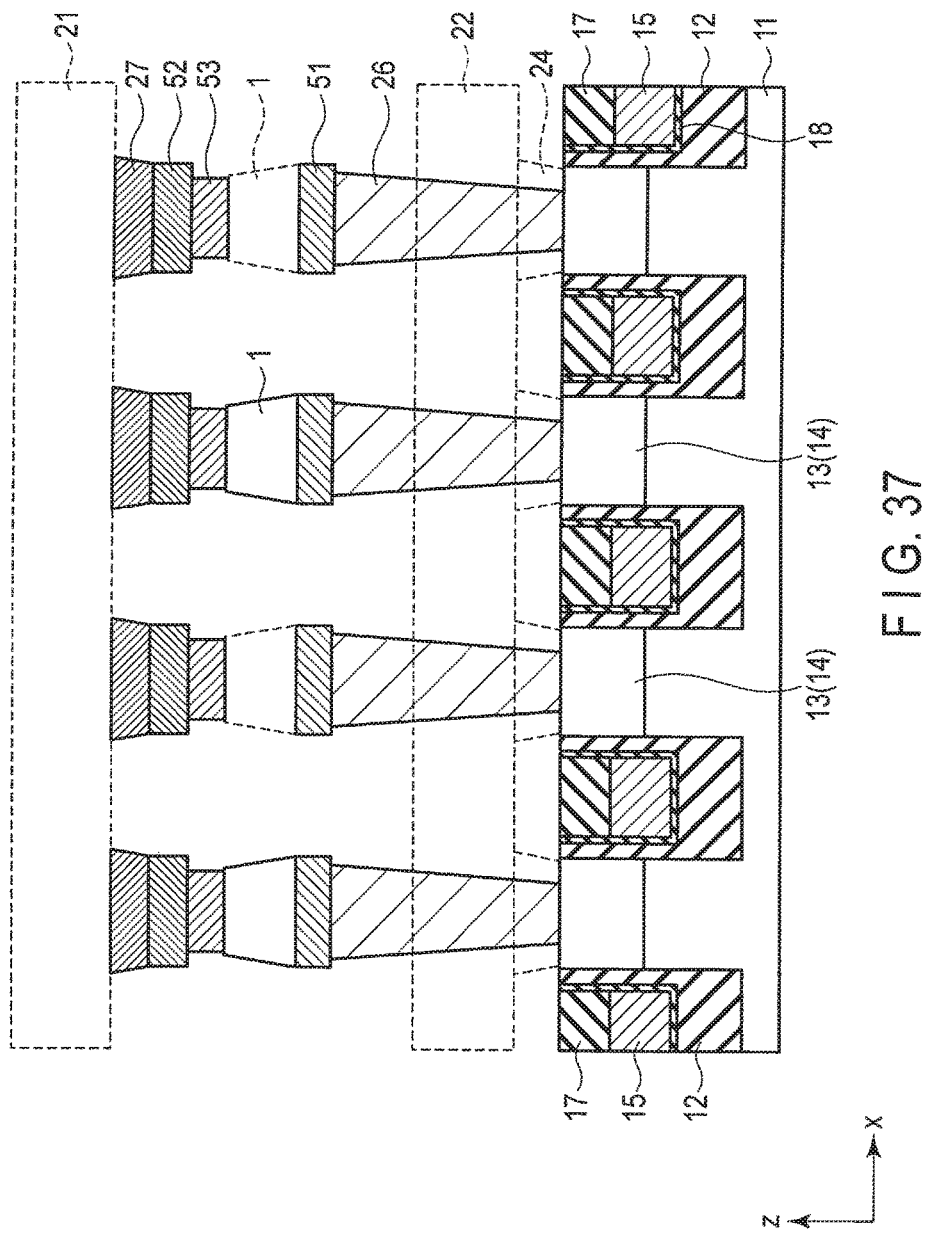
FIGS. 37 and 38 illustrate the views along the XXXVII-XXXVII line and the XXXVIII-XXXVIII line of FIG. 36, respectively.
Figure 38:
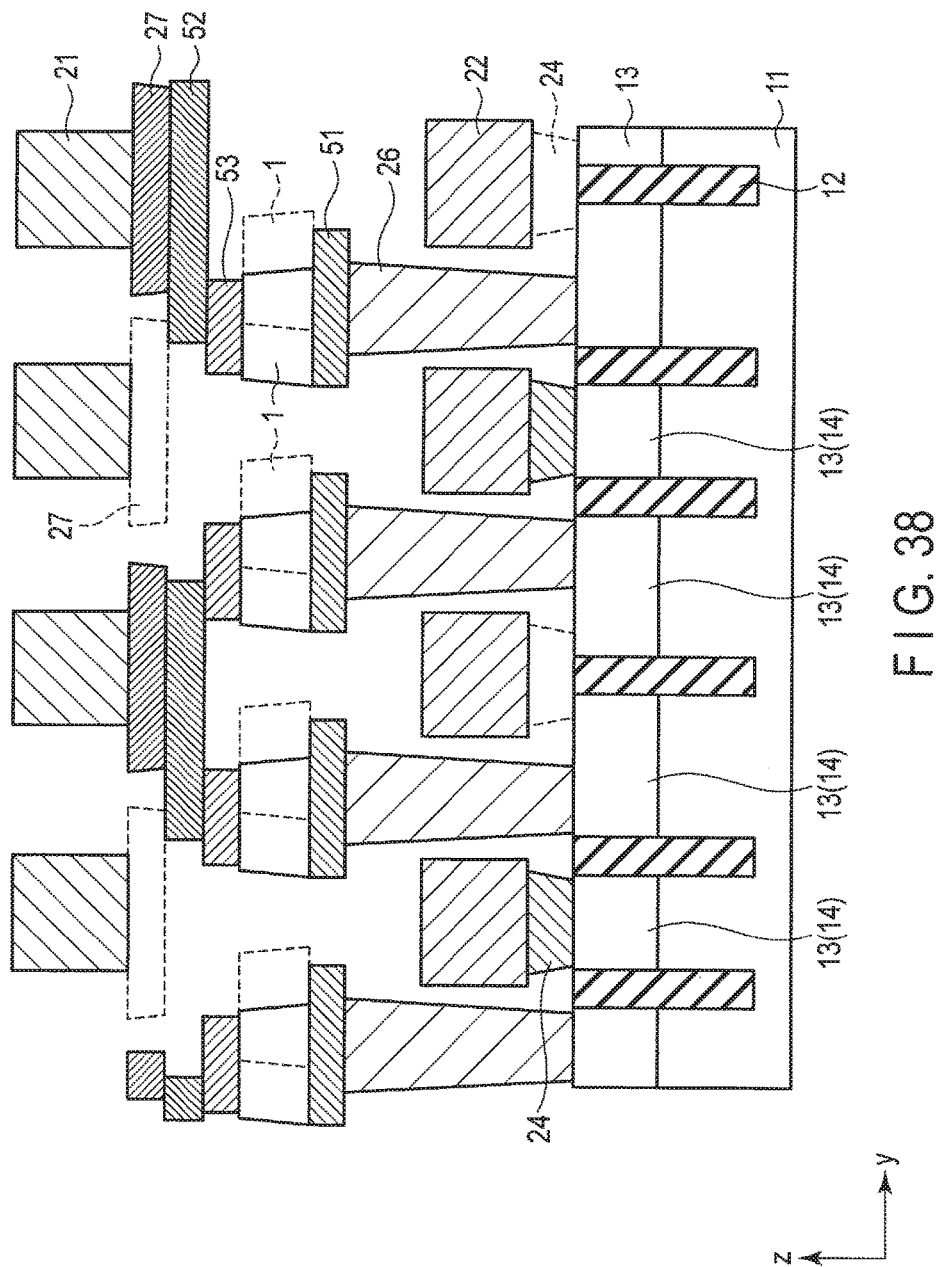

FIG. 36 illustrates a view of part of a memory device of a fifth example of the third embodiment seen from above, and illustrates contact plugs 26, bit lines 21 and components therebetween. FIGS. 37 and 38 illustrate the views along the XXXVII-XXXVII line and XXXVIII-XXXVIII line of FIG. 36, respectively. The memory device of the fifth example includes an additional layer in addition to the components, arrangement and connections in the fourth embodiment. Specifically, the memory device of the fifth example includes the conductive layers 53 between the memory elements 1 and the conductive layers 52. The conductive layers 53 have substantially the same sizes in the xy-plane as the sizes of the tops of the memory elements 1, for example. According to the fifth example, the advantages of both second and third examples can be obtained. Furthermore, according to the fifth example, the tops of the memory elements 1 can be protected from being exposed in a particular process in manufacturing of the memory device. Specifically, for example, holes for the conductive layers 52 are etched in an insulator in order to form the conductive layers 52. This etching is prevented from unintentionally reaching the memory elements 1. The conductive layers 53 can be used in combination of either the conductive layers 51 or conductive layers 52 instead of both conductive layers 51 and 52, which is the case of the fifth example. Specifically, any combination of the conductive layers 51, 52, and 53 is possible.

Fourth Embodiment

The fourth embodiment is based on the arrangement of the memory elements 1 located at the vertexes and centers of right hexagons as in the first embodiment. The fourth embodiment also relates to a structure in which the direction of the arrangement of the memory elements 1 of the third embodiment is rotated in the xy-plane by 90 degrees.

Figure 42:
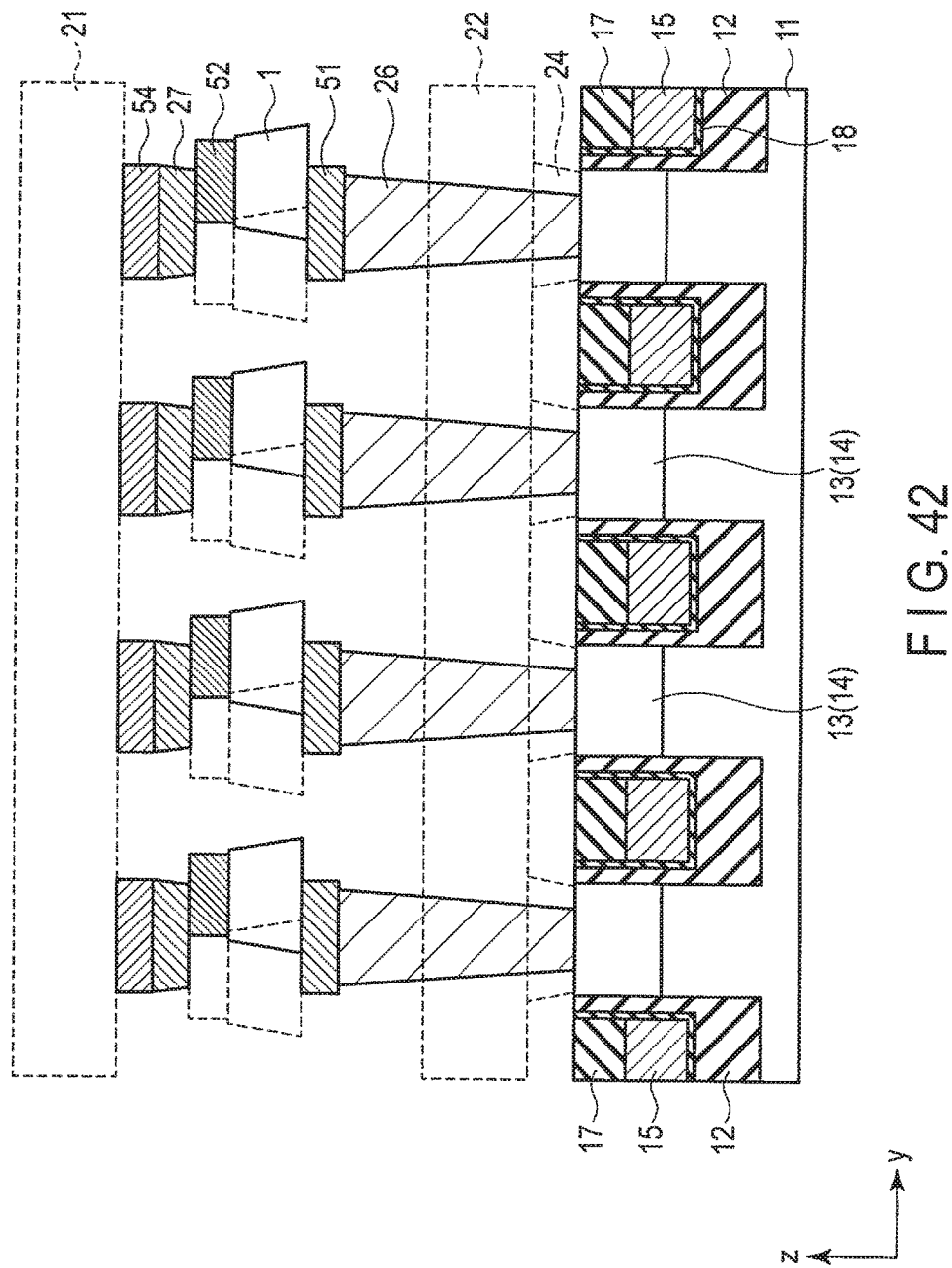

FIGS. 39 to 41 illustrate views of part of a memory device of a first example of the fourth embodiment seen from above. The arrangement of the memory elements 1 of FIGS. 39 to 41 is rotated from that of FIGS. 2 and 5 as in FIG. 10, etc. FIG. 39 illustrates components in layers including the lowest layer (level) along the z-axis, and illustrates the surface of substrate 11, contact plugs 24 and components therebetween. FIG. 40 mainly illustrates components in layers higher than FIG. 39, and illustrates the surface of substrate 11, memory elements 1, and components therebetween. FIG. 41 mainly illustrates components in layers higher than FIG. 40, and illustrates source lines 22, bit lines and components therebetween. FIGS. 42 and 43 illustrate the views along the XLII-XLII line and XLIII-XLIII line of FIGS. 39 to 41, respectively.

The memory elements 1 are arranged in a direction rotated from the arrangement of the memory elements 1 of FIGS. 2 and 4 by 90 degrees above the substrate 11 along the z-axis. Therefore, the memory elements 1 line up along the y-axis, and are arranged in columns.

The gate electrodes 15 extend along the x-axis, line up along the y-axis with an interval, and extend between the memory element rows. The gate electrodes 15 are provided in the element isolation insulators 12 in the surface of the substrate 11 with the gate insulators 18 therebetween, and are covered at the tops with the cap insulators 17 as in the third embodiment.

The source lines 22 (22_1 and 22_2) are located above the substrate 11 along the z-axis, extend along the y-axis, line up along the x-axis with an interval, and extend between the memory element columns. The source lines 22 include source lines 22_1 and 22_2, which are arranged alternately along the x-axis.

The active areas 13 are independent from each other, are divided and surrounded by the element isolation insulators 12, and have rectangular shapes in the xy-plane. The active areas 13 extend, in the xy-plane, in a direction which connects areas near two particular memory elements 1. The details are as follows. Among the memory elements 1 at vertexes of a right hexagon, two memory elements 1 on a hexagon's diagonal line which does not extend along the y-axis or pass the center, such as memory elements 1_21 and 1_23, make a pair. In a direction extending over areas beneath the proximity of such a pair of memory elements 1 along the z-axis, active areas 13 extend. Therefore, the active areas 13 are not parallel with the x-axis or the y-axis.

The active areas 13 (13_1 and 13_2) line up along the y-axis to make columns. In each of the columns of active areas (active area columns), the active areas 13 have a regular interval, and face each other at their ends in a direction along the x-axis, for example. Active areas 13 in a particular active area column differ from active areas 13 in an adjacent active area column in position or coordinate (of the centers thereof) on the y-axis.

The active areas 13 include active areas 13_1 and 13_2. The active areas 13_1 line up along the source lines 22_1 at an interval. Each active area 13_1 extends in the xy-plane over areas beneath the proximity of two particular memory elements 1 along the z-axis. The details are as follows. Attention is paid to a first right hexagon of memory elements, and a second right hexagon of memory elements which shares an edge as its upper right edge with the lower left edge of the first right hexagon. The memory element 1 at the top of the first right hexagon along the y-axis (a memory element 1_21) and the memory element 1 at the center of the second right hexagon (a memory element 1_22) make a first pair. Each active area 13_1 extends over respective areas beneath the proximity of a first pair of memory elements 1 (first memory pair) along the z-axis.

Each active area 13_1 extends beyond two adjacent gate electrodes 15, and is penetrated through by those two gate electrodes 15 to be divided into three sections. In the sections of each active area 13_1, source/drain areas 14 are formed. Each gate electrode 15, in the section between a pair of sources/drain areas 14 at both sides, makes a cell transistor with these source/drain areas 14. The middle of the sections of each active area 13_1 is coupled to the bottom of a contact plug 24_1. The contact plugs 24_1 are coupled at the tops to the source lines 22_1. The source/drain areas 14 of the two remaining sections of each active area 13_1 are coupled to respective bottoms of the memory elements 1_21 and 1_22 via respective sets of a contact plug 26 and a conductive layer 51. Each conductive layer 51 overlaps in the xy-plane with a contact plug 26 and a memory element 1_21 or 1_22.

The active areas 13_2 line up along the source lines 22_2 at an interval. Each active area 13_2 extends in the xy-plane over areas beneath the proximity of two particular memory elements 1 along the z-axis. The details are as follows. Among the memory elements 1 of a single right hexagon vertex, two memory elements 1 at vertexes of the hexagon and on a hexagon's diagonal line which is not parallel with the y-axis (memory elements 1_23 and 1_24) make a second pair. Each active area 13_2 extends over respective areas beneath the proximity of a second pair of memory elements 1 (second memory pair) along the z-axis.

Each active area 13_2 extends beyond two adjacent gate electrodes 15, and is penetrated through by those two gate electrodes 15 to be divided into three sections. In the sections of each active area 13_2, source/drain areas 14 are formed. Each gate electrode 15, in the section between a pair of sources/drain areas 14 at both sides, makes a cell transistor with these source/drain areas 14. The middle of the sections of each active area 13_2 is coupled to the bottom of a contact plug 24_2. The contact plugs 24_2 are coupled at the tops to the source lines 22_2. The source/drain areas 14 of the two remaining sections of each active area 13_2 are coupled to respective bottoms of the memory elements 1_23 and 1_24 via the respective sets of a contact plug 26 and a conductive layer 51. Each conductive layer 51 overlaps in the xy-plane with a contact plug 26 and a memory element 1_23 or 1_24.

Resulting from the arrangement of the active areas 13_1 and 13_2 described above, the active areas 13_1 and 13_2 differ in position (or coordinate) on the y-axis. Specifically, the upper and lower ends of each active area 13_1 and the upper and lower ends of an active area 13_2 are not in line, respectively.

The memory elements 1 are divided into a set of the first memory element pairs and a set of the second memory element pairs as described above. As a result, in each memory element column, the memory elements 1 belonging to the first memory element pairs, and the memory elements 1 belonging to the second memory element pairs are located alternately.

The memory elements 1 are coupled at the tops to the conductive layers 52. In particular, the memory elements 1_21, 1_22, 1_23, and 1_24 are coupled at the bottoms to the bottoms of conductive layers 52_21, 52_22, 52_23, and 52_24, respectively. The conductive layers 52 have, in the xy-plane, shapes similar to those of the memory elements 1, and, for example, have plane shapes smaller than those of the memory elements 1. The tops of the conductive layers 52 are coupled to the bottoms of the via plugs 27.

Each via plug 27 is coupled to the bottom of a bit line 21. The bit lines 21 extend along the y-axis, and are arranged in columns in the xy plane. The bit lines 21 are located in a layer or level higher than the source line 22 along the z-axis. The bit lines 21 include bit lines 21_1 and 21_2. The bit lines 21_1 are located above the source lines 22_1 along the z-axis, i.e., overlap with the source lines 22_1 in the xy plane. The bit lines 21_2 are located above the source lines 22_2 along the z-axis, i.e., overlap with the source lines 22_2 in the xy plane.

Each first memory element pairs (1_21 and 1_22) is electrically coupled to a bit line 21_1 above, along the z-axis, the corresponding source line 22_1 (or, the source line 22_1 to which that first memory element pair is electrically coupled). To this end, two via plugs 27 (27_21 and 27_21) for the first memory element pair have elliptical shapes which spread along the x-axis in the xy-plane, and the elliptical shapes overlaps in the xy-plane with a conductive layer 52_21 or 52_22 and a bit line 21_21. Specifically, each via plug 27_21 electrically coupled to a memory element 1_21 overlaps in the xy-plane in the upper right part with a conductive layer 52_21 for that memory element 1_21, and in the central part with a bit line 21_1. Each via plug 27_22 electrically coupled to a memory element 1_22 overlaps in the xy-plane in the lower left part with a conductive layer 52_22 for that memory element 1_22, and in the central part with the bit line 21_1. The via plugs 27_21 and 27_22 are electrically coupled to the bit lines 21_1 through conductive layers 54. Specifically, each via plug 27_21 and each via plug 27_22 are coupled at the top to a conductive layer 54, which is coupled at the top to a bit line 21_1.

Each via plug 27_21 is also shared with a memory element 1 of another first memory element pair. Specifically, a via plug 27_21 electrically coupled to the memory element 1_21 of a particular first memory element pair is the same as a via plug 27_22 electrically coupled to the memory element 1_22 of another first memory element pair. Specifically, each via plug 27_21 is shared by a memory element 1_21 and a memory element 1_22 adjacent that memory element 1_21 with the source line 22_1 therebetween. To this end, each via plug 27_21 overlaps in the xy-plane with a memory element 1_21 of one of two first memory element pairs, and with a memory element 1_22 of the other of the pairs.

Each second memory element pair (1_23, 1_24) is electrically coupled to a bit line 21_2 above, along the z-axis, the corresponding source line 22_2 (or, the source line 22_2 to which that second memory element pair is electrically coupled). To this end, two via plugs 27 (27_23 and 27_24) for that second memory element pair have elliptical shapes which spread along the x-axis in the xy-plane, and the elliptical shapes overlap in the xy-plane with a conductive layer 52_23 or 52-24 and a bit line 21_22. Specifically, each via plug 27_23 electrically coupled to a memory element 1_23 overlaps in the xy-plane in the lower right part with a conductive layer 52_23 for that memory element 1_23, and in the central part with a bit line 21_2. Each via plug 27_24 electrically coupled to a memory element 1_24 overlaps in the xy-plane in the upper left part with a conductive layer 52_24 for that memory element 1_24, and in the central part with the bit line 21_2. The via plugs 27_23 and 27_24 are electrically coupled to the bit lines 21_2 through conductive layers 54. Specifically, each via plug 27_23 and each via plug 27_24 are coupled at the top to a conductive layer 54, which is coupled at the top to a bit line 21_2.

Each via plug 27_23 is also shared with a memory element 1 of another second memory element pair. Specifically, a via plug 27_23 electrically coupled to the memory element 1_23 of a particular second memory element pair is the same as a via plug 27_24 electrically coupled to the memory element 1_24 of another second memory element pair. Specifically, each via plug 27_23 is shared by a memory element 1_23 and a memory element 1_24 adjacent that memory element 1_23 with the source line 22_2 therebetween. To this end, each via plug 27_23 overlaps in the xy-plane with a memory element 1_23 of one of two second memory element pairs, and with a memory element 1_24 of the other of the pairs.

Resulting from the arrangement of the via plugs 27_21 and 27_22 described above, the via plugs 27_21 and the via plugs 27_22 are alternately located along the y-axis, via plugs 27_21 line up along the x-axis, and the via plugs 27_22 line up along the x-axis. The via plugs 27_21 and 27_22 which line up along a particular bit line 21 are coupled at the tops to the bottom of that bit line 21.

Figure 44:
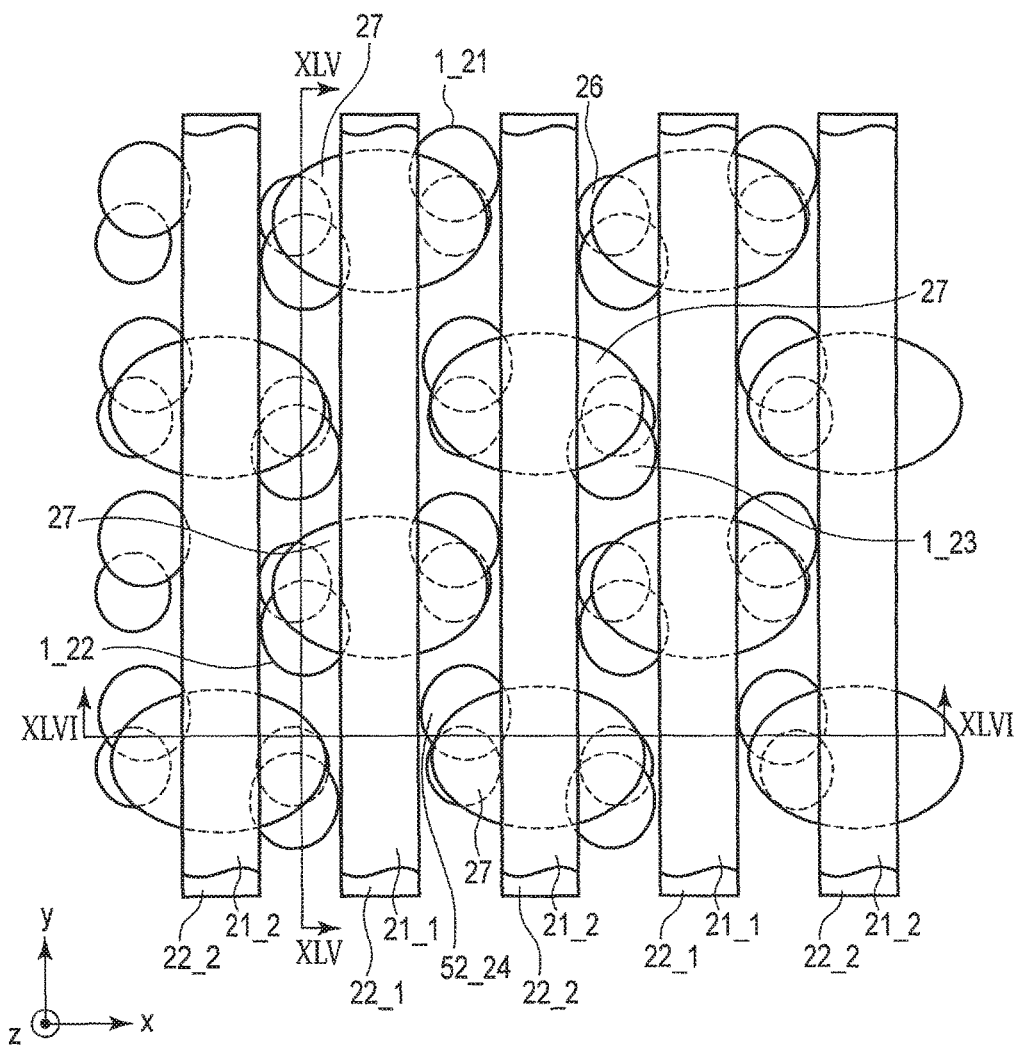
FIG. 44 illustrates a view of part of a memory device of a second example of the fourth embodiment seen from above.
Figure 45:
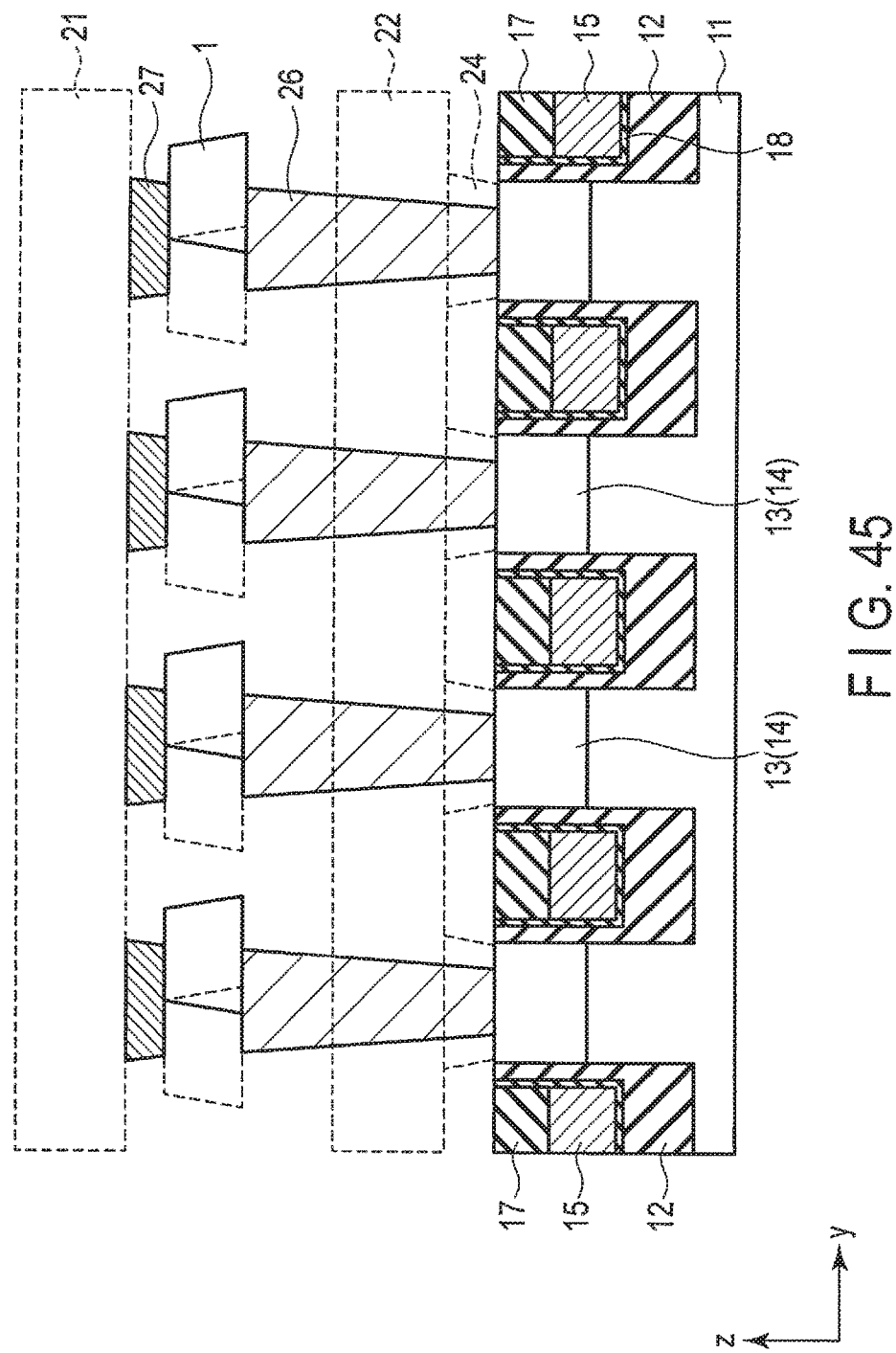
FIGS. 45 and 46 illustrate the views along the XLV-XLV line and the XLVI-XLVI line of FIG. 44, respectively.
Figure 46:
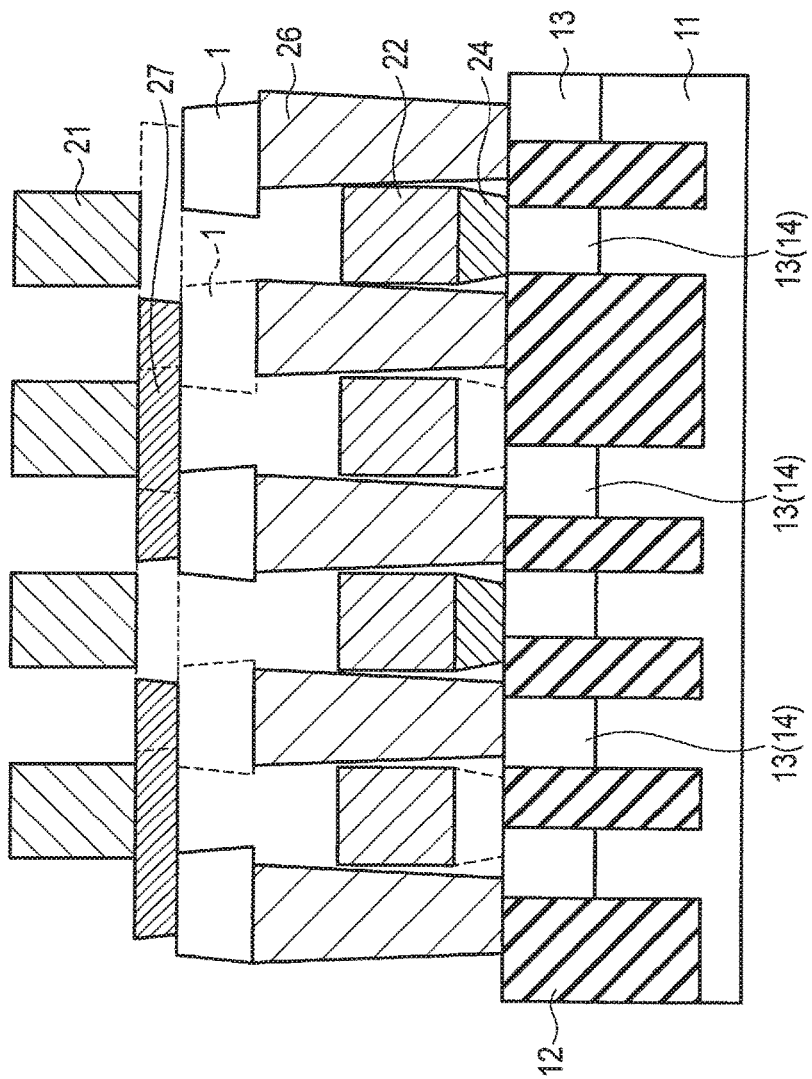

The conductive layers 51, 52 and/or 54 may or may not be provided. FIGS. 44 to 46 illustrate an example which does not include the conductive layers 51, 52 or 54. FIG. 44 illustrates a view of part of a memory device of a second example of the fourth embodiment seen from above. FIG. 44 does not illustrate some components for the purpose of clarifying the figure. FIGS. 45 and 46 illustrate the views along the XLV-XLV line and XLVI-XLVI line of FIG. 44, respectively.

As illustrated in FIGS. 44 to 46, the contact plugs 26 are coupled at the tops to the bottoms of the memory elements 1. The memory elements 1 are coupled at the tops to the bottoms of the via plugs 27.

As described above, according to the fourth embodiment, the memory elements 1 are arranged to be located at the vertexes and centers of the right hexagons, and as a result all adjacent memory elements 1 have the same interval, as in the first embodiment. For this reason, the same advantages as the first embodiment can be obtained. In addition, the active areas 13, the bit lines 21, the source lines 22, the contact plugs 24 and 26, and the via plugs 27 of the fourth embodiment also allow for connections of the active areas 13, the memory elements 1, the bit lines 21, and the source lines 22.

Fifth Embodiment

The fifth embodiment is based on the arrangement of the memory elements 1 located at the vertexes and centers of right hexagons as in the first embodiment.

Figure 47:
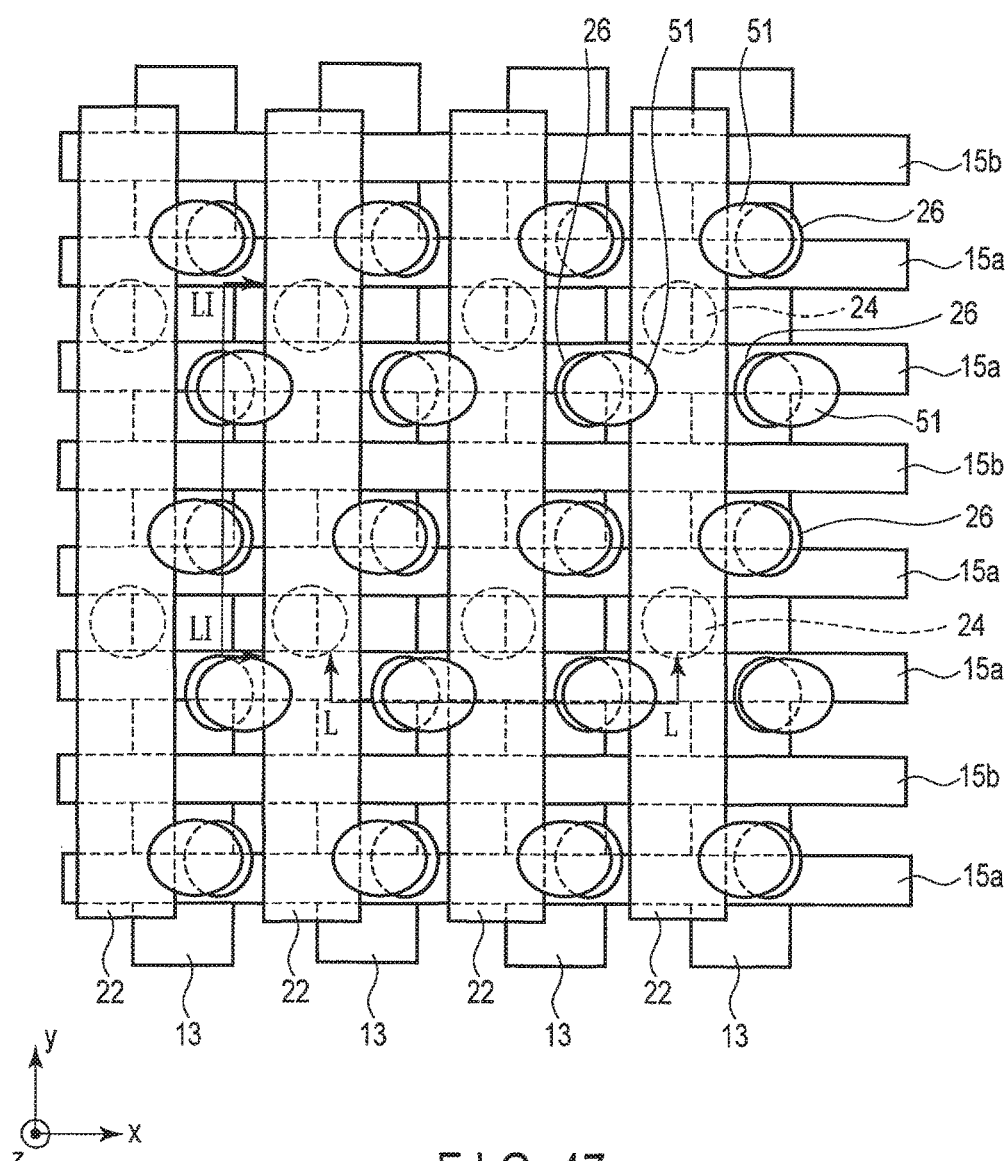
Figure 48:
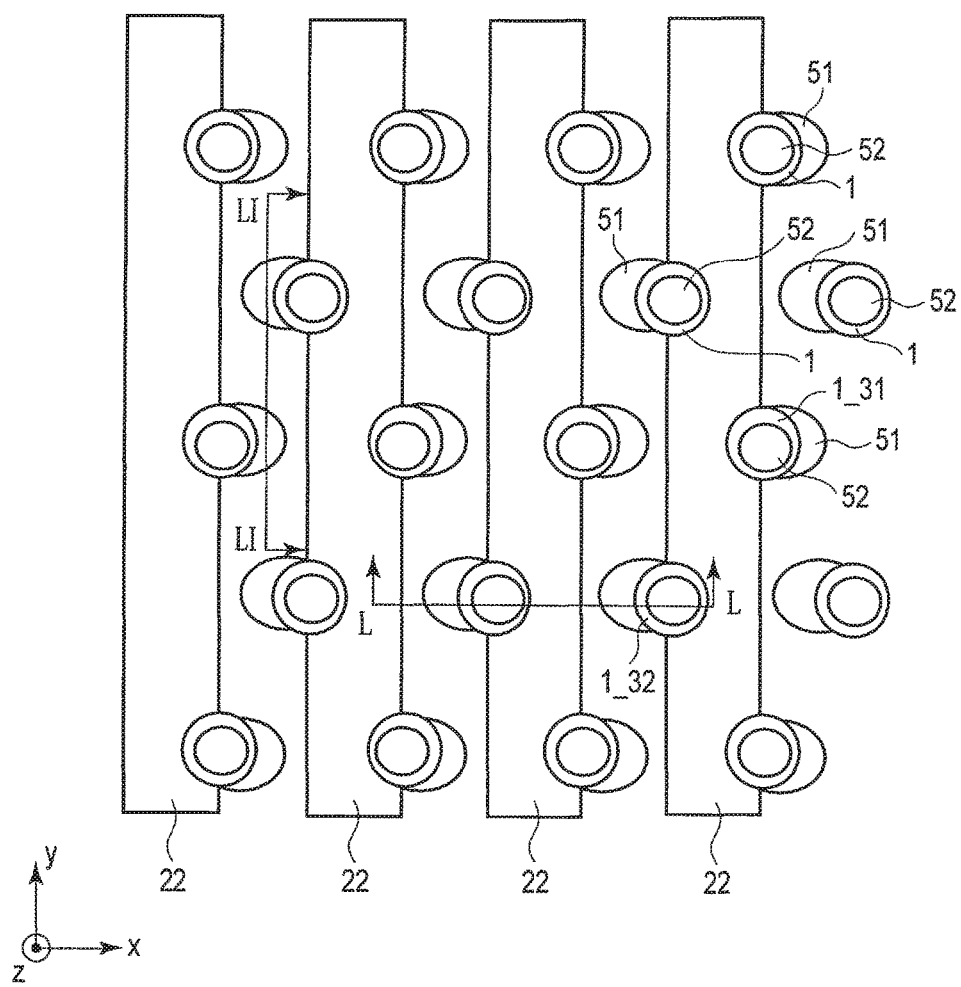
Figure 50:
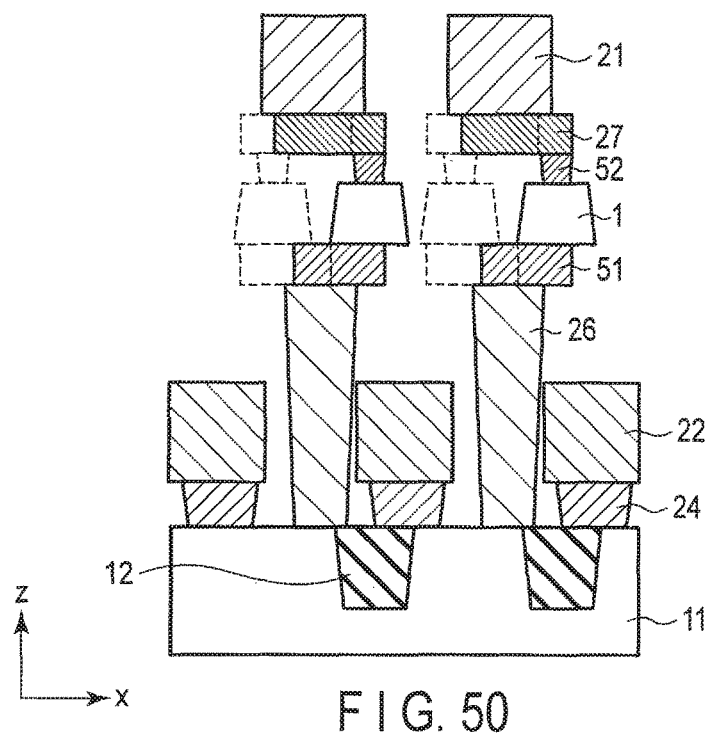
FIGS. 50 and 51 illustrate the views along the L-L line and the LI-LI line of FIGS. 47 to 49, respectively.
Figure 51:
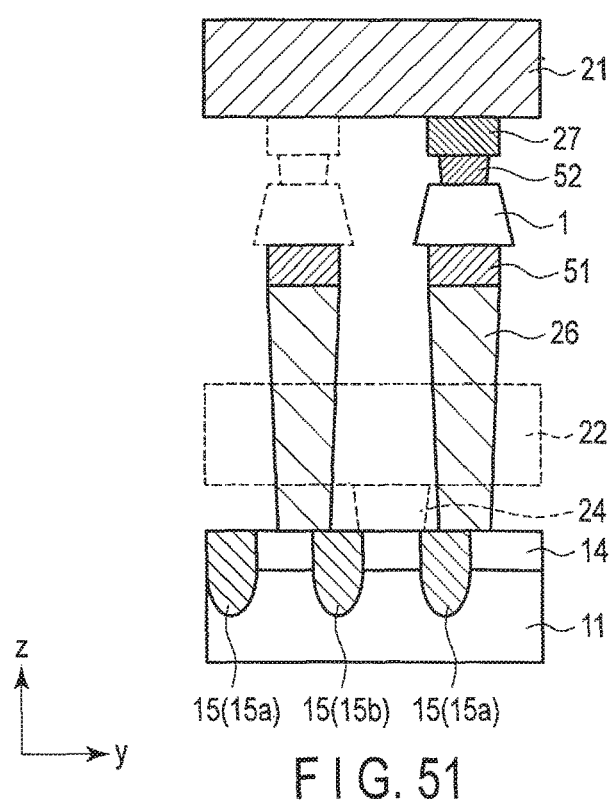

FIGS. 47 to 49 illustrate views of part of a memory device of a first example of the fifth embodiment seen from above. The direction of the arrangement of the memory elements 1 of FIGS. 47 to 49 is the same as that of FIGS. 2 and 5. FIG. 47 illustrates components in layers including the lowest layer (level) along the z-axis, and illustrates the surface of substrate 11, conductive layers 51 and components therebetween. FIG. 48 mainly illustrates components in layers higher than FIG. 47, and illustrates source lines 22, conductive layers 52 and components therebetween. FIG. 49 mainly illustrates components in layers higher than FIG. 48, and illustrates source lines 22, bit lines 21 and components therebetween. FIGS. 50 and 51 illustrate the views along the L-L line and LI-LI line of FIGS. 47 to 49, respectively.

The memory elements 1 are arranged in the same direction as that of FIGS. 2 and 4 above the substrate along the z-axis. Therefore, the memory elements 1 line up along the x-axis, and are arranged in rows.

The active areas 13 are independent from each other, are divided and surrounded by the element isolation insulators 12, and have rectangular shapes in the xy-plane. The active areas 13 extend along the y-axis, and line up along the x-axis at an interval. Each active area 13 is located between two memory element columns, and partially overlaps in the xy-plane with those two memory element columns.

The gate electrodes 15 extend along the x-axis, line up along the y-axis at an interval, include gate electrodes 15*a* and 15*b*, and are buried in trenches in the surface of the substrate 11 with gate insulators on the surfaces of the trenches therebetween. The gate electrodes 15 divide the active areas 13. The sections of each active area 13 divided by the gate electrodes 15 include in the surfaces the source/drain areas 14. Each gate electrode 15, in the section between a pair of source/drain areas 14 at both sides, makes a cell transistor with these source/drain areas 14. Each gate electrode 15*b* is located between two adjacent pairs of gate electrodes, is fixed to a particular potential, electrically isolates gate electrodes 15 at its both sides, and does not make a cell transistor.

Each active area 13 is coupled to the bottom of a contact plug 24 between each pair of gate electrodes 15*a*. Each contact plug 24 is coupled at the bottom to a source/drain area 14, and at the top to the bottom of a source line 22. The source lines 22 extend along the y-axis, line up along the x-axis with an interval, and extend between the memory element columns. Each source line 22 overlaps at each of the edges which extend along the y-axis with a single memory element column. In order to couple the source lines 22 and the active areas 13 arranged this way, each contact plug 24 overlaps in the xy-plane with the corresponding active area 13 and source line 22. For example, in the xy-plane, each contact plug 24 overlaps completely with a source line 22, and overlaps partially with an active area 13. Each active area 13 is coupled to the bottom of a contact plug 26 at the part at the side opposite a source line 22 and a contact plug 24 (for example, at the right-hand side). Each contact plug 26 is located near the intersection of an active area 13 and a gate electrode 15*a*, is located between source lines 22, and is coupled at the bottom to a source/drain area 14.

The contact plugs 26 are coupled at the tops to the bottoms of the conductive layers 51. The conductive layers 51 are coupled at the tops to the bottoms of the memory elements 1. In order to couple the contact plugs 26 and the memory elements 1, the conductive layers 51 overlap in the xy-plane with the contact plugs 26 and the memory elements 1, and spread along the x-axis. In particular, conductive layers 51 on the right-hand side of each source line 22 are coupled at the right parts to respective contact plugs 26, and at the left parts to respective memory elements 1. In contrast, conductive layers 51 on the left-hand side of each source line 22 are coupled at the left parts to respective contact plugs 26, and at the right parts to respective memory elements 1.

The memory elements 1 are coupled at the tops to the bottoms of the conductive layers 52. The conductive layers 52 are coupled at the tops to the bottoms of the via plugs 27. Each via plug 27 is coupled at the top to the bottom of a bit line 21. The bit lines 21 extend along the y-axis and line up along the x-axis at an interval. In the xy-plane, each bit line 21 is located between two adjacent source lines 22 and overlaps in the parts at the two sides along the y-axis with the source lines 22.

Among the sets of memory element 1 coupled to each source line 22 via the cell transistors, sets of memory elements 1 lining up along the right-hand side of that source line 22 (memory elements 1_31) are electrically coupled to a bit line 21 adjacent that source line 22 at the right-hand side (a bit line 21_31). Similarly, among the sets of memory element 1 coupled to each source line 22 via the cell transistors, sets of memory elements 1 lining up along the left-hand side of that source line 22 (memory elements 1_32) are electrically coupled to a bit line 21 adjacent that source line 22 at the left-hand side (a bit line 21_31). To this end, the via plugs 27 electrically coupled to respective memory elements 1_31 lining up along the right-hand side of the source lines 22 (via plugs 27_31) spread along the x-axis, and overlap at the left parts with the conductive layers 52, and overlap at the right parts with a bit line 21 (21_31). In contrast, the via plugs 27 electrically coupled to respective memory elements 1_32 lining up along the left-hand side of the source lines 22 (via plugs 27_32) spread along the x-axis, and overlap at the right parts with the conductive layers 52, and overlap at the left parts with a bit line 21 (21_32).

Figure 52:
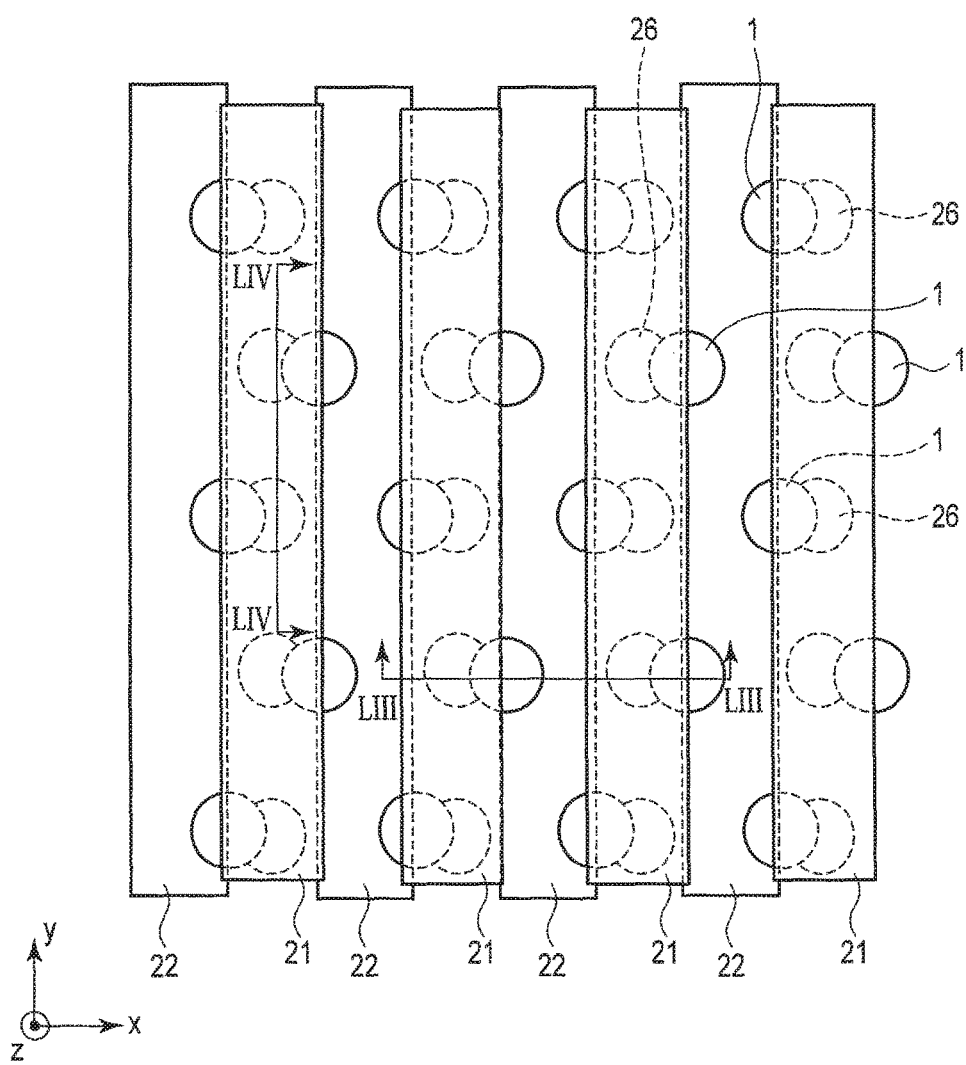
FIG. 52 illustrates a view of part of a memory device of a second example of the fifth embodiment seen from above.
Figure 53:
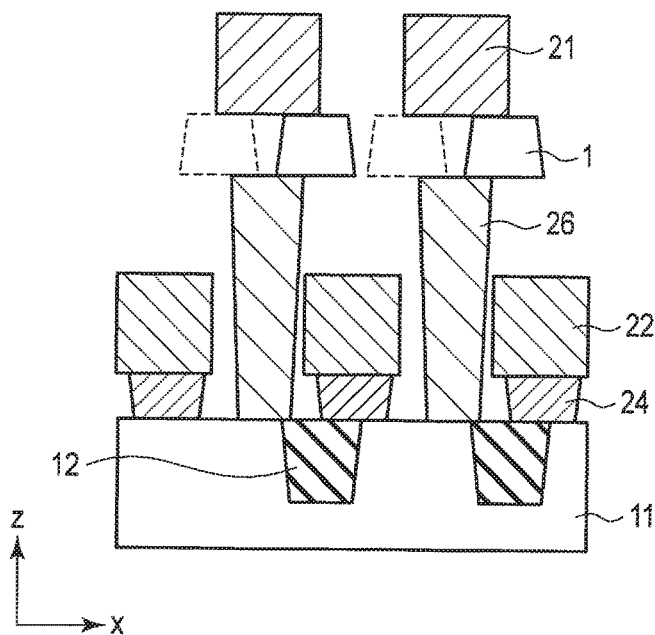
FIGS. 53 and 54 illustrate the views along the LIII-LIII line and the LIV-LIV line of FIG. 52, respectively.
Figure 54:
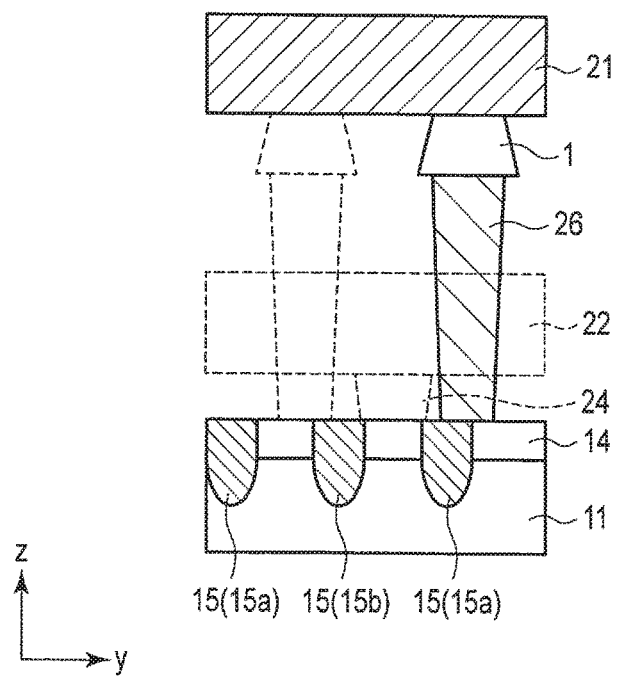

In the first example, the via plugs 27, the conductive layers 51, and/or the conductive layers 52 may or may not be provided. A second example relates to such an example. FIGS. 52 to 54 illustrate an example which does not include the via plugs 27, the conductive layers 51, or the conductive layers 52. FIG. 52 illustrates a view of part of a memory device of the second example of the fifth embodiment seen from above. FIG. 52 does not illustrate some components for the purpose of clarifying the figure. FIGS. 53 and 54 illustrate the views along the LIII-LIII line and LIV-LIV line of FIG. 52, respectively.

As illustrated in FIGS. 52 to 54, the contact plugs 26 are coupled at the tops to the bottoms of the memory elements 1. The memory elements 1 are coupled at the tops to the bottoms of the bit lines 21.

Figure 55:
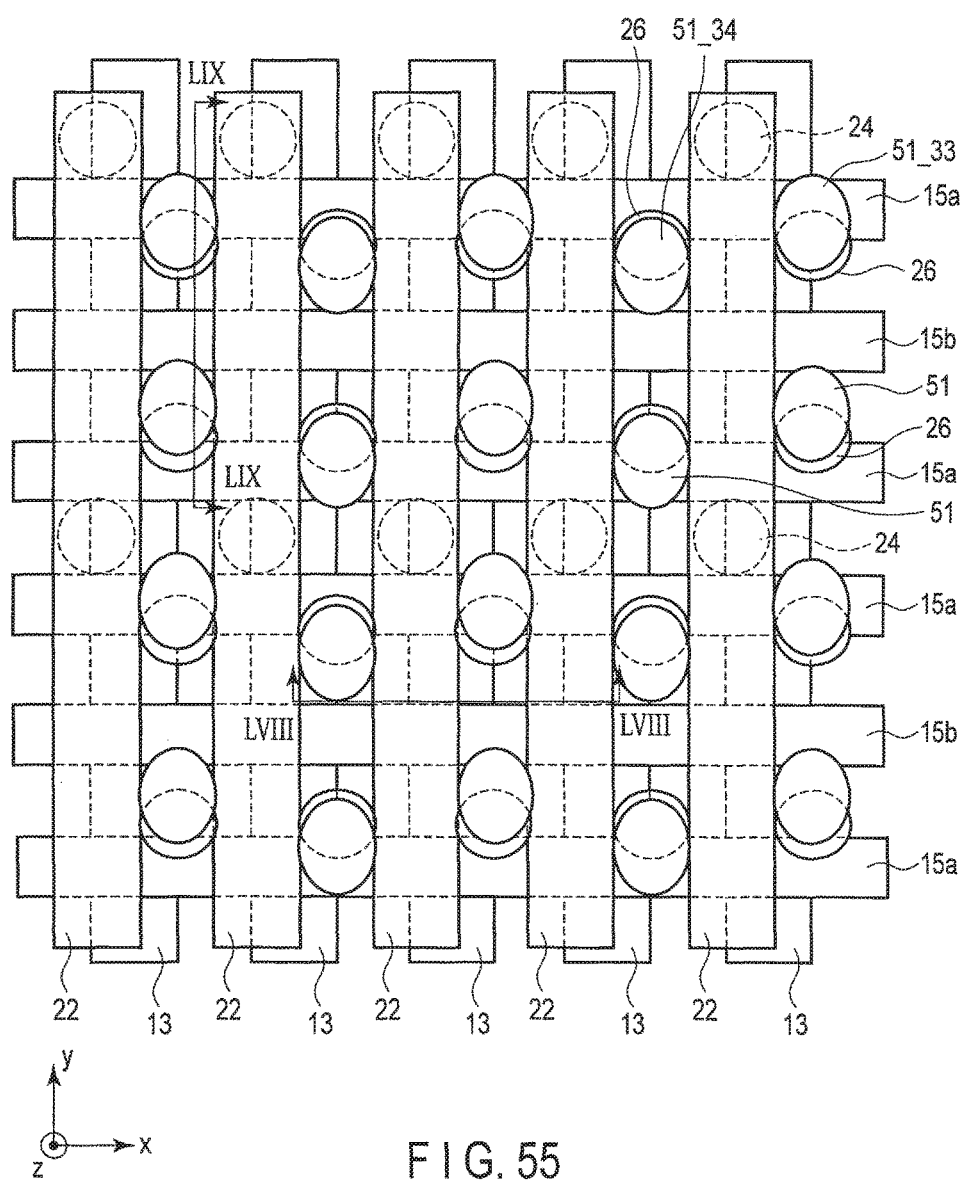
FIGS. 55 to 57 illustrate views of part of a memory device of a third example of the fifth embodiment seen from above.
Figure 56:
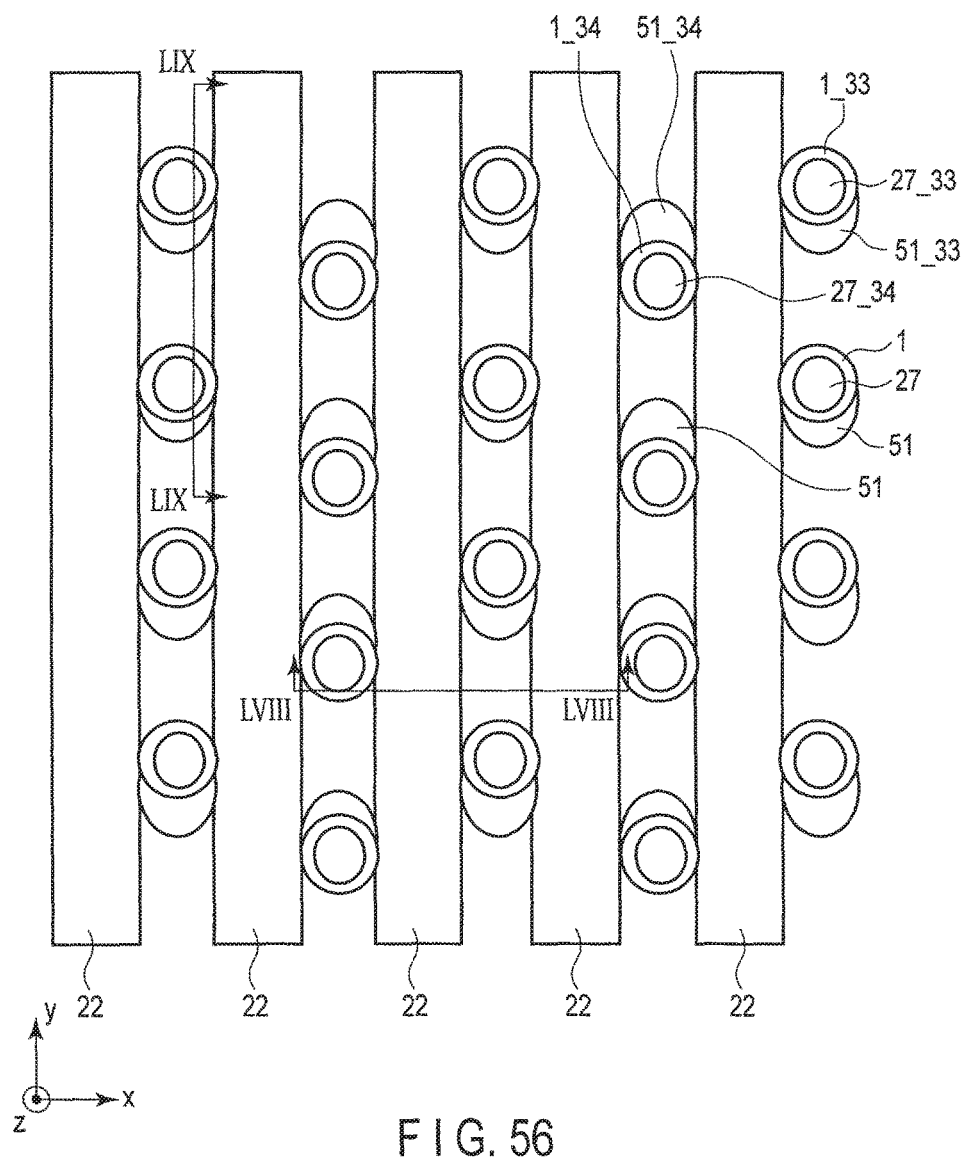
Figure 57:
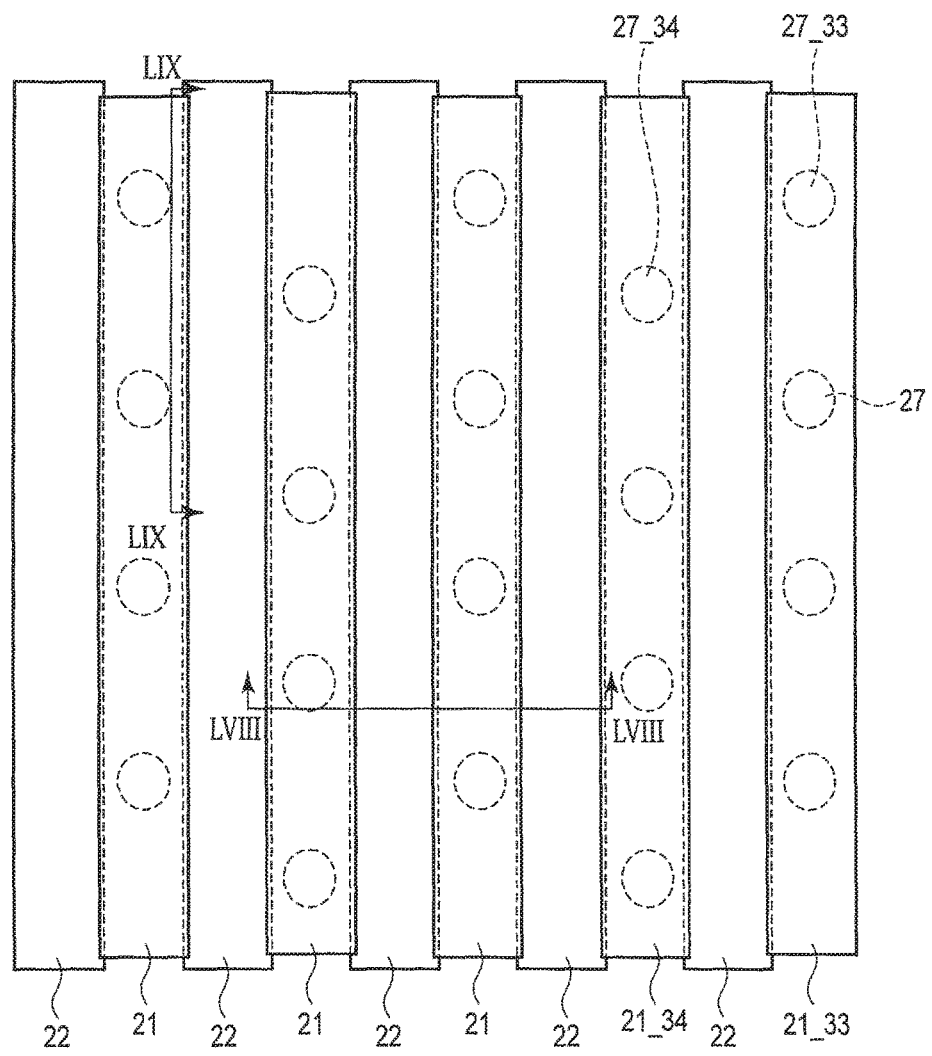
Figure 58:
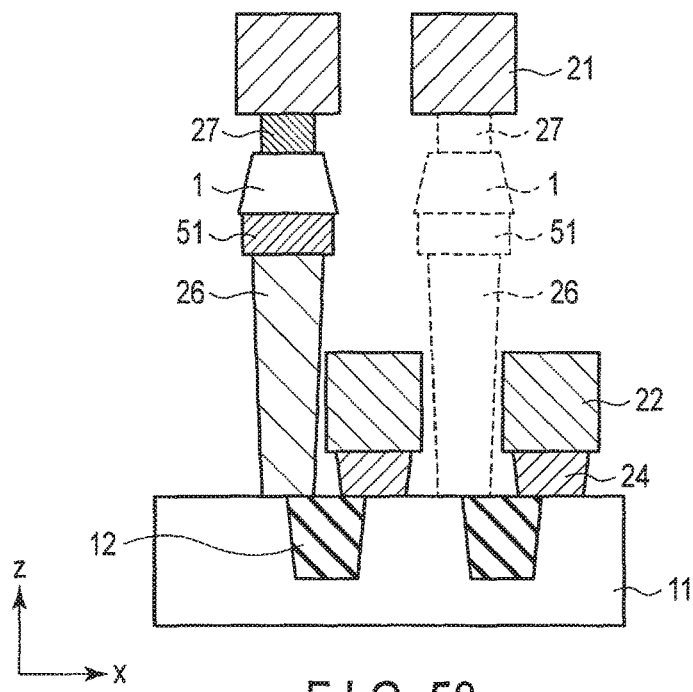
FIGS. 58 and 59 illustrate the views along the LVIII-LVIII line and the LIX-LIX line of FIGS. 55 to 57, respectively.
Figure 59:
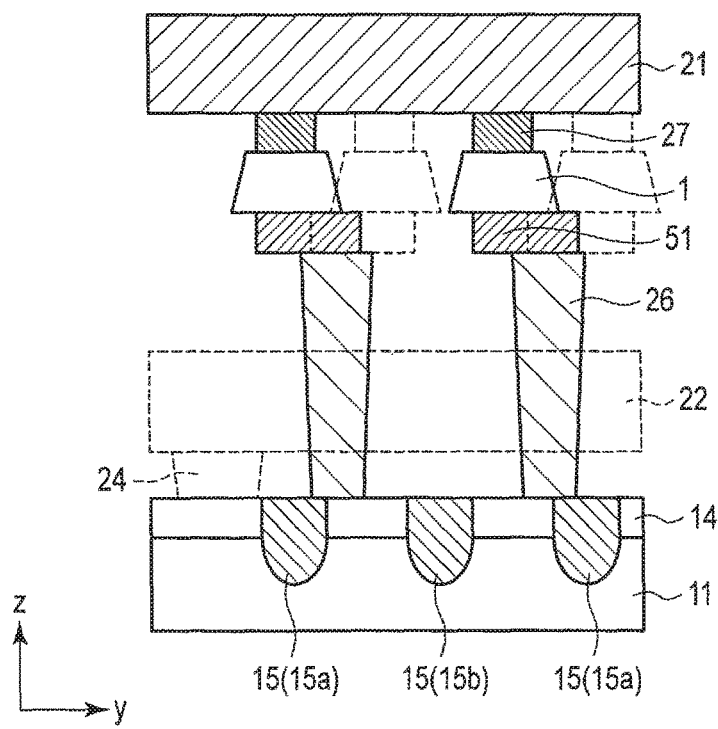

Moreover, the arrangement of the memory elements 1 may have a direction different from that in the first example (FIGS. 47 to 50). A third example relates to such an example. FIGS. 55 to 57 illustrate views of part of a memory device of the third example of the fifth embodiment seen from above. The memory elements 1 of FIGS. 55 to 57 are arranged in a direction rotated from that of FIGS. 2 and 5 and the first example by 90 degrees. FIG. 55 illustrates components in layers including the lowest layer (level) along z-axis, and illustrates the surface of substrate 11, conductive layers 51 and components therebetween. FIG. 56 mainly illustrates components in layers higher than FIG. 55, and illustrates source lines 22, via plugs 27 and components therebetween. FIG. 57 mainly illustrates components in layers higher than FIG. 56, and source lines 22, bit lines 21 and components therebetween. FIGS. 58 and 59 illustrate views along the LVIII-LVIII line and LIX-LIX line of FIGS. 55 to 57, respectively.

The memory elements 1 are arranged in a direction rotated from the arrangement of the memory elements 1 of FIGS. 2 and 4 by 90 degrees above the substrate 11 along the z-axis. Therefore, the memory elements 1 line up along the y-axis, and are arranged in columns.

Based on the memory elements 1 arranged in a direction different from the first example, the third example differs from the first example in features of some components. These different features and associated features will be described. Among two edges of each active area 13 along the y-axis, the edge at the side opposite a source line 22 (for example, right-hand side) overlaps in the xy-plane with a memory element column.

In order to couple the contact plugs 26 and the memory elements 1, the conductive layers 51 of the third example overlap in the xy-plane with the contact plugs 26 and the memory elements 1, and spread along the y-axis. In particular, among two sides opposing with a line along the y-axis therebetween, conductive layers 51 at the first side (for example, conductive layers 51_33 at the right-hand side) are coupled at the lower parts to respective contact plugs 26 and at the upper parts to respective memory elements 1 (1_33). In contrast, among two sides opposing with a line along the y-axis therebetween, conductive layers 51 at the second side (for example, conductive layers 51_34 at the left-hand side) are coupled at the upper parts to respective contact plugs 26 and at the lower parts to respective memory elements 1 (1_34).

The memory elements 1 are coupled at the tops to the bottoms of the via plugs 27 (27_33 and 27_34). Each via plug 27 is coupled at the top to the bottom of a bit line 21 (21_33 or 21_34). The bit lines 21 are located above the memory element columns along the z-axis, and overlap in the xy-plane with the memory element columns.

In the third example, the via plugs 27 and/or the conductive layers 51 may or may not be provided. A fourth example relates to such an example. FIGS. 60 to 62 illustrate an example which does not include the via plugs 27 or the conductive layers 51. FIG. 60 illustrates a view of part of a memory device of the fourth example of the fifth embodiment seen from above. FIG. 60 does not illustrate some components for the purpose of clarifying the figure. FIGS. 61 and 62 illustrate the views along the LXI-LXI line and LXII-LXII line of FIG. 60, respectively.

As illustrated in FIGS. 60 to 62, the contact plugs 26 are coupled at the tops to the bottoms of the memory elements 1. The memory elements 1 are coupled at the tops to the bottom of a bit line 21.

As described above, according to the fifth embodiment, the memory elements 1 are arranged to be located at the vertexes and centers of the right hexagons, and as a result all adjacent memory elements 1 have the same interval, as in the first embodiment. For this reason, the same advantages as the first embodiment can be obtained. In addition, the active areas 13, the bit lines 21, the source lines 22, the contact plugs 24 and 26, and the via plugs 27 of the fifth embodiment also allow for connections of the active areas 13, the memory elements 1, the bit lines 21, and the source lines 22.

Sixth Embodiment

The sixth embodiment is based on the arrangement of the memory elements 1 located at the vertexes and centers of right hexagons as in the first embodiment.

Figure 63:
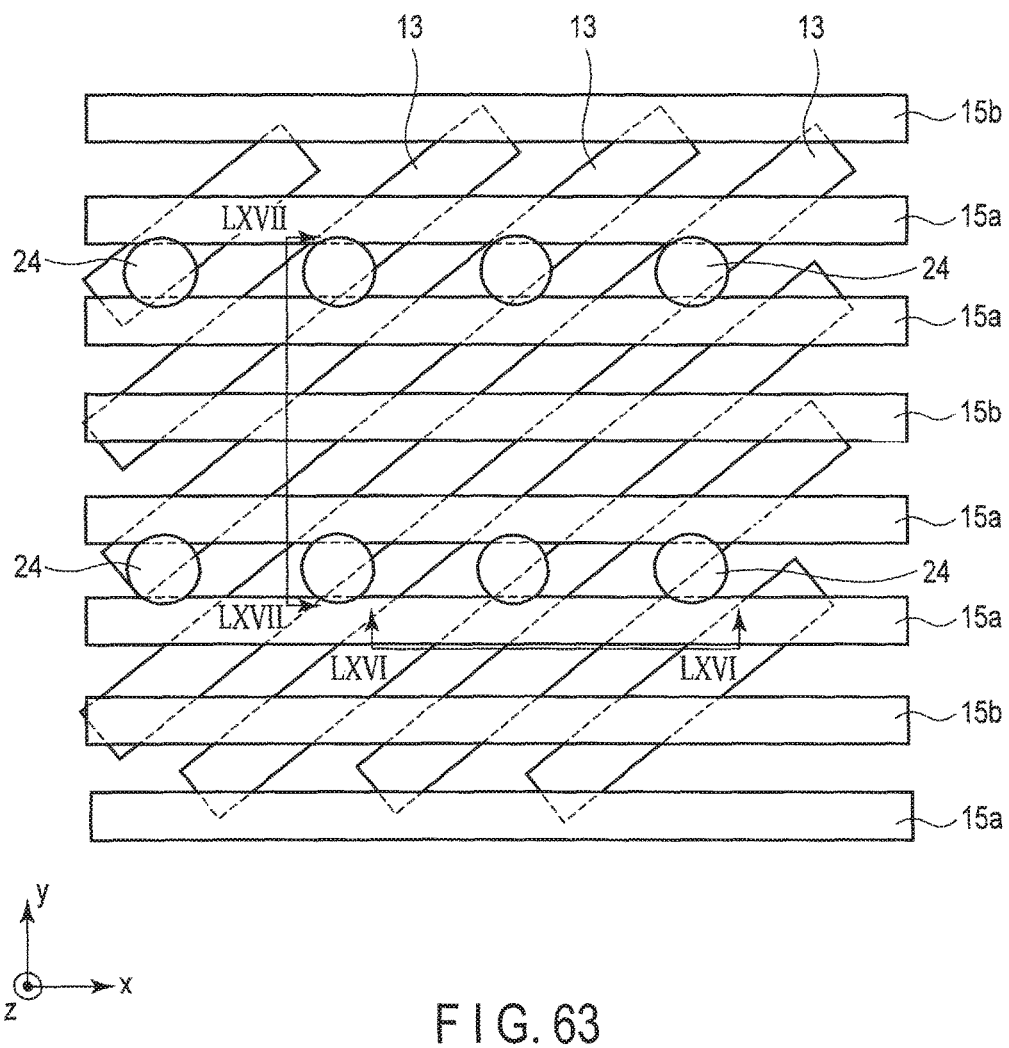
Figure 65:
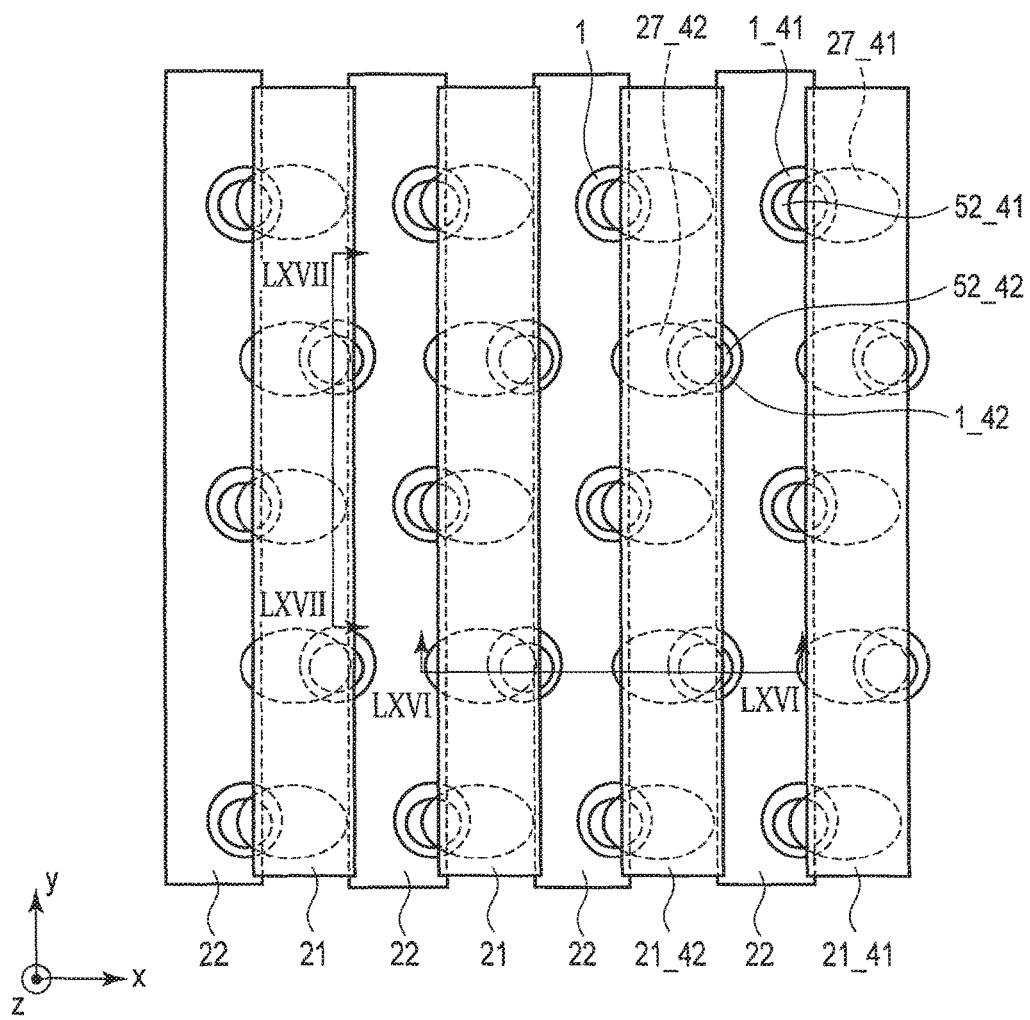
Figure 66:
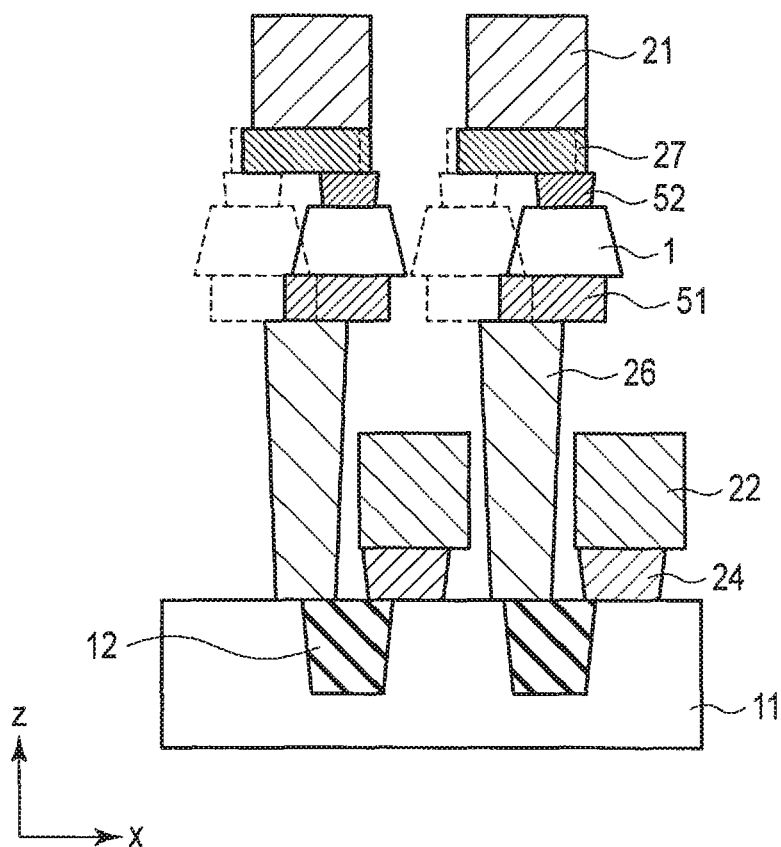

FIGS. 63 to 65 illustrate views of part of a memory device of a first example of the sixth embodiment seen from above. The direction of the arrangement of the memory elements 1 of FIGS. 63 to 65 is the same as that of FIGS. 2 and 5. FIG. 63 illustrates components in layers including the lowest layer (level) along the z-axis, and illustrates the surface of substrate 11, contact plugs 24 and components therebetween. FIG. 64 mainly illustrates components in layers higher than FIG. 63, and illustrates the surface of substrate 11, memory elements 1 and components therebetween. FIG. 65 mainly illustrates components in layers higher than FIG. 64, and illustrates source lines 22, bit lines 21 and components therebetween. FIGS. 66 and 67 illustrate the views along the LXVI-LXVI line and LXVII-LXVII line of FIGS. 63 to 65, respectively.

The memory elements 1 are arranged with the same direction as that of FIGS. 2 and 4 above the substrate along the z-axis. Therefore, the memory elements 1 line up along the x-axis, and are arranged in rows.

The gate electrodes 15 extend along the x-axis, line up along the y-axis at an interval, include gate electrodes 15a and 15b, and are buried in trenches in the surface of the substrate 11 with gate insulators on the surfaces of the trenches therebetween.

The source lines 22 are located above the substrate 11 along the z-axis, extend along the y-axis, and line up along the x-axis at an interval. Each source line 22 overlaps, in each of two edges along with the y-axis, with one memory element column.

The active areas 13 are independent from each other, are divided and surrounded by the element isolation insulators 12, and have rectangular shapes in the xy-plane. The active areas 13 extend, in the xy-plane, in a direction which connects areas near respective two particular memory elements 1. The details are as follows. A particular memory element 1 (for example, memory element 1_41) and a memory element 1 (for example, memory element 1_42) of the center of the right hexagon that includes that first memory element 1 make a third pair of memory elements, and each active area 13 extends substantially along a direction which extends over areas beneath the proximity of the third pair of memory elements (third memory element pair) along the z-axis. Therefore, the active areas 13 are not parallel with the x-axis or the y-axis. Below areas near a third memory element pair along the z-axis, two gate electrodes 15a are located. Such third memory element pairs are provided repeatedly, and as a result memory elements 1_41 line up along one of two edges of each source line 22 along the y-axis (for example, along the right-hand side edge) and memory elements 1_42 line up along the other of the two edges (for example, along the left-hand side edge).

Each active area 13 extends over at least two gate electrodes 15 which adjoin, and is penetrated through by those two gate electrodes to be divided into three sections. The active areas 13 may be longer. Such a long active area 13 is further divided by the gate electrodes 15b, and the section of each active area 13 between two gate electrodes 15b is further divided by two gate electrodes 15a into three sections. In the three sections of each active area 13 divided by two gate electrodes 15a, source/drain areas 14 are formed. Each gate electrode 15a, in the section between a pair of source/drain areas at both sides, makes a cell transistor with these sources/drain areas 14. The middle of the sections of each active area 13 is coupled to the bottom of a contact plug 24. The contact plugs 24 are coupled at the tops to the source lines 22. The source/drain areas 14 of the two remaining sections of each active area 13 are coupled to respective bottoms of a third memory element pair (for example, memory elements 1_41 and 1_42) via the respective sets of a contact plug 26 and a conductive layer 51. Each conductive layer 51 overlaps in the xy-plane with a contact plug 26 and a memory element 1_41 or 1_42.

The memory elements 1 are coupled at the tops to the bottoms of the conductive layers 52. The conductive layers 52 have, in the xy-plane, shapes similar to those of the memory elements 1, and, for example, plane shapes smaller than the plane shapes of the memory elements 1, and are coupled at the tops to the via plugs 27. Each via plug 27 is coupled at the top to the bottom of a bit line 21. The bit lines 21 extend along the y-axis and line up along the x-axis at an interval. Each bit line 21 is located, in the xy-plane, between two source lines 22 and partially overlaps with the two source lines 22, for example.

Specifically, the memory elements 1_41 and 1_42 are respectively coupled to conductive layers 52_41 and 52_42, which are respectively coupled to via plugs 27_41 and 27_42. The memory elements 1_41 are electrically coupled to a bit line 21 adjacent a source line 22 adjacent the corresponding source line 22 at the right-hand side (or, a bit line 21_41), and the memory elements 1_42 are electrically coupled to a bit line 21 adjacent a source line 22 adjacent the corresponding source line 22 at the left-hand side (or, a bit line 21_42). To this end, each via plug 27 has an elliptical shape in the xy-plane, spreads along the x-axis, and overlaps with a conductive layer 52 and a bit line 21 which are coupled by that via plug 27. Specifically, in the xy-plane, each via plug 27_41 overlaps at the left part with a conductive layer 52_41, and at the right part with a bit line 21_41. In contrast, in the xy-plane, each via plug 27_42 overlaps at the right part with a conductive layer 52_42, and at the left part with a bit line 21_42.

Figure 68:
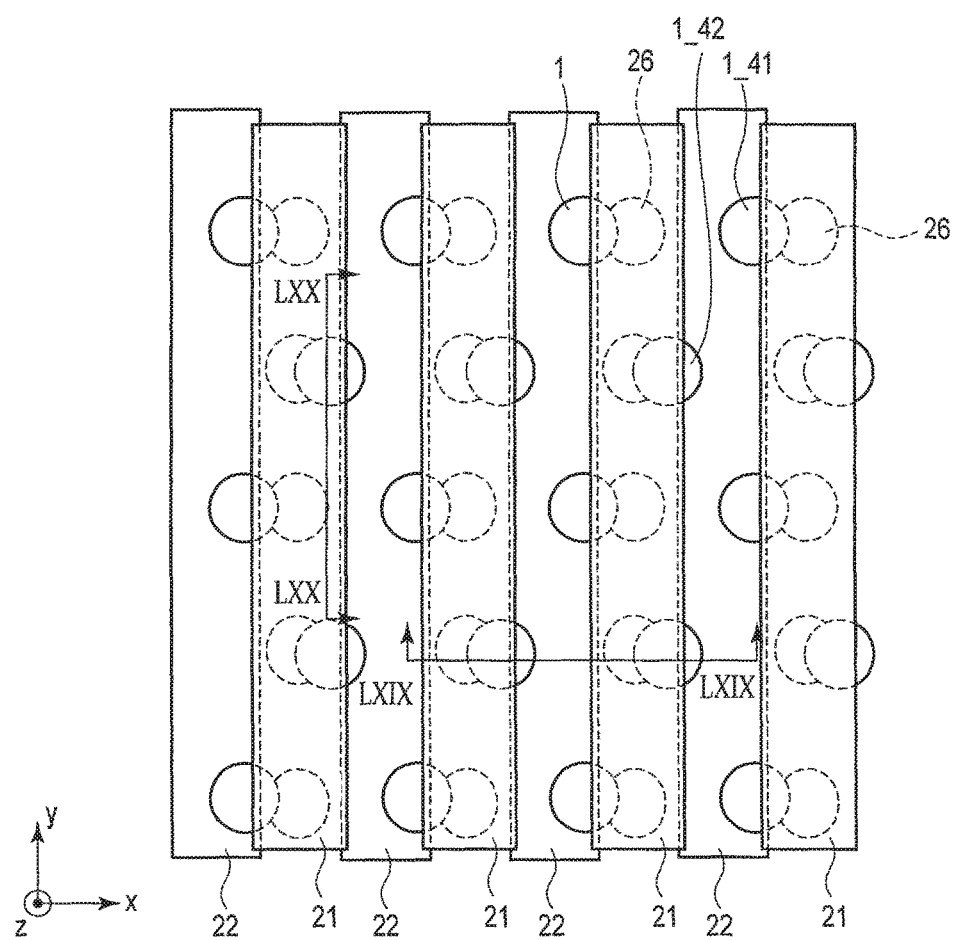
FIG. 68 illustrates a view of part of a memory device of a second example of the sixth embodiment seen from above.
Figure 69:
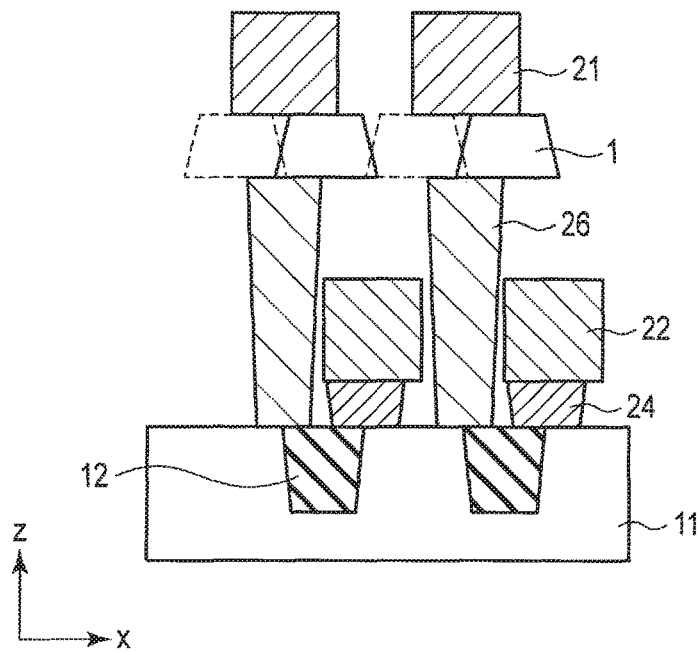
FIGS. 69 and 70 illustrate the views along the LXIX-LXIX line and the LXX-LXX line of FIG. 68, respectively.
Figure 70:
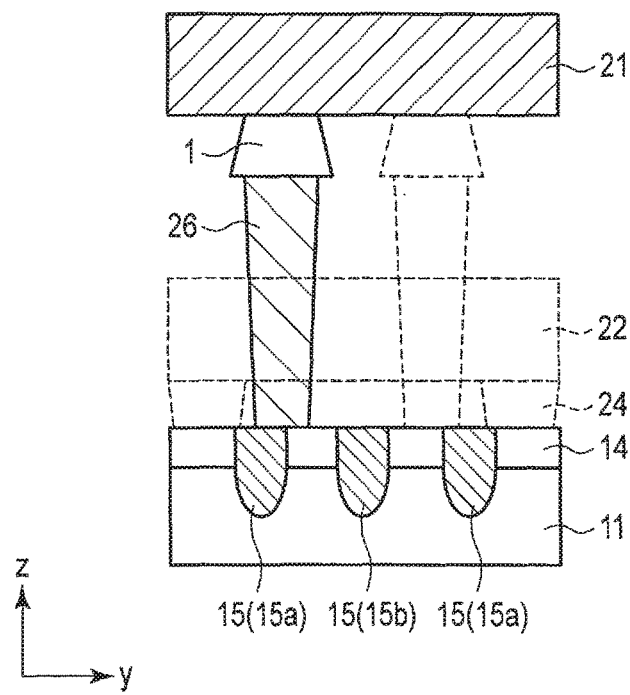

In the first example, the via plugs 27, the conductive layers 51, and/or the conductive layers 52 may or may not be provided. A second example relates to such an example. FIGS. 68 to 70 illustrate an example which does not include the via plugs 27, the conductive layers 51, or the conductive layers 52. FIG. 68 illustrates a view of part of a memory device of the second example of the sixth embodiment seen from above. FIG. 68 does not illustrate some components for the purpose of clarifying the figure. FIGS. 69 and 70 illustrate the views along the LXIX-LXIX line and LXX-LXX line of FIG. 68, respectively.

As illustrated in FIGS. 68 to 70, the contact plugs 26 are coupled at the tops to the bottoms of the memory elements 1. The memory elements 1 are coupled at the tops to the bottoms of the bit lines 21.

Figure 71:
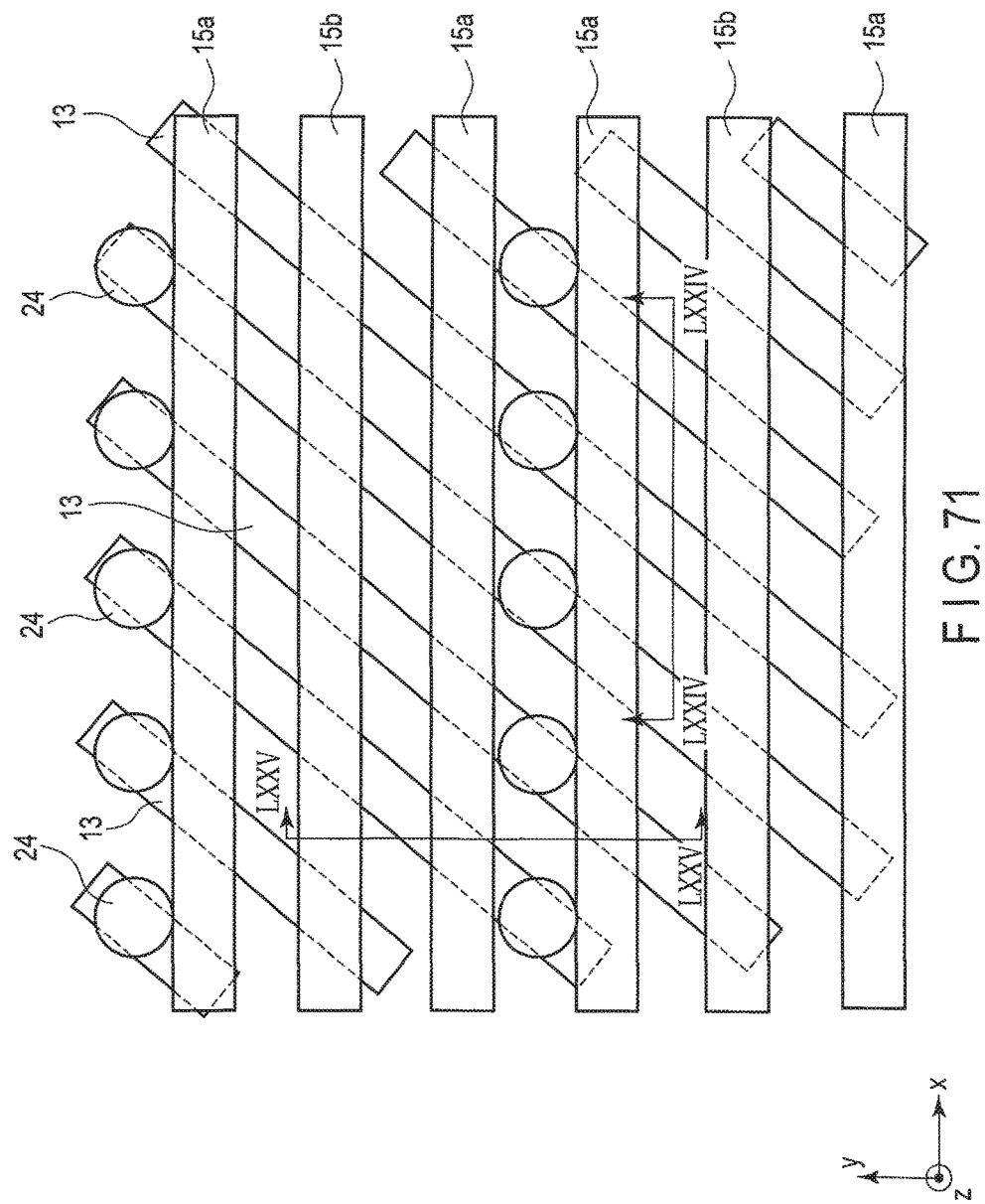
FIGS. 71 to 73 illustrate views of part of a memory device of a third example of the sixth embodiment seen from above.
Figure 72:
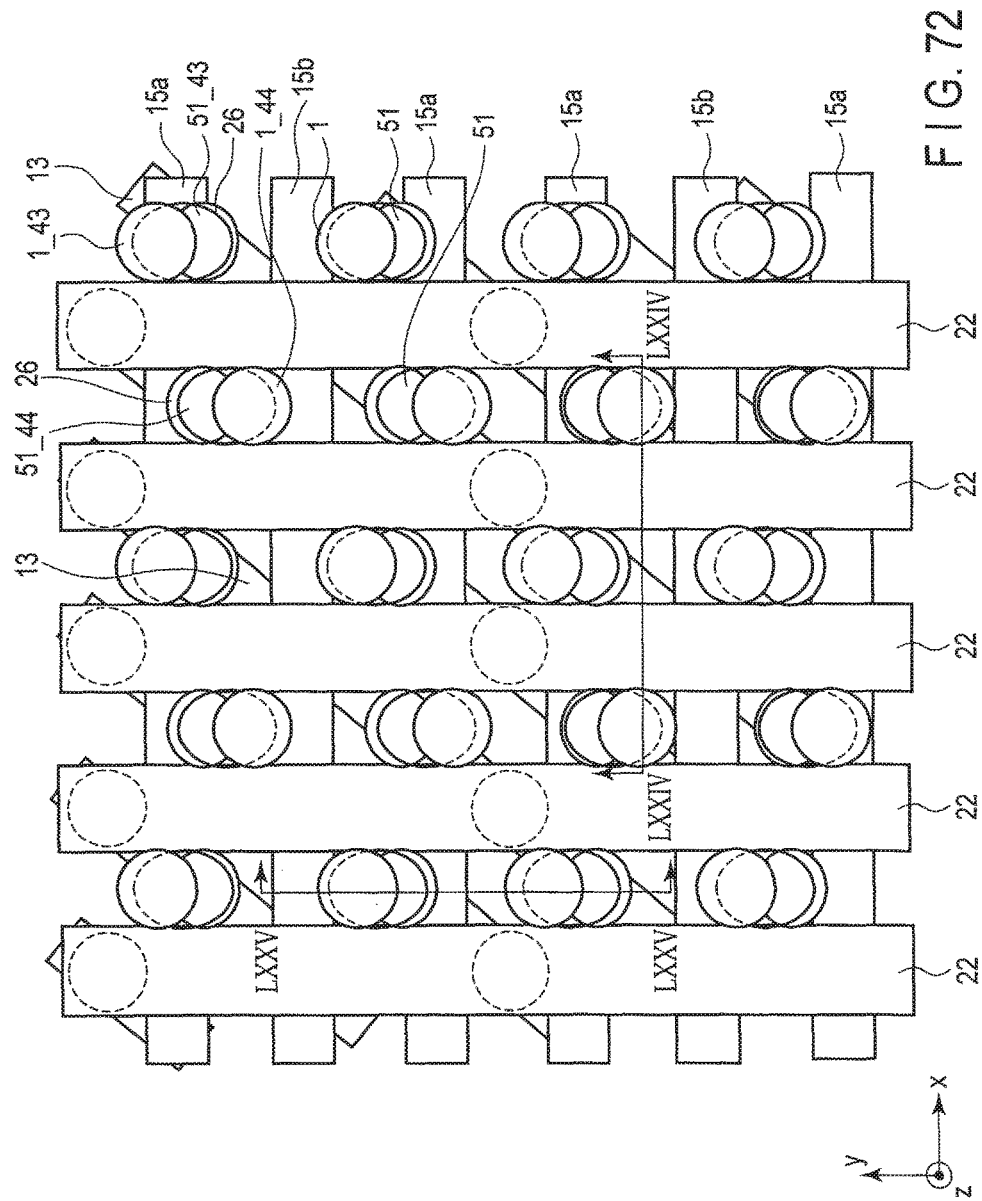
Figure 73:
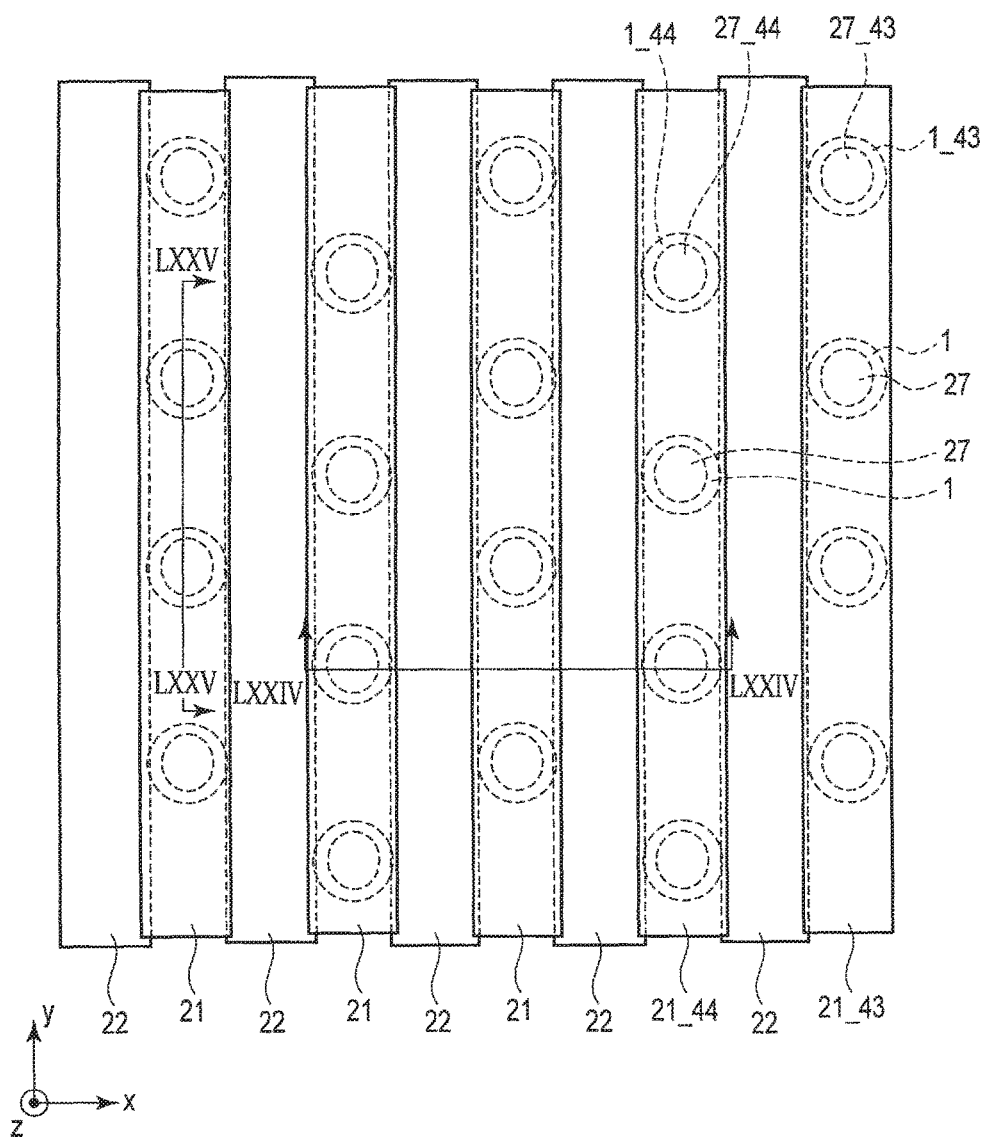
Figure 74:
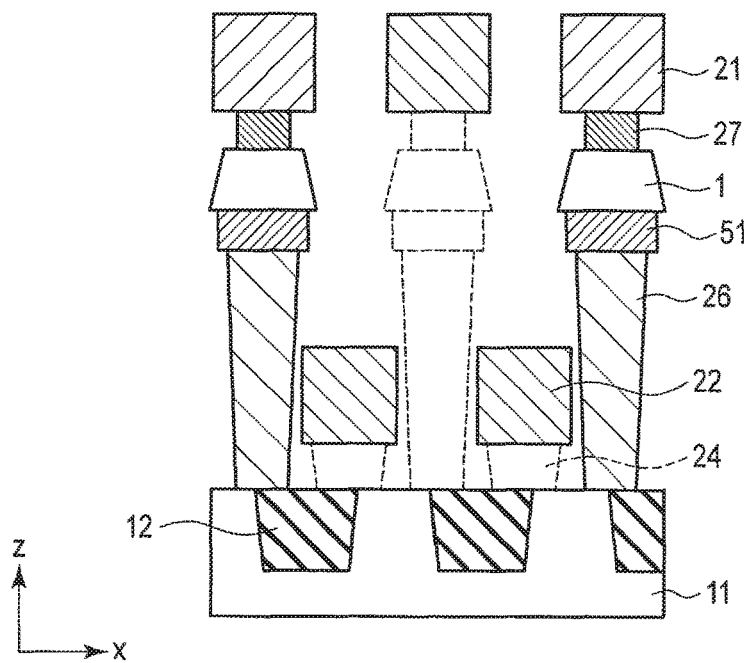
FIGS. 74 and 75 illustrate the views along the LXXIV-LXXIV line and the LXXV-LXXV line of FIGS. 71 to 73, respectively.
Figure 75:
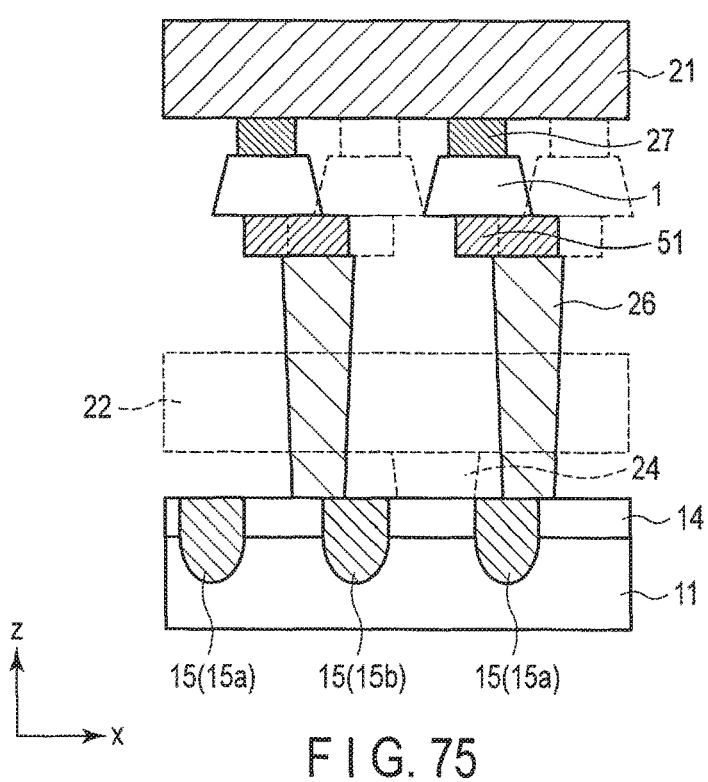

Moreover, the arrangement of the memory elements 1 may have a direction different from that in the first example (FIGS. 63 to 67). A third example relates to such an example. FIGS. 71 to 73 illustrate views of part of a memory device of the third example of the sixth embodiment seen from above. The memory elements 1 of FIGS. 71 to 73 are arranged in a direction rotated from that of FIGS. 2 and 5 and the first example by 90 degrees. FIG. 71 illustrates components in layers including the lowest layer (level) along the z-axis, and illustrates the surface of substrate 11, contact plugs 24 and components therebetween. FIG. 72 mainly illustrates components in layers higher than FIG. 71, and illustrates the surface of substrate 11, memory elements 1 and components therebetween. FIG. 73 mainly illustrates components in layers higher than FIG. 72, and illustrates source lines 22 and bit lines 21 and components therebetween. FIGS. 74 and 75 illustrate the views along the LXXIV-LXXIV line and LXXV-LXXV line of FIGS. 71 to 73, respectively.

The memory elements 1 are arranged with a direction rotated from the arrangement of the memory elements 1 of FIGS. 2 and 4 by 90 degrees above the substrate 11 along the z-axis. Therefore, the memory elements 1 line up along the y-axis, and are arranged in columns.

Based on the memory elements 1 arranged in a direction different from the first example, the third example differs from the first example in features of some components. These different features and associated features will be described. In order to couple the contact plugs 26 and the memory elements 1, the conductive layers 51 of the third example overlap in the xy-plane with the contact plugs 26 and the memory elements 1, and spread along the y-axis. In particular, among two sides opposing with a line along the y-axis therebetween, conductive layers 51 at the first side (for example, conductive layers 51_43 at the right-hand side) are coupled at the lower parts to respective contact plugs 26 and at the upper parts to respective memory elements 1 (1_43). In contrast, among two sides opposing with a line along the y-axis therebetween, conductive layers 51 at the second side (for example, conductive layers 51_44 at the left-hand side) are coupled at the upper parts to respective contact plugs 26 and at the lower parts to respective memory elements 1 (1_44).

The memory elements 1 are coupled at the tops to the bottoms of the via plugs 27 (27_43 and 27_44). Each via plug 27 is coupled at its top to the bottom of a bit line 21 (21_43 or 21_44). The bit lines 21 are located above the memory element columns along the z-axis, and overlap in the xy-plane with the memory element columns.

In a third example, the via plugs 27 and/or the conductive layers 51 may or may not be provided. A fourth example relates to such an example. FIGS. 76 to 78 illustrate an example which does not include the via plugs 27 or the conductive layers 51. FIG. 76 illustrates a view of part of a memory device of the fourth example of the fifth embodiment seen from above. FIG. 76 does not illustrate some components for the purpose of clarifying the figure. FIGS. 77 and 78 illustrate the views along the LXXVII-LXXVII line and LXXVIII-LXXVIII line of FIG. 76, respectively.

As illustrated in FIGS. 76 to 78, the contact plugs 26 are coupled at the tops to the bottoms of the memory elements 1. The memory elements 1 are coupled at the tops to the bottoms of the bit lines 21.

As described above, according to the sixth embodiment, the memory elements 1 are arranged to be located at the vertexes and centers of the right hexagons, and as a result all adjacent memory elements 1 have the same interval, as in the first embodiment. For this reason, the same advantages as the first embodiment can be obtained. In addition, the active areas 13, the bit lines 21, the source lines 22, the contact plugs 24 and 26, and the via plugs 27 of the sixth embodiment also allow for connections of the active areas 13, the memory elements 1, the bit lines 21, and the source lines 22.

Seventh Embodiment

The seventh embodiment relates to an arrangement of a circuit of a memory device. The circuit arrangement of the seventh embodiment can be applied to any of the first, and third to sixth embodiments. Specifically, while the arrangement and physical connections of components in any of the first, and third to sixth embodiments are used, the electric connections of the seventh embodiment can be used to implement an MRAM.

FIG. 79 is a circuit diagram of a part of a memory device of the seventh embodiment. As illustrated in FIG. 79, the memory device 40 includes a memory cell array 42, a row decoder 43, a column controller 44, an input and output circuit 45, and a controller 46.

The memory cell array 42 includes components, such as memory cells 51, n word lines 15 (15(0) to 15(n−1)), m bit lines 21 (21(0) to 21(m−1)), and m source lines 22 (22(0) to 22(m−1)). Each memory cell 51 includes the memory element 1 and a cell transistor (or, select transistor) 53 which are coupled in series. The cell transistor 53 is an n-type MOSFET, for example. A particular bit line 21 and a particular source line 22 make a pair. Between a pair of bit line 21 and source line 22, multiple memory cells 51 are coupled in parallel. The node of the memory element 1 of each memory cell 51 opposite its cell transistor 53 is coupled to a bit line 21. The node of the cell transistor 53 of each memory cell 51 opposite its memory element 1 is coupled to a source line 22. The gate electrode of each cell transistor 53 is coupled to a word line 15.

The controller 46 receives various signals, such as an address signal and commands, from outside the memory device 40. The controller 46 receives these signals from a controller which controls the memory device 40, such as an external controller. The controller 46 controls the row decoder 43 and the column controller 44 in accordance with the received signals. The address signal specifies one or more memory cells of targets of access, such as reads or writes.

The row decoder 43 is coupled to the word lines WL. The row decoder 43 receives a row address signal from the controller 46, and, in accordance with the row address, selects a row, i.e., one of the word lines 15. The row address signal is generated from the address signal.

The column controller 44 receives a column address signal from the controller 46, and selects a column specified by the column address signal. The column address signal is generated from the address signal. The column controller 44 executes reads and writes of data in the selected column.

To this end, the column controller 44 includes sense amplifiers SA, write drivers WD, and a switch SW1, for example. There are provided as many sense amplifiers SA, write drivers WD, and switches SW1 as the bit lines 21 (or source lines 22) in the memory cell array 42. Each sense amplifier SA and each write driver WD is coupled to a bit line 21. Each switch SW1 is coupled at one end to a source line 22, and grounded (or, coupled to the node of the common potential) at the other end. The switches SW1 are MOSFETs, for example. The sense amplifiers SA sense the voltages (or, potentials) of the bit lines BL coupled thereto, and determine data stored in read-target memory cells 51 coupled to the corresponding bit lines 51. For example, the sense amplifiers SA receive a reference voltage VREF, compare the voltages of the corresponding bit lines 21 and the reference voltage, and use the results of the comparison to determine the data of the read-target memory cells 51.

When the column controller 44 receives a column address signal, it selects a sense amplifier SA, a write driver WD, and/or a switch SW1 in accordance with the column address signal. Furthermore, during a read of data from the memory cells, the column controller 44 turns on the switch SW1 coupled to the source line 22 specified by the column address signal, and further activates the sense amplifier SA coupled to the bit line 21 which makes a pair with the specified source line 22. As a result, a current flows between the selected pair of bit line 21 and source line 22 through the read-target memory cell 51. With this current, a voltage arises on the selected bit line 21 in accordance with the state of the memory element 1 of the read-target memory cell 51. The activated sense amplifier SA uses the voltage of the selected bit line 21 to determine the data stored in the read-target memory cell 51, and supplies the data read to the input and output circuit 45. The input and output circuit 45 outputs the received data to outside the memory device 40.

During a write of data in the memory cells 51, the column controller 44 activates the write driver WD specified by the column address signal. The column controller 44 uses the control of the activated write driver WD to conduct a current between the bit line 21 and the source line 22 specified by the column address signal through the write-target memory cell 51. The direction of the current depends on the data which will be written in the write-target memory cell 51. The data to be written (or, write data) is received from the input and output circuit 45 by the column controller 44. The input and output circuit 45 receives the write data from outside memory device 40.

A sense amplifier SA and a write driver WD can also be shared by multiple columns (pairs of bit lines 21 and source lines 22). FIG. 80 illustrates such an example and is a circuit diagram of a second example of the seventh embodiment.

As illustrated in FIG. 80, the column controller 44 includes a sense amplifier SA, a write driver WD, m switches SWB (SWB(0) to SWB(m−1)), m switches SWS (SWS(0) to SWS(m−1)), and a switch SW2. The switches SWB, SWS and SW2 are MOSFETs, for example.

The switches SWB(0) to SWB(m−1) are coupled at respective one ends to the bit line 21(0) to 21(m−1), respectively. The other end of each of the switches SWB(0) to SWB(m−1) is coupled to a global bit line GBL. The global bit line GBL is coupled to the sense amplifier SA and the write driver WD.

The switches SWS(0) to SWS(m−1) are coupled at respective one ends to the source lines 22(0) to 22(m−1), respectively. The other end of each of the switches SWS(0) to SWS(m−1) is coupled to a global source line GSL. The global source line GSL is coupled to the write driver WD, and is grounded through the transistor SW2.

The column controller 44 turns on the switches SWB and SWS respectively coupled to a pair of bit line 21 and source line 22 specified by the column address signal. With the turned-on switches SWB and SWS, the selected pair of bit line 21 and source line 22 are electrically coupled to the global bit line GBL and the global source line GSL, respectively. While the selected pair of bit line 21 and source lines 22 are coupled to the global bit line GBL and the source line GSL this way, the column controller 44 executes a write or a read through the sense amplifier SA, the write driver WD, and the switch SW2. Specifically, during a read, the column controller 44 turns on the switch SW2 and activates the sense amplifier SA. The sense amplifier SA uses the voltage of the selected bit line 21 to determine the data stored in the read-target memory cell 51, and supplies the data read to the input and output circuit 45. During a write, the column controller 44 uses the control of the activated write driver WD to conduct a current between the bit line 21 and the source line 22 specified by the column address signal through the write-target memory cell 51. As a result, the data is written in the write-target memory cell.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive memory device comprising:
a substrate having a first surface in a plane having a first direction and a second direction; and
memory elements arranged along and over the first surface, each of the memory elements having a switchable resistance, the memory elements including a first column of memory elements lined up along the first direction and a second column of memory elements lined up along the first direction, the second column of the memory elements being adjacent to the first column of memory elements,
wherein each of the first and second columns has a first, second, . . . , N-th (N≥2) memory element lined up in order along the first direction, and
wherein a coordinate, in the first direction, of an i-th memory element in the first column is different from a coordinate, in the first direction, of an i-th memory element in the second column, for any i from 1 to N.

2. The device of claim 1, further comprising:
a first interconnect extending along the first direction.

3. The device of claim 2, wherein the first interconnect extends between the first column of memory elements and the second column of memory elements in the first surface.

4. The device of claim 3, further comprising:
a first plug provided between the first interconnect and a first memory element of the memory elements in a third direction which intersects the first surface, extending along the second direction, and overlapping the first interconnect and the first memory element along the first surface.

5. The device of claim 4, further comprising:
a second interconnect extending along the first direction; and
a second plug between the second interconnect and the substrate in the third direction,
wherein the second plug is located on an extension along the second direction from a position between two of the memory elements adjacent in the first direction.

6. The device of claim 5, further comprising:
a third interconnect extending along the second direction.

7. The device of claim 6, further comprising:
a pair of diffusion areas formed at both sides of the third interconnect in the first surface of the substrate, respectively,
wherein the pair of diffusion areas is electrically coupled to one of the memory elements and the second plug, respectively.

8. The device of claim 1, further comprising:
a first interconnect extending along the second direction connecting a first memory element in the first column of memory elements and a second memory element in the second column of memory elements nearest to the first memory element.

9. The device of claim 8, further comprising:
a second interconnect extending along the first direction,
wherein the second interconnect is electrically coupled to two of the memory elements which adjoin in the first direction.

10. The device of claim 9, further comprising:
a third interconnect extending along the first direction; and
a plug located between the third interconnect and the substrate in a third direction which intersects the first surface,
wherein:
the plug is located on an extension along a fourth direction from a position between two of the memory elements adjacent in the first direction, and
the fourth direction intersects the first direction along the first surface.

11. The device of claim 10, further comprising:
a pair of diffusion areas formed at both sides of the first interconnect in the surface of the substrate, respectively,
wherein the pair of diffusion areas is electrically coupled to one of the memory elements and the plug.

12. The device of claim 11, further comprising:
third interconnects comprising the third interconnect and extending along the first direction, and
plugs comprising the plug and lined up along the second direction.

13. The device of claim 1, further comprising:
an active area extending in the surface of the substrate along the first surface;
a first gate electrode and a second gate electrode which extend through the active area;
a first plug between one of two sections of the active area outside the first and second gate electrodes, and a first memory element of the memory elements;
a second plug between the other one of the two sections of the active area, and a second memory element of the memory elements;
a first interconnect; and
a third plug between a section of the active area between the first and second electrodes, and the first interconnect.

14. The device of claim 13, wherein:
the first interconnect extends along the first direction,
the first and second gate electrodes extend along the second direction which intersects the first direction along the first surface, and
the active area extends along a direction which is not perpendicular or parallel to the first direction along the first surface.

15. The device of claim 14, further comprising:
a second interconnect extending along the first direction;
a third plug between the first memory element and the second interconnect; and
a fourth plug between the second memory element and the second interconnect.

16. The device of claim 15, further comprising:
a first conductive layer between the first memory element and the first plug; and
a second conductive layer between the second memory element and the second plug.

17. The device of claim 15, further comprising:
a first conductive layer between the first memory element and the third plug; and
a second conductive layer between the second memory element and the fourth plug.

18. The device of claim 17, further comprising:
a third conductive layer between the first memory element and the first conductive layer; and
a fourth conductive layer between the second memory element and the second conductive layer.

19. The device of claim 13, wherein:
the first interconnect extends along the second direction which intersects the first direction along the first surface,
the first and second gate electrodes extend along the first direction, and
the active area extends along a direction which is not perpendicular or parallel to the first direction along the first surface.

20. The device of claim 19, further comprising:
a second interconnect extending along the second direction,
a third plug between the first memory element and the second interconnect, and
a fourth plug between the second memory element and the second interconnect.

21. The device of claim 13, wherein:
the first interconnect extends along the first direction,
the first and second gate electrodes extend along the second direction which intersects the first direction along the first surface, and
the active area extends along the first direction.

22. The device of claim 21, wherein:
a second interconnect extending along the first direction;
a third plug between the first memory element and the second interconnect; and
a fourth plug between the second memory element and the second interconnect.

23. The device of claim 13, wherein:
the first interconnect extends along the second direction which intersects the first direction along the first surface,
the first and second gate electrodes extend along the first direction, and
the active area extends along the second direction.

24. The device of claim 23, further comprising:
a second interconnect extending along the second direction;
a third plug between the first memory element and the second interconnect; and
a fourth plug between the second memory element and the second interconnect.

25. The device of claim 13, wherein:
the first interconnect extends along the first direction,
the first and second gate electrode extend along the second direction which intersects the first direction along the first surface, and
the active area extends along a direction which is not perpendicular or parallel to the first direction along the first surface.

26. The device of claim 15, further comprising:
a second interconnect and a third interconnect which extend along the first direction;
a third plug between the first memory element and the second interconnect; and
a fourth plug between the second memory element and the third interconnect.

27. The device of claim 13, wherein:
the first interconnect extends along the second direction which intersects the first direction along the first surface,
the first and second gate electrodes extend along the first direction, and
the active area extends along a direction which is not perpendicular or parallel to the first direction along the first surface.

28. The device of claim 27, further comprising:
a second interconnect and a third interconnect which extend along the second direction,
a third plug between the first memory element and the second interconnect,
a fourth plug between the second memory element and the third interconnect.

* * * * *